United States Patent
Watanabe et al.

(10) Patent No.: US 10,291,110 B2
(45) Date of Patent: May 14, 2019

(54) DRIVING CIRCUIT FOR SWITCHING ELEMENT AND POWER CONVERSION SYSTEM

(71) Applicant: DENSO CORPORATION, Kariya, Aichi-pref. (JP)

(72) Inventors: Kazunori Watanabe, Kariya (JP); Tomotaka Suzuki, Kariya (JP); Tomoyuki Muraho, Kariya (JP); Yoshinori Hayashi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/490,390

(22) Filed: Apr. 18, 2017

(65) Prior Publication Data
US 2017/0302152 A1 Oct. 19, 2017

(30) Foreign Application Priority Data

Apr. 19, 2016 (JP) ................... 2016-083516
Oct. 18, 2016 (JP) ................... 2016-204535
Apr. 11, 2017 (JP) ................... 2017-078462

(51) Int. Cl.
| | |
|---|---|
| H03K 3/00 | (2006.01) |
| H02M 1/088 | (2006.01) |
| H02M 7/5387 | (2007.01) |
| H03K 17/04 | (2006.01) |
| H03K 17/0412 | (2006.01) |
| H03K 17/687 | (2006.01) |
| H02M 1/00 | (2006.01) |
| H02P 27/08 | (2006.01) |
| H03K 17/12 | (2006.01) |

(52) U.S. Cl.
CPC ....... *H02M 1/088* (2013.01); *H02M 7/53871* (2013.01); *H02M 7/53875* (2013.01); *H03K 17/0406* (2013.01); *H03K 17/04123* (2013.01); *H03K 17/6871* (2013.01); *H02M 2001/0054* (2013.01); *H02P 27/08* (2013.01); *H03K 17/127* (2013.01); *Y02B 70/1491* (2013.01)

(58) Field of Classification Search
None
See application file for complete search history.

(56) References Cited

U.S. PATENT DOCUMENTS

| | | | | |
|---|---|---|---|---|
| 8,848,408 B2* | 9/2014 | Shindo | .................. | B60L 3/0007 180/279 |
| 9,112,344 B2* | 8/2015 | Fukuta | .................. | H02H 1/0007 |
| 9,214,886 B2* | 12/2015 | Suzuki | .................... | H02P 21/12 |

(Continued)

FOREIGN PATENT DOCUMENTS

JP 2002-016486 A 1/2002

*Primary Examiner* — Lincoln D Donovan
*Assistant Examiner* — Khareem E Almo
(74) *Attorney, Agent, or Firm* — Oliff PLC

(57) ABSTRACT

In a drive circuit, a rate adjuster adjusts a charging speed of a MOSFET to be faster than the charging speed of an IGBT when a drive state changer changes the first switching element from the off state to the on state first, and changes the second switching element from the off state to the on state next. The rate adjuster also adjusts a discharging speed of the MOSFET to be faster than the discharging speed of the IGBT when the drive state changer changes the MOSFET from the on state to the off state first, and changes the IGBT from the on state to the off state next.

31 Claims, 36 Drawing Sheets

(56) References Cited

U.S. PATENT DOCUMENTS

| | | | | |
|---|---|---|---|---|
| 2012/0020120 A1* | 1/2012 | Yanagita | ............... | H02M 1/34 |
| | | | | 363/21.04 |
| 2012/0049782 A1* | 3/2012 | Suzuki | ................ | H02M 1/14 |
| | | | | 318/807 |
| 2012/0320649 A1* | 12/2012 | Hamanaka | ............ | H02M 7/48 |
| | | | | 363/131 |
| 2013/0175959 A1* | 7/2013 | Fukuta | ............... | H03K 17/166 |
| | | | | 318/400.27 |
| 2013/0181640 A1* | 7/2013 | Fukuta | ............... | H03K 17/166 |
| | | | | 318/139 |
| 2014/0062361 A1* | 3/2014 | Suzuki | ................ | H02M 1/08 |
| | | | | 318/400.17 |
| 2014/0307495 A1* | 10/2014 | Fukuta | ................. | H02H 3/08 |
| | | | | 363/98 |
| 2016/0099665 A1* | 4/2016 | Chen | .................... | H02M 1/08 |
| | | | | 318/400.27 |

\* cited by examiner

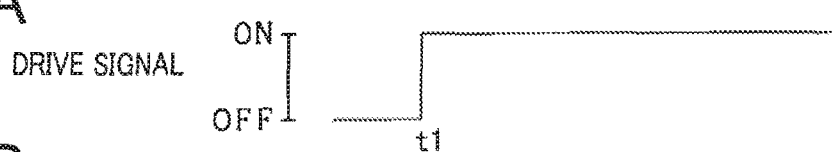
FIG.4A DRIVE SIGNAL
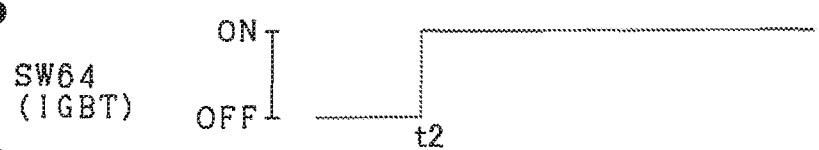
FIG.4B SW64 (IGBT)
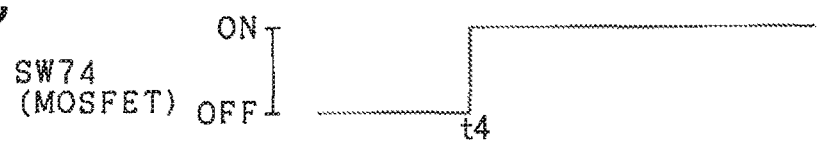
FIG.4C SW74 (MOSFET)
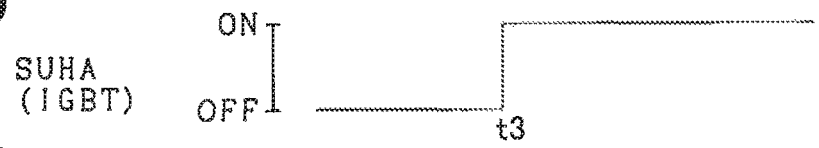
FIG.4D SUHA (IGBT)
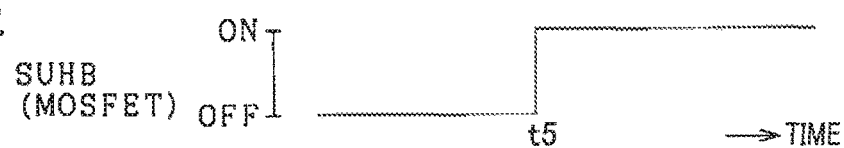
FIG.4E SUHB (MOSFET)

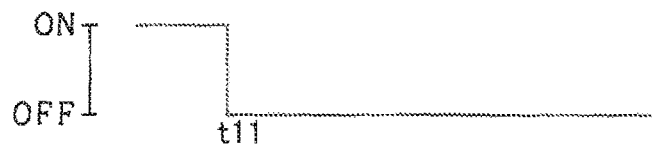
FIG.6A ON DRIVE SIGNAL OFF t11
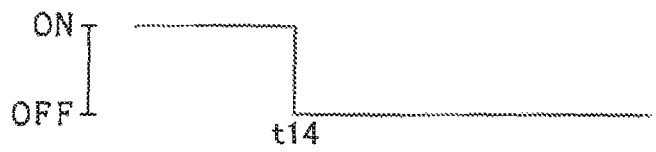
FIG.6B ON SW67 (IGBT) OFF t14
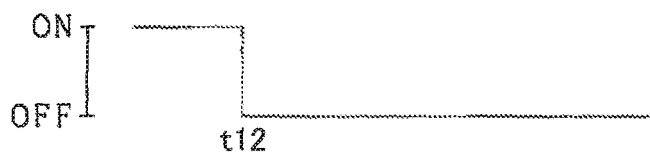
FIG.6C ON SW77 (MOSFET) OFF t12
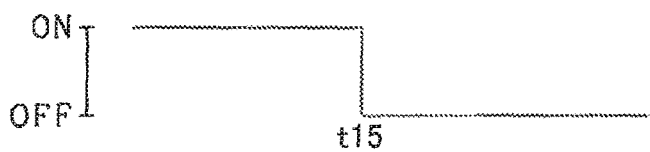
FIG.6D ON SUHA (IGBT) OFF t15
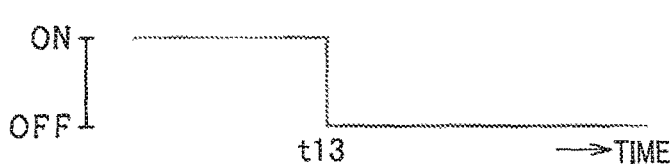
FIG.6E ON SUHB (MOSFET) OFF t13 →TIME
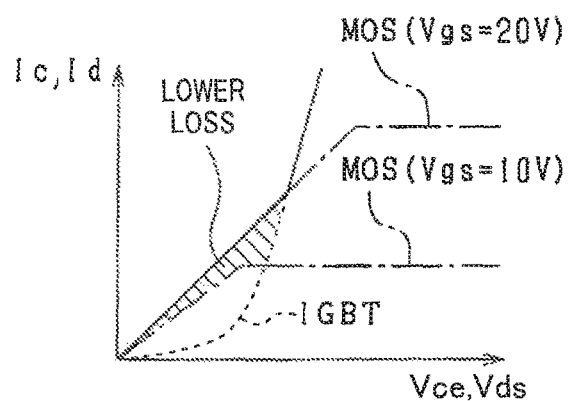
FIG.7

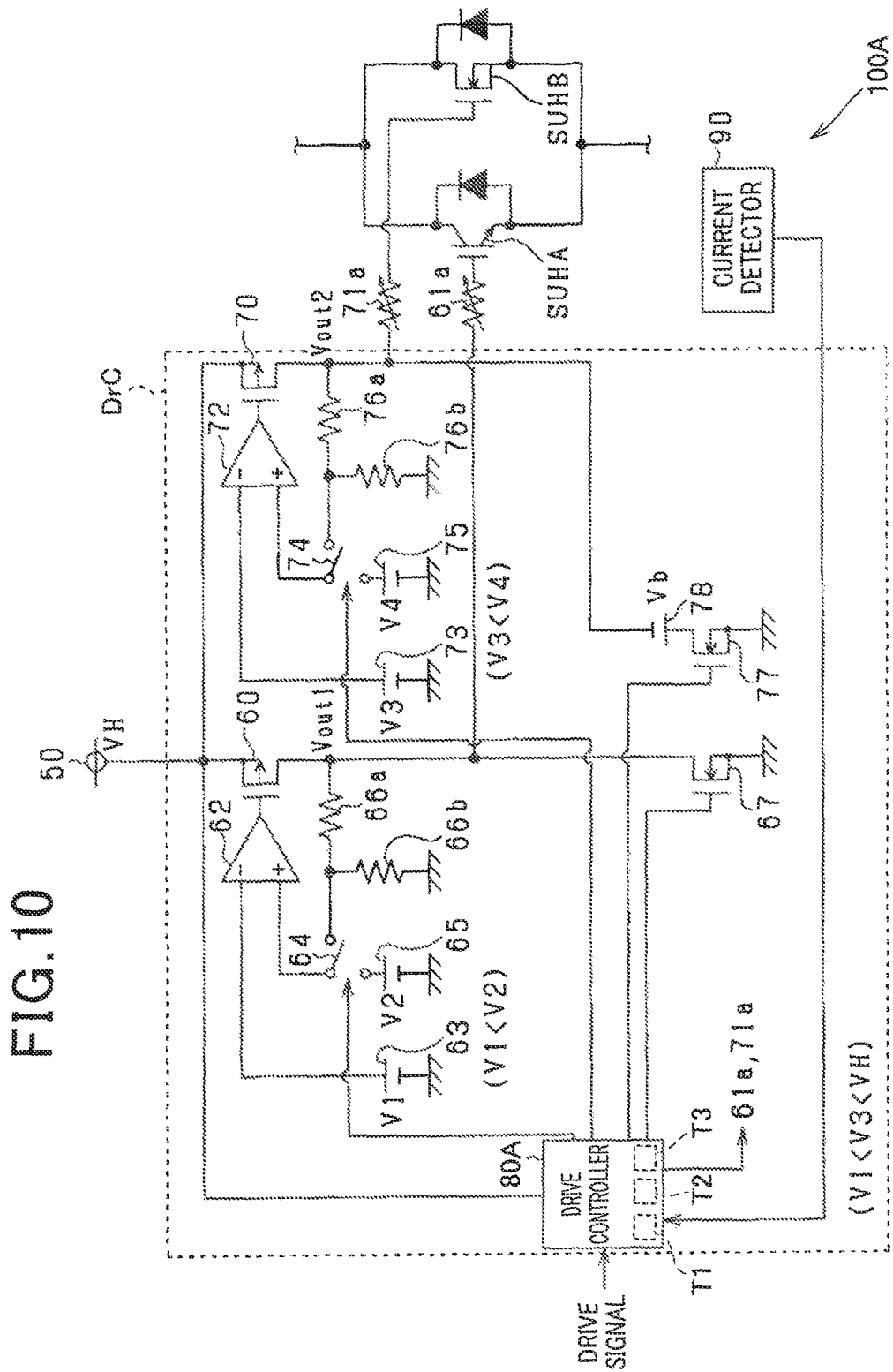

FIG.11A OFF→ON

| CURRENT | SMALL | MIDDLE | LARGE |
|---|---|---|---|
| MOSFET | Ron1 | Ron2 (LATER ON) | OFF |
| IGBT | OFF | Ron3 (EARLIER ON) | Ron4 |

( • Ron1 > Ron2
  • Ron2 < Ron3 < Ron4 )

FIG.11B ON→OFF

| CURRENT | SMALL | MIDDLE | LARGE |
|---|---|---|---|
| MOSFET | Roff1 | Roff2 (LATER OFF) | OFF |
| IGBT | OFF | Roff3 (EARLIER OFF) | Roff4 |

( • Roff1 > Roff2
  • Roff2 < Roff3 < Roff4 )

(RL4=Ron1, RL3+RL4=Ron2
RL2+RL3+RL4=Ron3
RL1+RL2+RL3+RL4=Ron4)

(RM4=Roff1, RM3+RL4=Roff2
RM2+RM3+RM4=Roff3
RM1+RM2+RM3+RM4=Rff4)

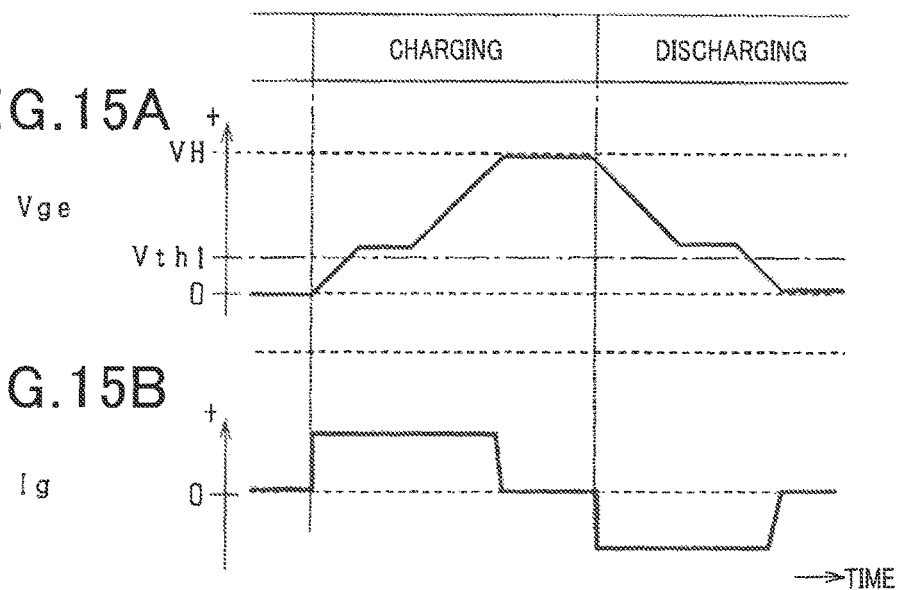
FIG.15A
FIG.15B
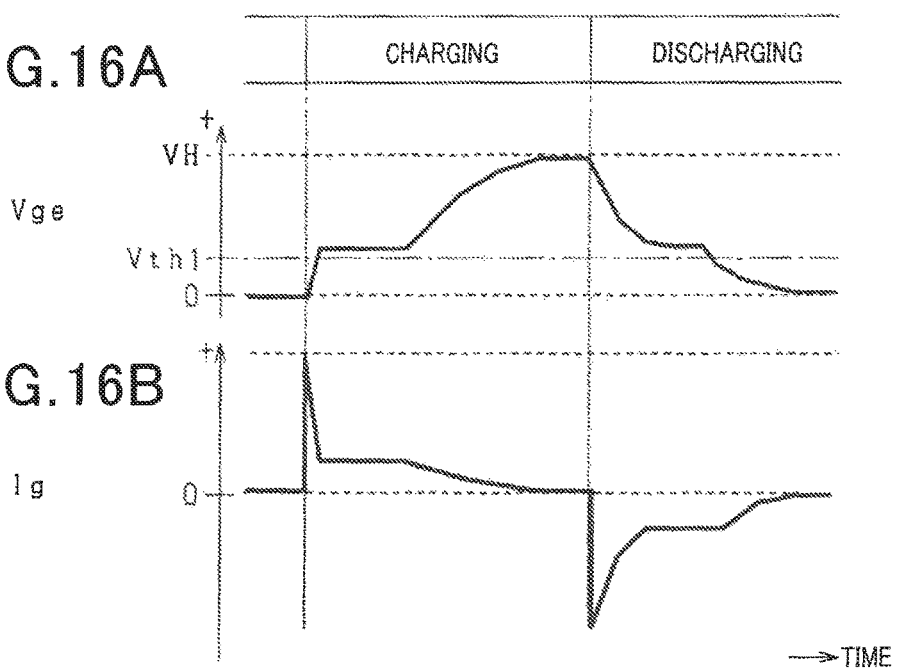
FIG.16A
FIG.16B

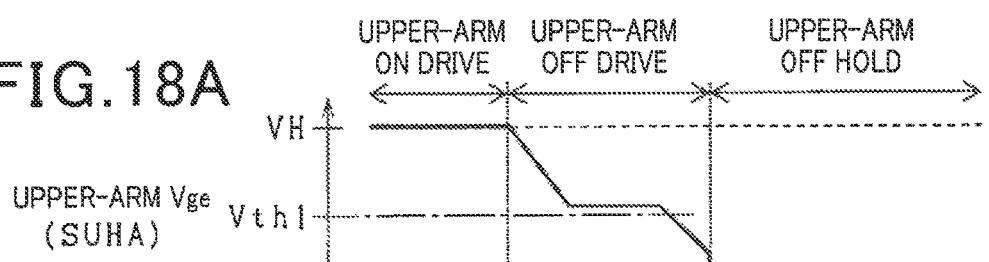
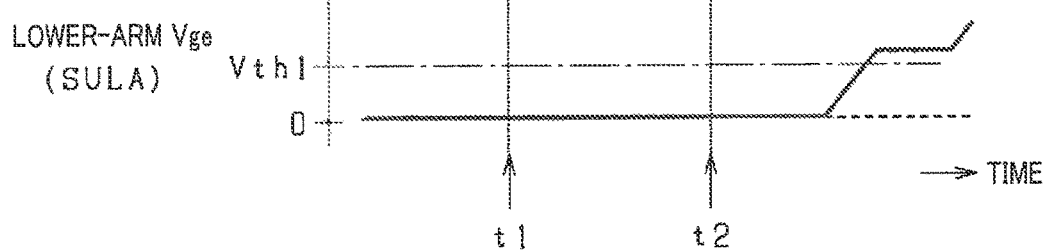

| Vk | SUHA (IGBT) | SUHB (MOSFET) |
|---|---|---|
| 20V | OPEN FAULT | NORMAL |
| 17.5V | NORMAL | NORMAL |
| 15V | NORMAL | OPEN FAULT |
| 10V | SHORT-CIRCUIT FAULT | NORMAL |
| 7.5V | NORMAL | SHORT-CIRCUIT FAULT |

FIG.29
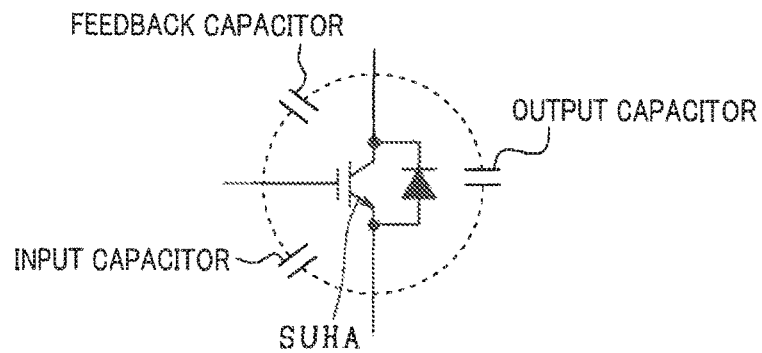
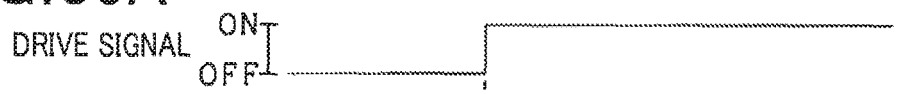
FIG.30A DRIVE SIGNAL
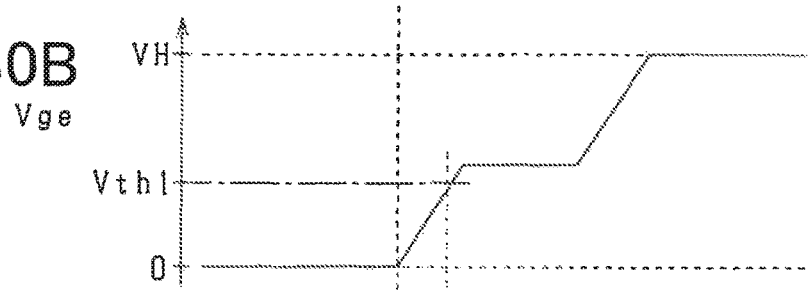
FIG.30B Vge
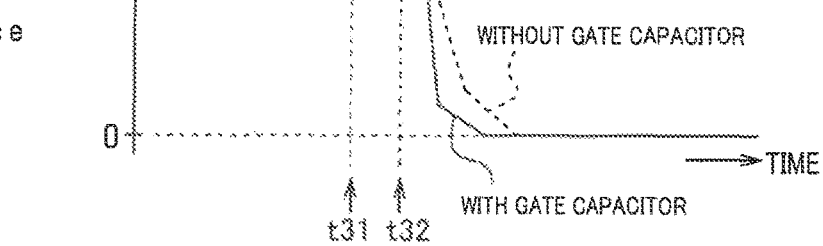
FIG.30C Vce

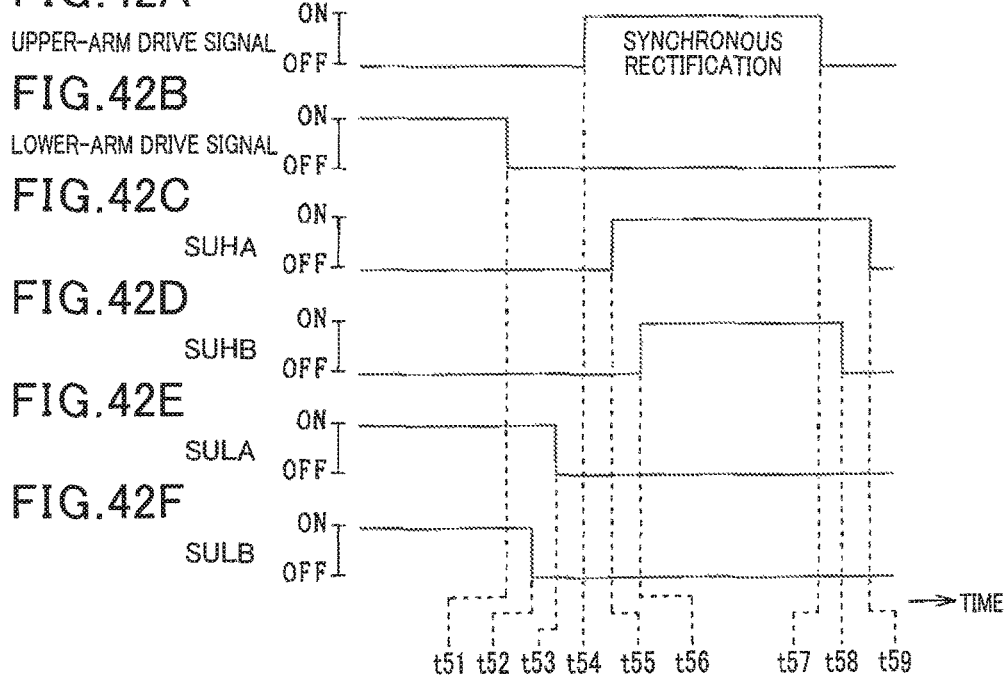

US 10,291,110 B2

DRIVING CIRCUIT FOR SWITCHING ELEMENT AND POWER CONVERSION SYSTEM

CROSS REFERENCE TO RELATED APPLICATION

This application is based on and claims the benefit of priority from Japanese Patent Applications No. 2016-083516 filed on Apr. 19, 2016, No. 2016-204535 filed on Oct. 18, 2016, and No. 2017-78462 filed on Apr. 11, 2017, the disclosures of which are incorporated in their entireties herein by reference.

TECHNICAL FIELD

The present disclosure relates to driving circuits each configured to drive, i.e. turn on or off, a plurality of switching elements connected in parallel to each other.

BACKGROUND

Such driving circuits are operative to drive, i.e. turn on or off, a switch comprised of an insulated-gate bipolar transistor (IGBT) as an example of silicon (Si) devices, and a metal-oxide semiconductor field-effect transistor (MOSFET) as an example of silicon carbide (SiC) devices; the IGBT and the MOSFET are connected in parallel to each other. One of these driving circuits is disclosed in Japanese Patent Application Publication No. 2002-16486.

SUMMARY

When turning on the parallely connected IGBT and MOSFET, the JP Patent Application Publication is silent about specific individual turn-on timings of the respective IGBT and MOSFET. This may result in higher switching of the IGBT and MOSFET.

Similarly, when turning off the parallely connected IGBT and MOSFET, the JP Patent Application Publication is silent about specific individual turn-off timings of the respective IGBT and MOSFET. This also may result in higher switching loss of the IGBT and MOSFET.

In view of the circumstances set forth above, one aspect of the present disclosure seeks to provide driving circuits for driving first and second switching elements, each of which is capable of addressing the problem set forth above.

Specifically, an alternative aspect of the present disclosure aims to provide such driving circuits, each of which is capable of reducing switching loss of the first and second switching elements.

According to an exemplary aspect of the present disclosure, there is provided a drive circuit for driving at least one set of at least first and second switching elements connected in parallel to each other. Each of the first and second switching elements has an on-off control terminal. The drive circuit includes a drive state changer. The drive state changer is configured to (1) Move first electrical charge to or from the on-off control terminal of the first switching element to change the first switching element from one of an on state and an off state to the other thereof (2) Move second electrical charge to or from the on-off control terminal of the second switching element to change the second switching element from one of the on state and the off state to the other thereof.

The drive circuit also includes a rate adjuster. The rate adjuster is configured to (1) Adjust a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next (2) Adjust the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next.

For change of each of the first and second switching elements from the off state to the on state, the first switching element is changed from the off state to the on state first, and thereafter the second switching element is changed from the off state to the on state next. That is, the second switching element is changed from the off state to the on state while the first switching element is in the on state. This enables a higher rate of movement of the second electrical charge of the second switching element for changing the second switching element from the off state to the on state to be carried out without the occurrence of a large surge.

In addition, for change of each of the first and second switching elements from the on state to the off state, the second switching element is changed from the on state to the off state first, and thereafter the first switching element is changed from the on state to the off state next. That is, the second switching element is changed from the on state to the off state while the first switching element is in the off state. This enables a higher rate of movement of the second electrical charge of the second switching element for changing the second switching element from the on state to the off state to be carried out without the occurrence of a large surge.

This configuration of the drive circuit therefore results in lower loss of the second switching element.

BRIEF DESCRIPTION OF THE DRAWINGS

Other aspects of the present disclosure will become apparent from the following description of embodiments with reference to the accompanying drawings in which:

FIGS. 4A to 4E are a joint timing chart schematically illustrating how predetermined parameters change over time during a charging task;

FIGS. 6A to 6E are a joint timing chart schematically illustrating how predetermined parameters change over time during a discharging task;

FIG. 7 is a graph schematically illustrating an advantageous effect of lower loss achieved by the first embodiment;

FIG. 10 is a circuit diagram schematically illustrating an example of the structure of a drive circuit for the U-phase upper-arm switch module according to the fourth embodiment of the present disclosure;

FIG. 11A is a table schematically illustrating how variable resistors illustrated in FIG. 10 are set for the charging task;

FIG. 11B is a table schematically illustrating how the variable resistors illustrated in FIG. 10 are set for the discharging task;

FIGS. 15A and 15B is a joint timing chart schematically illustrating how a gate voltage and a gate current change over time in constant current control;

FIGS. 16A and 16B is a joint timing chart schematically illustrating how the gate voltage and the gate current change over time in constant voltage control;

FIGS. 18A and 18B are a joint timing chart schematically illustrating how a first U-phase upper arm gate voltage and a first lower-arm gate voltage change over time based on an off-hold task;

FIG. 29 is a diagram schematically illustrating parasitic capacitors that an IGBT has;

FIGS. 30A to 30C are a joint timing chart schematically illustrating how the drive signal, the gate voltage, and a collector-emitter voltage change over time according to the tenth embodiment;

FIGS. 42A to 42F are a joint timing chart schematically illustrating an example of how first and second U-phase upper-arm switching elements and first and second U-phase lower-arm switching elements are driven during execution of synchronous rectification;

FIGS. 43A to 43F are a joint timing chart schematically illustrating another example of how first and second U-phase upper-arm switching elements and first and second U-phase lower-arm switching elements are driven during execution of synchronous rectification;

DETAILED DESCRIPTION OF EMBODIMENT

Figure 1:
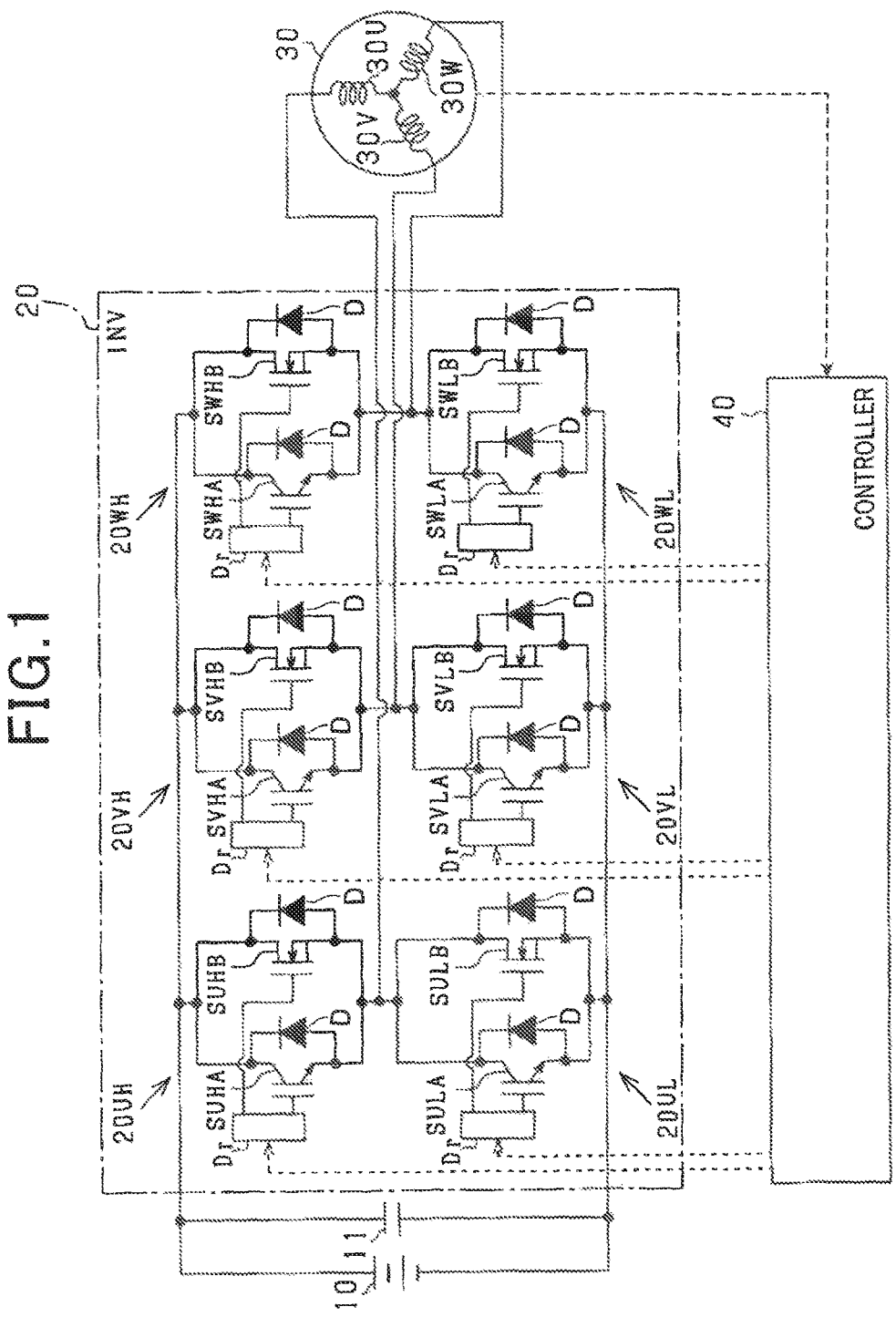
FIG. 1 is a circuit diagram schematically illustrating an example of the overall structure of a motor control system according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment in which drive circuits Dr according to the present disclosure are applied to a control system 100 for a motor-generator 30 installed in a vehicle V.

Referring to FIG. 1, the control system 100 includes a battery 10, an inverter 20, a motor-generator 30, the drive circuits Dr, and a controller 40.

The motor-generator 30 serves as, for example, a main engine of the vehicle V, and is configured such that power, i.e. torque, is transferable to at least one unillustrated driving wheel of the vehicle V. The motor-generator 30 is also electrically connected to the battery 10 via the inverter 20. The first embodiment uses a permanent magnet synchronous three-phase motor-generator as the motor-generator 30. In particular, the first embodiment uses a salient-pole interior permanent magnet synchronous motor (IPMSM) as the motor-generator 11. The motor-generator 30 includes a rotor having permanent magnets, and a stator having a stator core and stator coils 30U, 30V, and 30W. In particular, the motor-generator 30 is capable of rotating the rotor having the permanent magnets based on magnetic interactions between the permanent magnets of the rotor and a rotating magnetic field generated by U-, V-, and W-phase stator coils 30U, 30V, and 30W of the stator. The stator can be configured such that each of the three-phase stator coils 30U, 30V, and 30W is wound in and around the stator core in concentrated or distributed configuration.

The first embodiment uses a rechargeable battery, such as a lithium-ion battery or a nickel-hydrogen battery, which has a terminal voltage equal to or higher than 100 V. The control system 100 also includes a capacitor connected in parallel to the battery 10.

The inverter 10 includes six switch modules comprised of a U-phase upper-arm switch module 20UH, a U-phase lower-arm switch module 20UL, a V-phase upper-arm switch module 20VH, a V-phase lower-arm switch module 20VL, a W-phase upper-arm switch module 20WH, and a W-phase lower-arm switch module 20WL.

The U-phase upper-arm switch module 20UH is connected in series to the U-phase lower-arm switch module 20UL to constitute a U-phase series connection unit. The U-phase upper-arm switch module 20UH is comprised of a first U-phase upper-arm switching element SUHA and a second U-phase upper-arm switching element SUHB connected in parallel to each other. The U-phase lower-arm switch module 20UL is comprised of a first U-phase lower-arm switching element SULA and a second U-phase lower-arm switching element SULB connected in parallel to the first U-phase lower-arm switching element SULA.

The U-phase upper-arm switch module 20UH, i.e. each of the first and second U-phase upper-arm switching elements SUHA and SUHB, has opposing input and output terminals, and the U-phase lower-arm switch module 20UL, i.e. each of the first and second U-phase upper-arm switching elements SUHA and SUHB, has opposing input and output terminals. The input terminal of the U-phase upper-arm switch module 20UH, i.e. each of the first and second U-phase upper-arm switching elements SUHA and SUHB, is connected to the corresponding one of the first and second U-phase lower-arm switching elements SULA and SULB.

The connection point between the U-phase upper-arm switch module 20UH and the U-phase lower-arm switch module 20UL is connected to a first end of the U-phase coil 30U.

The V-phase upper-arm switch module 20VH is connected in series to the V-phase lower-arm switch module 20VL to constitute a V-phase series connection unit. The V-phase upper-arm switch module 20VH is comprised of a first V-phase upper-arm switching element SVHA and a second V-phase upper-arm switching element SVHB connected in parallel to the first V-phase lower-arm switching element SVHA. The V-phase lower-arm switch module 20VL is comprised of a first V-phase lower-arm switching element SVLA and a second V-phase lower-arm switching element SVLB connected in parallel to the first V-phase lower-arm switching element SVLA.

The V-phase upper-arm switch module 20VH, i.e. each of the first and second V-phase upper-arm switching elements SVHA and SVHB, has opposing input and output terminals, and the V-phase lower-arm switch module 20VL, i.e. each of the first and second V-phase lower-arm switching elements SVLA and SVLB, has opposing input and output terminals. The input terminal of the V-phase upper-arm switch module 20VH, i.e. each of the first and second V-phase upper-arm switching elements SVHA and SVHB, is connected to the corresponding one of the first and second V-phase lower-arm switching elements SVLA and SVLB.

The connection point between the V-phase upper-arm switch module 20VH and the V-phase lower-arm switch module 20VL is connected to a first end of the V-phase coil 30V.

The W-phase upper-arm switch module 20WH is connected in series to the W-phase lower-arm switch module 20WL to constitute a W-phase series connection unit. The W-phase upper-arm switch module 20WH is comprised of a first W-phase upper-arm switching element SWHA and a second W-phase upper-arm switching element SWHB connected in parallel to the first W-phase lower-arm switching element SWHA. The W-phase lower-arm switch module 20WL is comprised of a first W-phase lower-arm switching element SWLA and a second W-phase lower-arm switching element SWLB connected in parallel to the first W-phase lower-arm switching element SWLA.

The W-phase upper-arm switch module 20WH, i.e. each of the first and second W-phase upper-arm switching elements SWHA and SWHB, has opposing input and output terminals, and the W-phase lower-arm switch module 20WL, i.e. each of the first and second W-phase lower-arm switching elements SWLA and SWLB, has opposing input and output terminals. The input terminal of the W-phase upper-arm switch module 20WH, i.e. each of the first and second W-phase upper-arm switching elements SWHA and SWHB, is connected to the corresponding one of the first and second W-phase lower-arm switching elements SWLA and SWLB.

The connection point between the W-phase upper-arm switch module 20WH and the W-phase lower-arm switch module 20WL is connected to a first end of the W-phase coil 30W.

Second ends of the U-, V-, and W-phase coils, which are opposite to their first ends, are connected to a common junction, i.e. a neutral point, in, for example, a star-configuration.

The first embodiment uses IGBTs, as an example of Si devices, as the respective first switching elements SUHA, SULA, SVHA, SVLB, SWHA, and SWLA. For this reason, the input terminal of each of the first switching elements SUHA, SULA, SVHA, SVLA, SWHA, and SWLA is the collector of the corresponding switching element, and the output terminal of each of the first switching elements SUHA, SULA, SVHA, SVLA, SWHA, and SWLA is the emitter of the corresponding switching element.

In addition, the first embodiment uses N-channel MOSFETs, as an example of SiC devices, as the respective second switching elements SUHB, SULB, SVHB, SVLB, SWHB, and SWLB. For this reason, the input terminal of each of the second switching elements SUHB, SULB, SVHB, SVLB, SWHB, and SWLB is the drain of the corresponding switching element, and the output terminal of each of the second switching elements SUHB, SULB, SVHB, SVLB, SWHB, and SWLB is the source of the corresponding switching element.

The inverter 20 also includes flyback, i.e. free-wheeling, diodes D connected in antiparallel to the respective switching elements SUHA, SULA, SVHA, SVLB, SWHA, and SWLA. Because the second switching elements SUHB, SULB, SVHB, SVLB, SWHB, and SWLB are respectively N-channel MOSFETs, each of the N-channel MOSFETs has an intrinsic diode, so that the intrinsic diodes of the second switching elements SUHB, SULB, SVHB, SVLB, SWHB, and SWLB serve as flyback diodes for the respective second switching elements SUHB, SULB, SVHB, SVLB, SWHB, and SWLB. Note that additional flyback diodes can be connected in antiparallel to the respective switching elements SUHB, SULB, SVHB, SVLB, SWHB, and SWLB.

That is, the reason why each switch module 20UH, 20UL, 20VH, 20VL, 20WH, and 20WL is comprised of an IGBT and a MOSFET connected in parallel to each other is to cause a current to flow through the MOSFET, which has a lower on resistance, when a value of the current is within a lower current range. The following describes how a current flows through a MOSFET of a switch module comprised of an IGBT and a current flows through the MOSFET connected in parallel to each other when a value of each current is within a predetermined low current range with reference to FIG. 2A.

Figure 2:
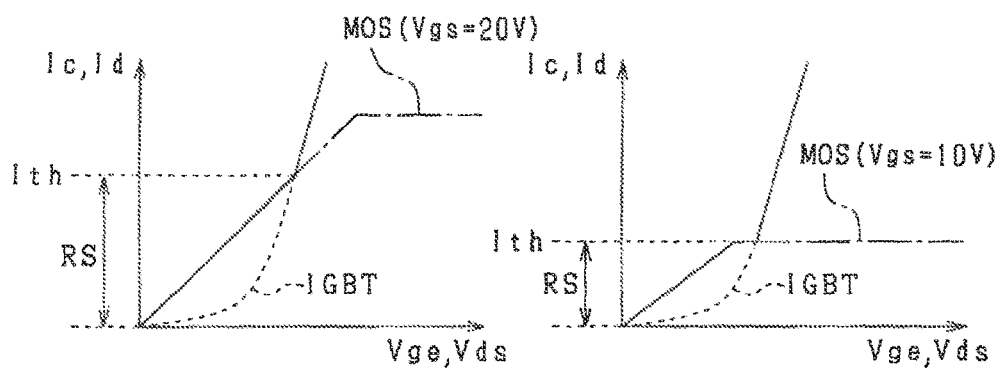
FIG. 2A is a graph schematically illustrating volt-current characteristics of an IGBT and a MOSFET when a gate-source voltage is 20 V.
FIG. 2B is a graph schematically illustrating volt-current characteristics of an IGBT and a MOSFET when a gate-source voltage is 10 V.

Specifically, when a gate voltage of the MOSFET is set to a predetermined value, such as 20 V, FIG. 2A illustrates (1) Volt-current characteristics between the drain-source voltage Vds of a MOSFET and a drain current Id using the dot-and-dash line (2) Volt-current characteristics between the collector-emitter voltage Vce of an IGBT and a collector current Ic using the dashed line (3) Volt-current characteristics of a switch module comprised of the MOSFET and the IGBT connected in parallel to each other using the solid line.

FIG. 2A shows that the drain-source voltage Vds as a function of the drain current Id is lower than the collector-emitter voltage Vcs as a function of the collector current Ic in the low current range in which the corresponding current Id or Ic is lower than a predetermined threshold current Ith. In other words, the on resistance of the MOSFET is lower than the on resistance of the IGBT in the low current range. For this reason, a larger amount of current flows through the MOSFET than through the IGBT in the low current range.

In contrast, FIG. 2A illustrates that the collector-emitter voltage Vcs as a function of the collector current Ic is lower than the drain-source voltage Vds as a function of the drain current Id in a high current range in which the corresponding current Id or Ic is equal to or higher than the predetermined threshold current Ith. In other words, the on resistance of the IGBT is lower than the on resistance of the MOSFET in the high current range. For this reason, a larger amount of current flows through the IGBT than through the MOSFET in the high current range. The range of the drain current Id and the collector current Ic, through which a larger amount of current flows through the MOSFET will be referred to as a current range RS.

The first embodiment is configured such that an upper limit of the corrector current Ic that can flow through each of the first switching elements SUHA, SULA, SVHA, SVLA, SWHA, and SWLA is set to be larger than an upper limit of the drain current Id that can flow through each of the second switching elements SUHB, SULB, SVHB, SVLB, SWHB, and SWLB.

In contrast, when the gate voltage of the MOSFET is set to a value 10 V, that is lower than the predetermined value of 20 V, FIG. 2B illustrates (1) Volt-current characteristics between the drain-source voltage Vds of a MOSFET and a drain current Id using the dot-and-dash line (2) Volt-current characteristics between the collector-emitter voltage Vce of an IGBT and a collector current Ic using the dashed line (3) Volt-current characteristics of a switch module comprised of the MOSFET and the IGBT connected in parallel to each other using the solid line.

Lower gate voltage of the MOSFET causes the saturation voltage of the MOSFET to be lower, resulting in the threshold current Ith, which separates the low current range and high current range from each other, being lower. This results in the current range RS of the drain current Id and the collector current Ic, through which a larger amount of current flows through the MOSFET, as illustrated in FIG. 2B being narrower than the current range RS of the drain current Id and the collector current Ic as illustrated in FIG. 2A.

The drive circuits Dr are provided for the respective switch modules 20UH, 20UL, 20VH, 20VL, 20WH, and 20WL. The drive circuit Dr for the switch module 20UH is connected to the control terminals, i.e. gates, of the respective switching elements SUHA and SUHB, and is operative to turn on or off each of the switching elements SUHA and SUHB. The drive circuit Dr for the switch module 20UL is connected to the control terminals, i.e. gates, of the respective switching elements SULA and SULB, and is operative to turn on or off each of the switching elements SULA and SULB. The drive circuit Dr for the switch module 20VH is connected to the control terminals, i.e. gates, of the respective switching elements SVHA and SVHB, and is operative to turn on or off each of the switching elements SVHA and SVHB. The drive circuit Dr for the switch module 20VL is connected to the control terminals, i.e. gates, of the respective switching elements SVLA and SVLB, and is operative to turn on or off each of the switching elements SVLA and SVLB. The drive circuit Dr for the switch module 20WH is connected to the control terminals, i.e. gates, of the respective switching elements SWHA and SWHB, and is operative to turn on or off each of the switching elements SWHA and SWHB. The drive circuit Dr for the switch module 20WL is connected to the control terminals, i.e. gates, of the respective switching elements SWLA and SWLB, and is operative to turn on or off each of the switching elements SWLA and SWLB.

The controller 40 drives, based on three-phase currents flowing in the motor-generator 30, the inverter 20 via the drive circuits Dr to thereby control a controlled variable, such as torque, of the motor-generator 30 to a commanded value or a requested value.

Specifically the controller 40 generates drive signals, i.e. voltage signals, for the respective switch modules 20UH, 20UL, 20VH, 20VL, 20WH, and 20WL. The drive signal for the switch module 20UH is to turn on or off the switching elements SUHA and SUHB, and the drive signal for the switch module 20UL is to turn on or off the switching elements SULA and SULB. The drive signal for the switch module 20VH is to turn on or off the switching elements SVHA and SVHB, and the drive signal for the switch module 20VL is to turn on or off the switching elements SVLA and SVLB. The drive signal for the switch module 20WH is to turn on or off the switching elements SWHA and SWHB, and the drive signal for the switch module 20WL is to turn on or off the switching elements SWLA and SWLB.

Then, the controller 40 outputs the generated drive signals to the corresponding drive circuits Dr.

For example, the controller 40 performs a known pulse-width modulation (PWM) task that compares in magnitude three-phase command voltages, which have a phase difference of 120 electrical degrees from each other, with a periodical carrier signal, such as a periodical triangular carrier signal. Then, the controller 40 generates, according to the compared results, the drive signals for the respective switch modules 20UH, 20UL, 20VH, 20VL, 20WH, and 20WL. Each of the drive signals is configured to show an on command for changing the corresponding switching elements from an off state to an on state, and an off command for changing the corresponding switching elements from the on state to the off state. Each of the drive signals is, for example, designed as a pulse voltage signal with a controllable duty, i.e. a controllable on-pulse width for each switching cycle matching with the cycle of the carrier signal. Note that the on command of the drive signal is expressed as a logical high-level (H) voltage signal, and the off command of the drive signal is expressed as a logical low-level (L) voltage signal.

In particular, the controller 40 is configured to complementarily turn on the upper- and lower-arm switching elements for each phase via the corresponding drivers Dr, so that the upper- and lower-arm switching elements for the corresponding phase are complementarily turned on.

Figure 3:
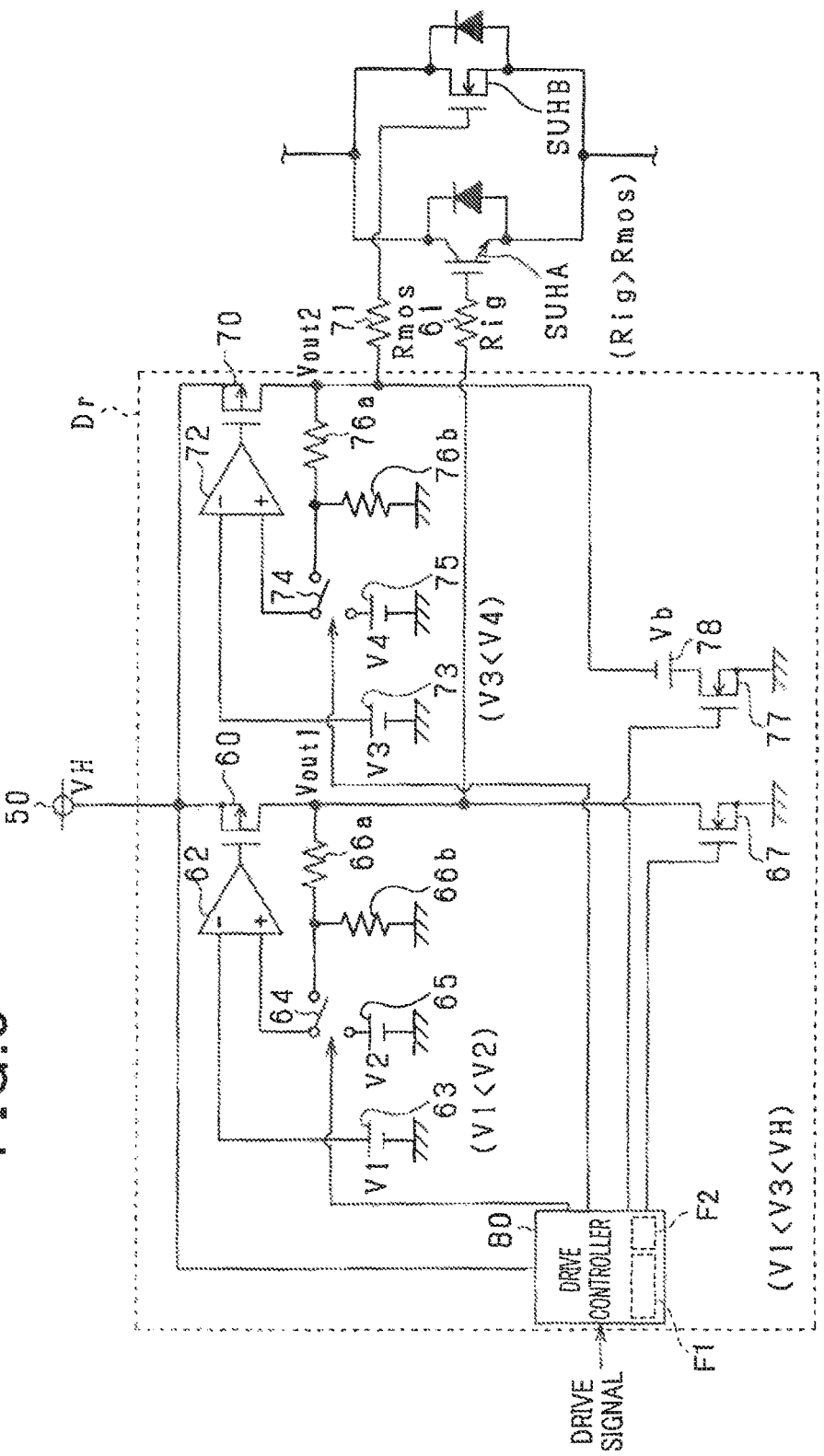
FIG. 3 is a circuit diagram schematically illustrating an example of the structure of a drive circuit for a U-phase upper-arm switch module illustrated in FIG. 1.

Next, the following describes an example of the structure of the drive circuits Dr for the respective switch modules 20UH, 20UL, 20VH, 20VL, 20WH, and 20WL with reference to FIG. 3. The drive circuits Dr for the respective switch modules 20UH, 20UL, 20VH, 20VL, 20WH, and 20WL basically have a common structure. For this reason, the following describes the structure of the drive circuit Dr for the U-phase upper-arm switch module 20UH as a typical example.

Referring to FIG. 3, the drive circuit Dr is connected to a constant voltage source 50 installed in, for example, the vehicle V, so that electrical power is supplied from the constant voltage source 50 to the drive circuit Dr. The first embodiment uses reference character VH expressing an output voltage of the constant voltage source 50. The output voltage VH of the constant voltage source 50 is set to be, for example, 25 V. For example, the constant voltage source 50 is designed as an isolated power supply system including a transformer for transforming a voltage input to an input portion thereof into an output voltage to be output through an output portion while electrically isolating the input portion and the output portion from each other.

The following describes the structure of the drive circuit Dr for driving the first U-phase upper-arm switching element SUHA.

The drive circuit Dr includes a first charging switching element 60, a first operational amplifier 62, a first power source 63, a first switch 64, a second power source 65, first and second resistors 66a and 66b, a first discharging switching element 67, and a drive controller 80.

The first charging switching element 60 has an input terminal connected to the constant voltage source 50, and has an output terminal connected to a first end of a first gate resistor member 61; the first gate resistor member 61 has a predetermined gate resistance Rig. A second end of the first gate resistor member 61, which is opposite to the first end, is connected to the gate of the first U-phase upper-arm switching element SUHA; the gate of the first U-phase upper-arm switching element SUHA serves as an on-off control terminal thereof. The first embodiment uses a P-channel MOSFET as the first charging switching element 60, so that the source of the P-channel MOSFET 60 serves as its input terminal, the drain thereof serves as its output terminal, and the gate thereof serves as its on-off control terminal.

The first operational amplifier 62 has a non-inverting input terminal, an inverting input terminal, and an output terminal. The on-off control terminal of the first charging switching element 60 is connected to the output terminal of the first operational amplifier 62. The first power source 63 has a positive terminal and a negative terminal, and the positive terminal of the first power source 63 is connected to the inverting input terminal of the first operational amplifier 62. The emitter of the first U-phase upper-arm switching element SUHA is connected to the negative terminal of the first power source 63 via a common signal ground of the drive circuit Dr. The second power source 65 has a positive terminal and a negative terminal.

Each of the first and second resistors 66a and 66b has opposing first and second ends. The first end of the first resistor 66a is connected to the output terminal of the first charging switching element 60, and the second end of the first resistor 66a is connected to the first end of the second resistor 66b. The second end of the second resistor 66b is connected to the common signal ground.

The first switch 64 is connected to the drive controller 80. The drive controller 80 can be designed as, for example, a computer processor, i.e. a programmed-logic circuit or as a hardware logic circuit or the combination of hardwired-logic and programmed-logic hybrid circuits.

Under control of the drive controller 80, the first switch 64 is configured to selectively connect, to the non-inverting input terminal of the first operational amplifier 62, one of the positive terminal of the second power source 65 and the connection point CP1 between the second end of the first resistor 66a and the first end of the second resistor 66b. The negative terminal of the second power source 65 is connected to the emitter of the first U-phase upper-arm switching element SUHA via the common signal ground.

The first discharging switching element 67 has an input terminal connected to the first end of the first gate resistor member 61 and the output terminal of the first charging switching element 60. The first discharging switching element 67 has an output terminal connected to the common signal ground, and has a control terminal connected to a drive controller 80 described later.

The first embodiment uses an N-channel MOSFET as the first discharging switching element 67, so that the drain of the N-channel MOSFET 67 serves as its input terminal, the source thereof serves as its output terminal, and the gate thereof serves as the control terminal.

Next, the following describes the structure of the drive circuit Dr for driving the second U-phase upper-arm switching element SUHB.

The drive circuit Dr includes a second charging switching element 70, a second operational amplifier 72, a third power source 73, a second switch 74, a fourth power source 75, third and fourth resistors 76a and 76b, a second discharging switching element 77, and a bias power source 78.

The first charging switching element 70 has an input terminal connected to the constant voltage source 50, and has an output terminal connected to a first end of a second gate resistor member 71; the second gate resistor member 71 has a predetermined gate resistance Rmos lower than the gate resistance Rig of the first gate resistor member 61. A second end of the second gate resistor member 71, which is opposite to the first end, is connected to the gate of the second U-phase upper-arm switching element SUHB; the gate of the second U-phase upper-arm switching element SUHB serves as an on-off control terminal thereof. The first embodiment uses a P-channel MOSFET as the second charging switching element 70, so that the source of the P-channel MOSFET 70 serves as its input terminal, the drain thereof serves as its output terminal, and the gate thereof serves as its on-off control terminal.

The first and second gate resistor members 61 and 71 can be designed as elements of the respective switching elements SUHA and SUHB, or can be include in the drive circuit Dr.

The second operational amplifier 72 has a non-inverting input terminal, an inverting input terminal, and an output terminal. The on-off control terminal of the second charging switching element 70 is connected to the output terminal of the second operational amplifier 72. The third power source 73 has a positive terminal and a negative terminal, and the positive terminal of the third power source 73 is connected to the inverting input terminal of the second operational amplifier 72. The source of the second U-phase upper-arm switching element SUHB is connected to the negative terminal of the third power source 73 via the common signal ground of the drive circuit Dr. The fourth power source 75 has a positive terminal and a negative terminal.

Each of the third and fourth resistors 76a and 76b has opposing first and second ends. The first end of the third resistor 76a is connected to the output terminal of the second charging switching element 70, and the second end of the third resistor 76a is connected to the first end of the fourth resistor 76b. The second end of the fourth resistor 76b is connected to the common signal ground.

The second switch 74 is connected to the drive controller 80. Under control of the drive controller 89, the second switch 74 is configured to selectively connect, to the non-inverting input terminal of the second operational amplifier 72, one of the positive terminal of the fourth power source 75 and the connection point CP2 between the second end of the third resistor 76a and the first end of the fourth resistor 76b. The negative terminal of the fourth power source 75 is connected to the source of the second U-phase upper-arm switching element SUHB via the common signal ground.

The bias power source 78 has positive and negative terminals. The negative terminal of the bias power source 78 is connected to the first end of the second gate resistor member 71 and to the output terminal of the second charging switching element 70.

The second discharging switching element 77 has an input terminal connected to the positive terminal of the bias power source 78. The second discharging switching element 77 has an output terminal connected to the common signal ground, and has an on-off control terminal connected to the drive controller 80.

The first embodiment uses an N-channel MOSFET as the second discharging switching element 77, so that the drain of the N-channel MOSFET 77 serves as its input terminal, the source thereof serves as its output terminal, and the gate thereof serves as the on-off control terminal.

The drive controller 80 is connected to the constant voltage source 50. The drive controller 80 or the drive circuit Dr includes an unillustrated isolation device, such as a photocoupler, to which the drive signal for the corresponding U-phase upper-arm switch module 20UH is input. That is, the drive signal for the corresponding U-phase upper-arm switch module 20UH is input to the drive controller 80 via the isolation device while the controller 40 is electrically isolated from the drive circuit Dr.

The drive controller 80 serves as, for example, a drive state changer F1 (see FIG. 3). Specifically, the drive controller 80, serving as the drive state changer F1, is configured to (1) Perform a charging task to change each of the first and second U-phase upper-arm switching elements SUHA and SUHB from the off state to the on state upon determining that the drive signal represents the on command (2) Perform a discharging task to change each of the first and second U-phase upper-arm switching elements SUHA and SUHB from the on state to the off state upon determining that the drive signal represents the off command.

That is, the charging task is configured to move positive electrical charge to the on-off control terminal of each of the first and second U-phase upper-arm switching elements SUHA and SUHB to change the corresponding switching element from the off state to the on state.

In addition, the discharging task is configured to move positive electrical charge from the on-off control terminal of each of the first and second U-phase upper-arm switching elements SUHA and SUHB to discharge the corresponding switching element from the on state to the off state.

The following describes the charging and discharging tasks carried out by the drive controller 80.

First, the following describes the charging task with reference to FIGS. 4A to 4E. FIG. 4A schematically illustrates how the drive signal input to the drive controller 80 changes, FIG. 4B schematically illustrates how the first switch 64 is driven, and FIG. 4C schematically illustrates how the second switch 74 is driven. In addition, FIG. 4D schematically illustrates how the first U-phase upper-arm switching element SUHA is driven, and FIG. 4E schematically illustrates how the second U-phase upper-arm switching element SUHB is driven. Note that the drive controller 80 maintains the first and second discharging switching elements 67 and 77 in the off state while executing the charging task. FIGS. 4A to 4E can be collectively referred to as FIG. 4.

Referring to FIG. 4, upon determining that the drive signal is changed from the off command to the on command at time t1, the drive controller 80 outputs a switch control signal to the first switch 64 to drive the first switch 64 such that the connection point CP1 between the first and second resistors 66a and 66b is connected to the non-inverting input terminal of the first operational amplifier 62 at time t2. This causes the potential difference at the connection point CP1 between the first and second resistors 66a and 66b relative to the emitter of the first U-phase upper-arm switching element SUHA to be input to the non-inverting input terminal of the first operational amplifier 62.

At that time, to the inverting input terminal of the first operational amplifier 62, an output voltage V1 of the first power source 63 is input, and the output terminal of the first operational amplifier 62 is connected to the on-off control terminal of the first charging switching element 60.

Because the gate voltage of the first U-phase upper-arm switching element SUHA is substantially zero immediately after turn-on the first switch 64, the potential difference at the connection point CP1 between the first and second resistors 66a and 66b relative to the emitter of the first U-phase upper-arm switching element SUHA is substantially equal to zero.

This results in the first operational amplifier 62 outputting a negative voltage to the gate of the first charging switch 60, so that the first charging switch 60, which is the P-channel MOSFET, is turned on. This causes the output voltage VH of the constant voltage source 50 to be stepped down, and the stepped-down voltage is applied to the gate of the first U-phase upper-arm switching element SUHA, thus causing a charging current to flow into the gate of the first U-phase upper-arm switching element SUHA through the first gate resistor member 61.

That is, the charging current represents the flow of electrical charge, so that the flow of the charging current represents the movement of electrical charge.

This charges the gate of the first U-phase upper-arm switching element SUHA, thus causing the gate voltage of the first U-phase upper-arm switching element SUHA to start increasing at time t3.

An increase of the gate voltage of the first U-phase upper-arm switching element SUHA increases the potential difference at the connection point CP1 relative to the emitter of the first U-phase upper-arm switching element SUHA to approach the output voltage V1 of the first power source 63.

That is, the first charging switching element 60 is driven so that the potential difference at the connection point CP1 between the first and second resistors 66a and 66b relative to the emitter of the first U-phase upper-arm switching element SUHA is adjusted to be fed back to the output voltage V1 of the first power source 63.

The output voltage V1 of the first power source 63 according to the first embodiment is determined such that, when the voltage at the output terminal of the first charging switching element 60 is defined as a first feedback voltage Vout1, the first feedback voltage Vout1 becomes 15 V that is lower than the output voltage VH of the constant voltage source 50. Note that, in FIG. 4D, the gate voltage of the first U-phase upper-arm switching element SUHA immediately rises to exceed a predetermined threshold voltage, so that the first U-phase upper-arm switching element SUHA is turned on at the time t3. The gate voltage of the first U-phase upper-arm switching element SUHA however can rise at a predetermined gradient, so that the first U-phase upper-arm switching element SUHA can be turned on at time later than the time t3.

Thereafter, the drive controller 80 outputs the switch control signal to the second switch 74 to drive the second switch 74 such that the connection point CP2 between the third and fourth resistors 76a and 76b is connected to the non-inverting input terminal of the second operational amplifier 72 at time t4. This causes the potential difference at the connection point CP2 between the third and fourth resistors 76a and 76b relative to the source of the second U-phase upper-arm switching element SUHB to be input to the non-inverting input terminal of the second operational amplifier 72.

At that time, to the inverting input terminal of the second operational amplifier 72, an output voltage V3 of the third power source 73 is input, and the output terminal of the second operational amplifier 72 is connected to the on-off control terminal of the second charging switching element 70.

Because the gate voltage of the second U-phase upper-arm switching element SUHB is substantially zero immediately after turn-on the second switch 74, the potential difference at the connection point CP2 between the third and fourth resistors 76a and 76b relative to the source of the second U-phase upper-arm switching element SUHB is substantially equal to zero.

This results in the second operational amplifier 72 outputting a negative voltage to the gate of the second charging switch 70, so that the second charging switch 70, which is the P-channel MOSFET, is turned on. This causes the output voltage VH of the constant voltage source 50 to be stepped down, and the stepped-down voltage is applied to the gate of the second U-phase upper-arm switching element SUHB, thus causing a charging current to flow into the gate of the second U-phase upper-arm switching element SUHB through the second gate resistor member 71. This charges the gate of the second U-phase upper-arm switching element SUHB, thus causing the gate voltage of the second U-phase upper-arm switching element SUHB to start increasing at time t5.

An increase of the gate voltage of the second U-phase upper-arm switching element SUHB increases the second feedback voltage Vout2, i.e. the potential difference at the connection point CP2 relative to the source of the second U-phase upper-arm switching element SUHB to approach the output voltage V3 of the third power source 73.

It is noted that (1) The first feedback voltage Vout1 for the gate of the first U-phase upper-arm switching element SUHA represents a first target charge voltage for the gate of the first U-phase upper-arm switching element SUHA (2) The second feedback voltage Vout2 for the gate of the second U-phase upper-arm switching element SUHB represents a second target charge voltage for the gate of the second U-phase upper-arm switching element SUHB.

That is, the second charging switching element 70 is driven so that the potential difference at the connection point CP2 between the third and fourth resistors 76a and 76b relative to the source of the second U-phase upper-arm switching element SUHB is adjusted to be fed back to the output voltage V3 of the third power source 73.

The output voltage V3 of the third power source 73 according to the first embodiment is determined such that, when the voltage at the output terminal of the second charging switching element 70 is defined as a second feedback voltage Vout2, the second feedback voltage Vout2 becomes 20 V that is lower than the output voltage VH of the constant voltage source 50 and higher than the first feedback voltage Vout1.

Note that, in FIG. 4E, the gate voltage of the second U-phase upper-arm switching element SUHB immediately rises to exceed a predetermined threshold voltage, so that the second U-phase upper-arm switching element SUHB is turned on at the time t5. The gate voltage of the second U-phase upper-arm switching element SUHB however can rise at a predetermined gradient, so that the second U-phase upper-arm switching element SUHB can be turned on at time later than the time t5.

The drive controller 80 is operative to monitor the first feedback voltage Vout1, and the output voltage V2 of the second power source 65 is set to be higher than the output voltage V1 of the first power source 63.

As described above, an increase of the gate voltage of the first U-phase upper-arm switching element SUHA results in an increase of the first feedback voltage Vout1.

The drive controller 80 therefore outputs the switch control signal to the first switch 64 to drive the first switch 64 such that the positive terminal of the second power source 65 is connected to the non-inverting input terminal of the first operational amplifier 62 upon determining that the monitored first feedback voltage Vout1 becomes 15 V. This results in the second operational amplifier 72 outputting a positive voltage to the gate of the second charging switch 70, so that the second charging switch 70, which is the P-channel MOSFET, is turned off.

Similarly, the drive controller 80 is operative to monitor the second feedback voltage Vout2, and the output voltage V4 of the fourth power source 75 is set to be higher than the output voltage V3 of the third power source 73.

As described above, an increase of the gate voltage of the second U-phase upper-arm switching element SUHB results in an increase of the second feedback voltage Vout2.

The drive controller 80 therefore outputs the switch control signal to the second switch 74 to drive the second switch 74 such that the so positive terminal of the fourth power source 75 is connected to the non-inverting input terminal of the second operational amplifier 72 upon determining that the monitored second feedback voltage Vout2 becomes 20 V. This results in the second operational amplifier 72 outputting a positive voltage to the gate of the second charging switch 70, so that the second charging switch 70, which is the P-channel MOSFET, is turned off.

As described above, the drive controller 80 of the first embodiment is configured to start turn-on drive of the first U-phase upper-arm switching element SUHA first, and thereafter start turn-on drive of the second U-phase upper-arm switching element SUHB next. This configuration enables the first U-phase upper-arm switching element SUHA to be changed from the off state to the on state earlier than the second U-phase upper-arm switching element SUHB.

Specifically, an IGBT has a first threshold voltage Vth1. That is, the IGBT is changed from the off state to the on state when the gate-emitter voltage Vge of the IGBT exceeds the first threshold voltage Vth1, and the IGBT is changed from the on state to the off state when the gate-emitter voltage Vge of the IGBT falls below the first threshold voltage Vth1. Similarly, a MOSFET has a second threshold voltage Vth2. That is, the MOSFET is changed from the off state to the on state when the gate-source voltage Vgs of the MOSFET exceeds the second threshold voltage Vth2, and the MOSFET is changed from the on state to the off state when the gate-source voltage Vgs of the MOSFET falls below the second threshold voltage Vth2.

Figure 5:
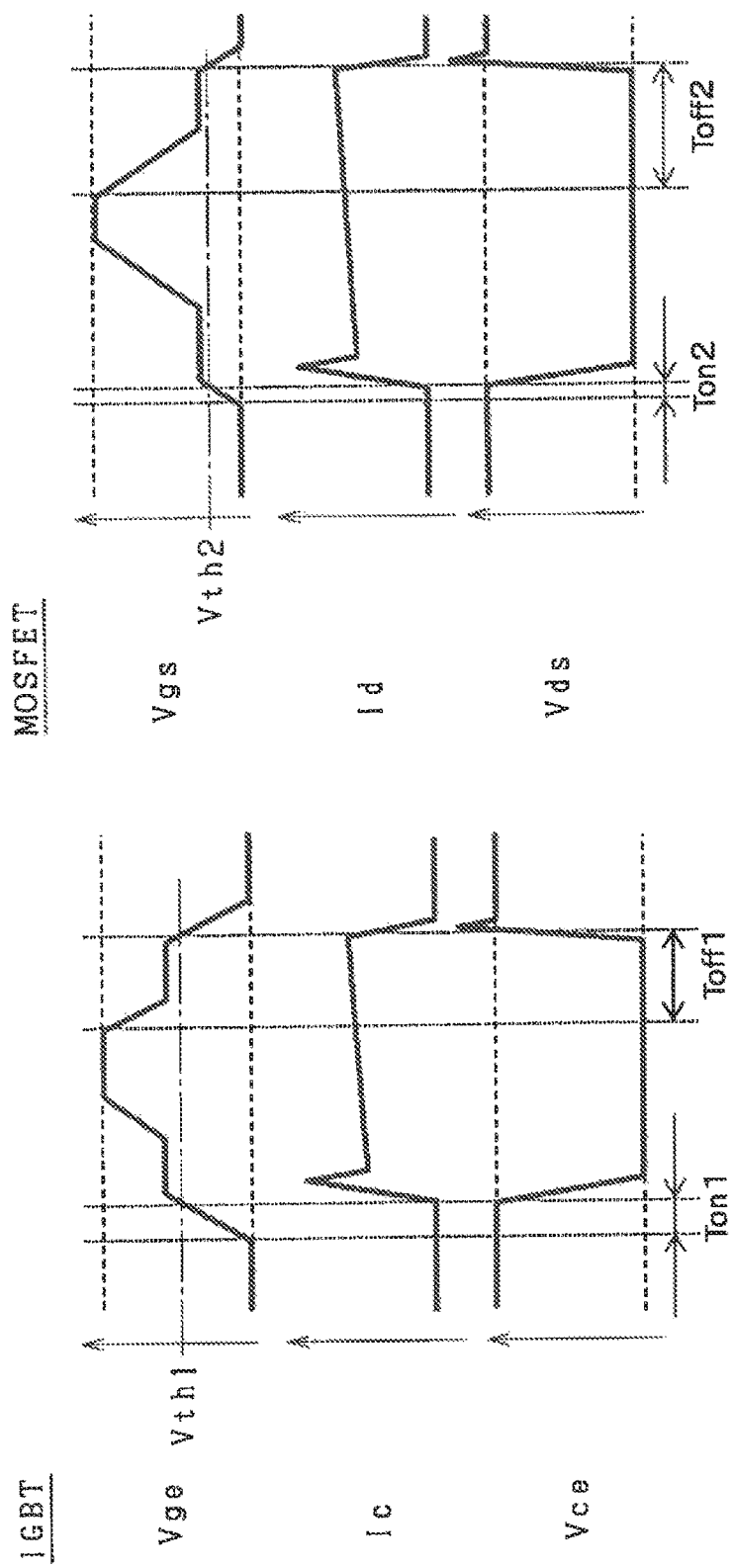
FIG. 5 is a timing chart schematically illustrating how each of an IGBT and a MOSFET is driven.

As illustrated in FIG. 5, the first threshold voltage Vth1 of the IGBT is higher than the second threshold voltage Vth2 of the MOSFET, resulting in a turn-on time Ton1 of the IGBT is longer than a turn-on time Ton2 of the MOSFET. Therefore, if the drive controller 60 started turn-on drive of the IGBT and MOSFET simultaneously, the MOSFET would be turned on earlier than the IGBT. From this viewpoint, the drive controller 80 is configured to start turn-on drive of the first U-phase upper-arm switching element (IGBT) SUHA first, and thereafter start turn-on drive of the second U-phase upper-arm switching element (MOSFET) SUHB next.

In addition, the combination of the first gate resistor member 61 and the second gate resistor member 71 serve as, for example, a rate adjuster. Specifically, as described above, the gate resistance Rmos of the second gate resistor member 71 is set to be lower than the gate resistance Rig of the first gate resistor member 61. This setting enables the charging rate of the gate of the second U-phase upper-arm switching element SUHB to be faster than the charging rate of the gate of the first U-phase upper-arm switching element SUHA, resulting in lower switching loss of the second U-phase upper-arm switching element SUHB. That is, when the second U-phase upper-arm switching element SUHB is turned on, the first U-phase upper-arm switching element SUHA has been turned on, so that a current has been flowing through the first U-phase upper-arm switching element SUHA. When the second U-phase upper-arm switching element SUHB is turned on while the current has been flowing, a part of the current is branched into the second U-phase upper-arm switching element SUHB, so that the total amount of current flowing through the U-phase upper-arm switch module 20UH is unchanged. This prevents a large surge from occurring due to switching of the second U-phase upper-arm switching element SUHB from the off state to the on state. This results in the charging rate of the gate of the second U-phase upper-arm switching element SUHB being faster than the charging rate of the gate of the first U-phase upper-arm switching element SUHA.

Next, the following describes the discharging task with reference to FIGS. 6A to 6E. FIGS. 6A, 6D, and 6E respectively correspond to FIGS. 4A, 4D, and 4E. FIG. 6B schematically illustrates how the first discharging switching element 67 is driven, and FIG. 6C schematically illustrates how the second discharging switching element 77 is driven. Note that the drive controller 80 drives the first switch 64 and second switch 74 while executing the discharging task such that (1) The positive terminal of the second power source 65 is connected to the non-inverting input terminal of the first operational amplifier 62

(2) The positive terminal of the fourth power source 75 is connected to the non-inverting input terminal of the second operational amplifier 72.

Referring to FIG. 6, upon determining that the drive signal is changed from the on command to the off command at time t11, the drive controller 80 changes the second discharging switching element 77 from the off state to the on state at time t12. This causes the gate of the second U-phase upper-arm switching element SUHB to be connected to the common signal ground via the second discharging switching element 77. This causes discharge of the gate of the second U-phase upper-arm switching element SUHB to start. That is, this causes a discharging current to start flowing from the gate of the second U-phase upper-arm switching element SUHB, resulting in starting decrease of the gate voltage of the second U-phase upper-arm switching element SUHB at time t13.

That is, the discharging current output from the gate of the second U-phase upper-arm switching element SUHB represents the flow of electrical charge output from the gate of the second U-phase upper-arm switching element SUHB. The flow of the discharging current output from the gate of the second U-phase upper-arm switching element SUHB represents the movement of electrical charge output from the gate of the second U-phase upper-arm switching element SUHB.

After turn on of the second discharging switching element 77, the drive controller 80 changes the first discharging switching element 67 from the off state to the on state at time t14. This causes the gate of the first U-phase upper-arm switching element SUHA to be connected to the common signal ground via the first discharging switching element 67. This causes discharge of the gate of the first U-phase upper-arm switching element SUHA to start, causing the gate voltage of the first U-phase upper-arm switching element SUHA to start decreasing at time t15.

Note that, in FIG. 6E, the gate voltage of the second U-phase upper-arm switching element SUHB immediately falls to be below the threshold voltage, so that the second U-phase upper-arm switching element SUHB is turned off at the time t13. The gate voltage of the second U-phase upper-arm switching element SUHB however can fall at a predetermined gradient, so that the second U-phase upper-arm switching element SUHB can be turned off at time later than the time t13.

Similarly, in FIG. 6D, the gate voltage of the first U-phase upper-arm switching element SUHA immediately falls to be below the threshold voltage, so that the first U-phase upper-arm switching element SUHA is turned off at the time t15. The gate voltage of the first U-phase upper-arm switching element SUHA however can fall at a predetermined gradient, so that the first U-phase upper-arm switching element SUHA can be turned off at time later than the time t15.

As described above, the drive controller 80 of the first embodiment is configured to start turn-off drive of the second U-phase upper-arm switching element SUHB first, and thereafter start turn-off drive of the first U-phase upper-arm switching element SUHA next. This configuration enables the second U-phase upper-arm switching element SUHA to be changed from the on state to the off state earlier than the first U-phase upper-arm switching element SUHA.

Specifically, as illustrated in FIG. 5, the first threshold voltage Vth1 of the IGBT is higher than the second threshold voltage Vth2 of the MOSFET, resulting in a turn-off time Toff1 of the IGBT is shorter than a turn-off time Toff2 of the MOSFET. Therefore, if the drive controller 60 started turn-off drive of the IGBT and MOSFET simultaneously, the IGBT would be turned off earlier than the MOSFET. From this viewpoint, the drive controller 80 is configured to start turn-off drive of the second U-phase upper-arm switching element (MOSFET) SUHB first, and thereafter start turn-off drive of the first U-phase upper-arm switching element (IGBT) SUHA next.

In addition, as described above, the combination of the first gate resistor member 61 and the second gate resistor member 71 serve as, for example, the rate adjuster. Specifically, as described above, the gate resistance Rmos of the second gate resistor member 71 is set to be lower than the gate resistance Rig of the first gate resistor member 61. This setting enables the discharging rate of the gate of the second U-phase upper-arm switching element SUHB to be faster than the discharging rate of the gate of the first U-phase upper-arm switching element SUHA, resulting in lower conduction loss and switching loss of the second U-phase upper-arm switching element SUHB. That is, even if the second U-phase upper-arm switching element SUHB is turned off, a current, which has flowed to the second U-phase upper-arm switching element SUHB, flows through the first U-phase upper-arm switching element SUHA. This maintains a current continuously flowing through the first U-phase upper-arm switching element SUHA in the upper-arm U-phase switch module 20UH. This prevents a large surge from occurring due to switching of the second U-phase upper-arm switching element SUHB from the on state to the off state. This results in the discharging rate of the gate of the second U-phase upper-arm switching element SUHB being faster than the discharging rate of the gate of the first U-phase upper-arm switching element SUHA.

Note that the gate of the first U-phase upper-arm switching element SUHA is discharged to have the potential at the common signal ground. In contrast, the gate of the second U-phase upper-arm switching element SUHB is discharged to have a negative potential, which is lower than the potential at the common signal ground, by a voltage across the bias power source 78.

As described above, the drive circuit Dr according to the first embodiment is configured to change the first U-phase upper-arm switching element SUHA, which is an IGBT, from the off state to the on state earlier than changing the second U-phase upper-arm switching element SUHB, which is a MOSFET. This aims to maintain higher reliability of the inverter 20.

Specifically, if the second U-phase upper-arm switching element SUHB were turned on earlier than the first U-phase upper-arm switching element SUHA while the first U-phase upper-arm switching element SUHA were short-circuited, a short-circuit current could flow through the second U-phase upper-arm switching element SUHB having a lower short-circuit withstand capability. This could result in lower reliability of the second U-phase upper-arm switching element SUHB.

In contrast, as described above, the drive circuit Dr according to the first embodiment is configured to change the first U-phase upper-arm switching element SUHA from the off state to the on state earlier than changing the second U-phase upper-arm switching element SUHB. Even if the first U-phase upper-arm switching element SUHA were turned on while the first U-phase upper-arm switching element SUHA were short-circuited, this configuration results in a short-circuit current flowing through the first U-phase upper-arm switching element (IGBT) SUHA having a higher short-circuit withstand than the second upper-arm switching element (MOSFET) SUHB. For this reason, the drive circuit Dr can be configured to execute an overcurrent protection task to forcibly turn off or keep off each of the switching elements SUHA, SULA, SVHA, SVLB, SWHA, SWLA, SUHB, SULB, SVHB, SVLB, SWHB, and SWLB before turning on the second U-phase upper-arm switching element SUHB in response to start of the short-circuit current flowing through the first U-phase upper-arm switching element SUHA. This configuration therefore maintains higher reliability of each of the first and second U-phase upper-arm switching elements SUHA and SUHB, in other words, prevents reliability of each of the first and second U-phase upper-arm switching elements SUHA and SUHB from deteriorating.

The drive circuit Dr according to the first embodiment is also configured to change the second U-phase upper-arm switching element SUHB from the on state to the off state first, and thereafter change the first U-phase upper-arm switching element SUHB from the on state to the off state next. This also aims to maintain higher reliability of the inverter 20.

Specifically, if the first U-phase upper-arm switching element SUHA were turned off earlier than the second U-phase upper-arm switching element SUHB in the high current range, it would be difficult to cause the whole of a current, which has flowed through the first U-phase upper-arm switching element SUHA, to flow through the second U-phase upper-arm switching element SUHB. This is because the upper limit of current that can flow through the second U-phase upper-arm switching element (MOSFET) SUHB is lower than the upper limit of current that can flow through the first U-phase upper-arm switching element (IGBT SUHA. This could result in a larger surge occurring due to the turn-off of the first U-phase upper-arm switching element SUHA.

In contrast, as described above, the drive circuit Dr according to the first embodiment is configured to (1) Turn off the second U-phase upper-arm switching element SUHB (MOSFET), which has a lower upper limit of current that can flow therethrough, first (2) Turn off, thereafter, the first U-phase upper-arm switching element SUHA (IGBT), which has a higher upper limit of current that can flow therethrough, next.

This enables a current, which has flowed through the second U-phase upper-arm switching element SUHB, to continuously flow through the first U-phase upper-arm switching element SUHA. This prevents a large surge due to turn-off of the second U-phase upper-arm switching element SUHB from occurring, thus maintaining higher reliability of the inverter 20.

In addition, the drive circuit Dr according to the first embodiment is configured to individually adjust the gate voltage, i.e. the gate-emitter voltage Vge, of the first U-phase upper-arm switching element SUHA, and the gate voltage, i.e. the gate-source voltage Vgs, of the second U-phase upper-arm switching element SUHB such that the gate voltage of the second U-phase upper-arm switching element SUHB is higher than the gate voltage of the first U-phase upper-arm switching element SUHA. For example, the drive circuit Dr increases the gate voltage of the first U-phase upper-arm switching element SUHA to 15 V, and the drive circuit Dr increases the gate voltage of the second U-phase upper-arm switching element SUHB to 20 V.

FIG. 7 illustrates that the higher drain current Id can flow through the MOSFET when the gate-source voltage Vgs is set to 20 V while the MOSFET is on as compared with the case where the drain current Id can flow through the MOSFET when the gate-source voltage Vgs is set to 10 V while the MOSFET is on. This results in further lower conduction loss of the second U-phase upper-arm switching element SUHB.

The drive circuit Dr is configured such that the bias power source 78 enables the gate of the second U-phase upper-arm switching element SUHB to be discharged to have a potential, which is lower than the potential at the source of the second U-phase upper-arm switching element SUHB, by the voltage thereacross. In particular, the bias power source 78 enables the gate of the second U-phase upper-arm switching element SUHB to be discharged to have the negative potential, which is lower than the potential at the potential at the source of the second U-phase upper-arm switching element SUHB, by the voltage thereacross.

This configuration of the drive circuit Dr based on the bias power source 78 achieves the following advantageous effect.

As descried above, the second threshold voltage Vth2 of the second U-phase upper-arm switching element (MOSFET) SUHB is higher than the first threshold voltage Vth1 of the first U-phase upper-arm switching element (IGBT) SUHA. There might be therefore a worry that noise on the gate of the second U-phase upper-arm switching element SUHB might cause the second U-phase upper-arm switching element SUHB to be erroneously turned on.

This configuration of the drive circuit Dr based on the bias power source 78 however enables the voltage across the bias power source 78 to reduce an increase of the gate voltage of the second U-phase upper-arm switching element SUHB that is in the off state, thus preventing the second U-phase upper-arm switching element SUHB from being erroneously turned on.

Second Embodiment

Figure 8:
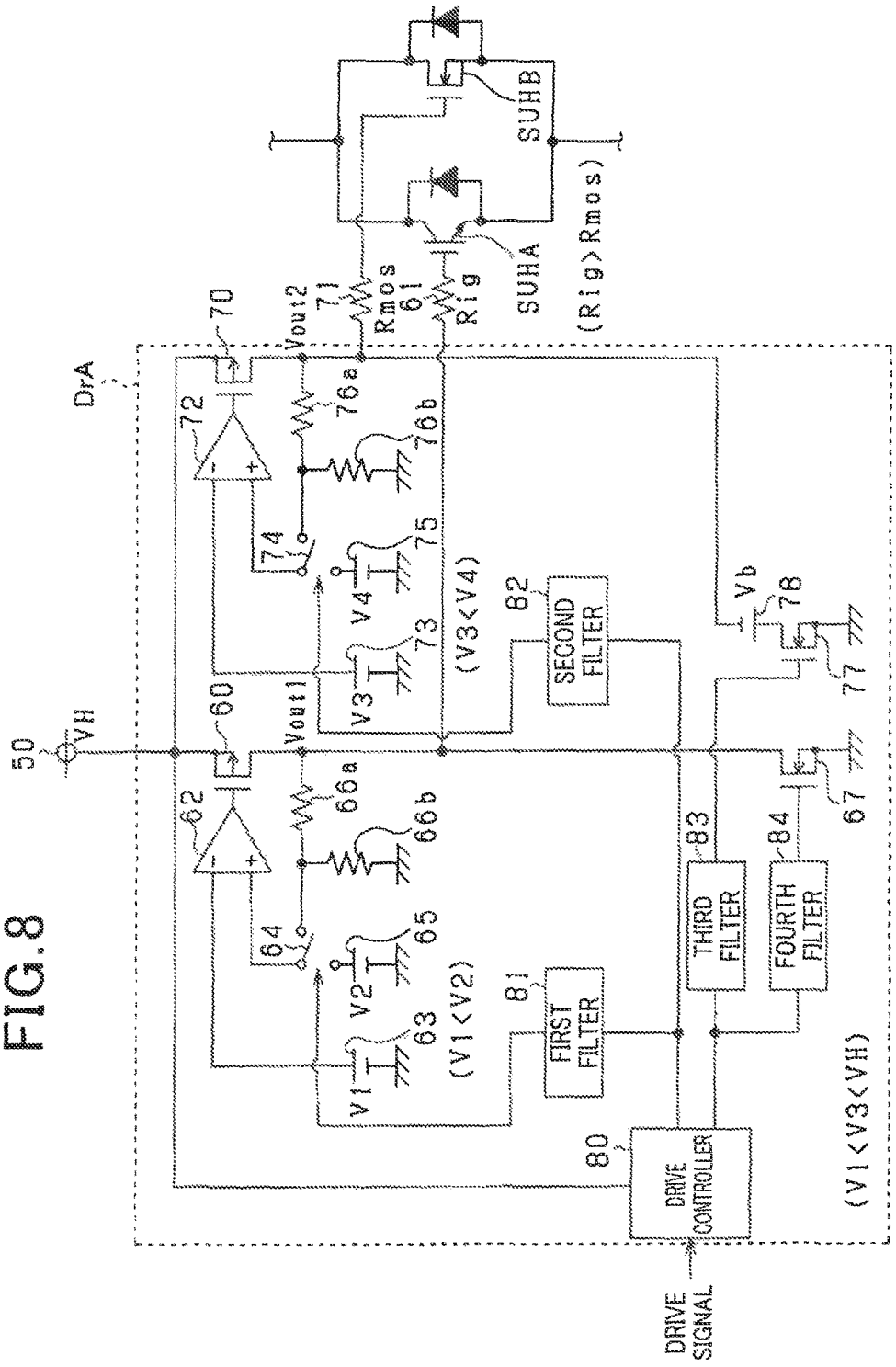
FIG. 8 is a circuit diagram schematically illustrating an example of the structure of a drive circuit for the U-phase upper-arm switch module according to the second embodiment of the present disclosure.

The following describes drive circuits DrA according to the second embodiment of the present disclosure with reference to FIG. 8. Similar to the first embodiment, the following describes the structure of the drive circuit DrA for the U-phase upper-arm switch module 20UH as a typical example.

The structures and/or functions of the drive circuit DrA according to the second embodiment are different from those of the drive circuit Dr according to the first embodiment by the following points. So, the following mainly describes the different points, and omits or simplifies descriptions of like parts between the first and second embodiments, to which identical or like reference characters are assigned, thus eliminating redundant description.

Referring to FIG. 8, the drive circuit DrA includes first to fourth filters 81 to 84 in addition to the components of the drive circuit Dr illustrated in FIG. 3. Each of the first to fourth filters 81 to 84 is designed as, for example, a low-pass filter.

The first filter 81 is connected between the drive controller 80 and the first switch 64. The drive controller 80 is configured to output, to the first filter 81, the drive signal input thereto as the switch control signal for the first switch 64. The first filter 81 is configured to apply a low-pass filter to the drive signal, thus outputting the filtered drive signal to the first switch 64. That is, the first filter 81 is configured to change the rising rate of the drive signal from the logical low-level to the logical high-level by a predetermined first time constant, and change the falling rate of the drive signal from the logical high-level to the logical low-level by the first time constant.

The second filter 82 is connected between the drive controller 80 and the second switch 74. The drive controller 80 is configured to output, to the second filter 82, the drive signal input thereto as the switch control signal for the second switch 74. The second filter 82 is configured to apply a low-pass filter to the drive signal, thus outputting the filtered drive signal to the second switch 74.

That is, the second filter 82 is configured to change the rising rate of the drive signal from the logical low-level to the logical high-level by a predetermined second time constant, and change the falling rate of the drive signal from the logical high-level to the logical low-level by the second time constant. In particular, the second time constant is set to be shorter than the first time constant.

Specifically, when the drive signal output from the drive controller 80 is changed from the logical low-level to the logical high-level, the switch control signals output from the respective first and second filters 81 and 82 gradually increase by the respective first and second time constants. The first switch 64 is configured to connect the connection point CP1 between the first and second resistors 66a and 66b to the non-inverting input terminal of the first operational amplifier 62 when the switch control signal output from the first filter 81 exceeds a predetermined first threshold. Similarly, the second switch 74 is configured to connect the connection point CP2 between the third and fourth resistors 76a and 76b to the non-inverting input terminal of the second operational amplifier 72 when the switch control signal output from the second filter 82 exceeds the first threshold.

As described above, the second embodiment is configured such that the first time constant of the first filter 81 is set to be shorter than the second time constant of the second filter 82. This results in the switch control signal output from the first filter 81 exceeding the first threshold earlier than the switch control signal output from the second filter 82.

This enables the connection between the connection point CP1 and the non-inverting input terminal of the first operational amplifier 62 to be carried out earlier than the connection between the connection point CP2 and the non-inverting input terminal of the second operational amplifier 72. In other words, turn-on drive of the first U-phase upper-arm switching element SUHA is started earlier than turn-on drive of the second U-phase upper-arm switching element SUHB.

The third filter 83 is connected between the drive controller 80 and the second discharging switching element 77. The drive controller 80 is configured to output, to the third filter 83, the drive signal input thereto as the switch control signal for the second discharging switching element 77. The third filter 83 is configured to apply a low-pass filter to the drive signal, thus outputting the filtered drive signal to the second discharging switching element 77. That is, the third filter 83 is configured to change the rising rate of the drive signal from the logical low-level to the logical high-level by a predetermined third time constant, and change the falling rate of the drive signal from the logical high-level to the logical low-level by the third time constant.

The fourth filter 84 is connected between the drive controller 80 and the first discharging switching element 67. The drive controller 80 is configured to output, to the fourth filter 84, the drive signal input thereto as the switch control signal for the fourth switch 84. The fourth filter 84 is configured to apply a low-pass filter to the drive signal, thus outputting the filtered drive signal to the first discharging switching element 67.

That is, the fourth filter 84 is configured to change the rising rate of the drive signal from the logical low-level to the logical high-level by a predetermined fourth time constant, and change the falling rate of the drive signal from the logical high-level to the logical low-level by the fourth time constant. In particular, the third time constant is set to be shorter than the fourth time constant.

Specifically, when the drive signal output from the drive controller 80 is changed from the logical high-level to the logical low-level, the switch control signals output from the respective third and fourth filters 83 and 84 gradually decrease by the respective third and fourth time constants. The second discharging switching element 77 is turned on when the switch control signal output from the third filter 83 falls below a predetermined second threshold that is lower than the first threshold. Similarly, the first discharging switching element 67 is turned on when the switch control signal output from the fourth filter 84 falls below the second threshold.

As described above, the second embodiment is configured such that the third time constant of the third filter 83 is set to be shorter than the fourth time constant of the fourth filter 84. This results in the switch control signal output from the third filter 83 falling below the second threshold earlier than the switch control signal output from the fourth filter 84.

This enables the second discharging switching element 77 to be turned on earlier than the first discharging switching element 67. In other words, turn-off drive of the second U-phase upper-arm switching element SUHB is started earlier than turn-off drive of the first U-phase upper-arm switching element SUHA.

The second embodiment achieves the same advantageous effects as those achieved by the first embodiment.

Third Embodiment

Figure 9:
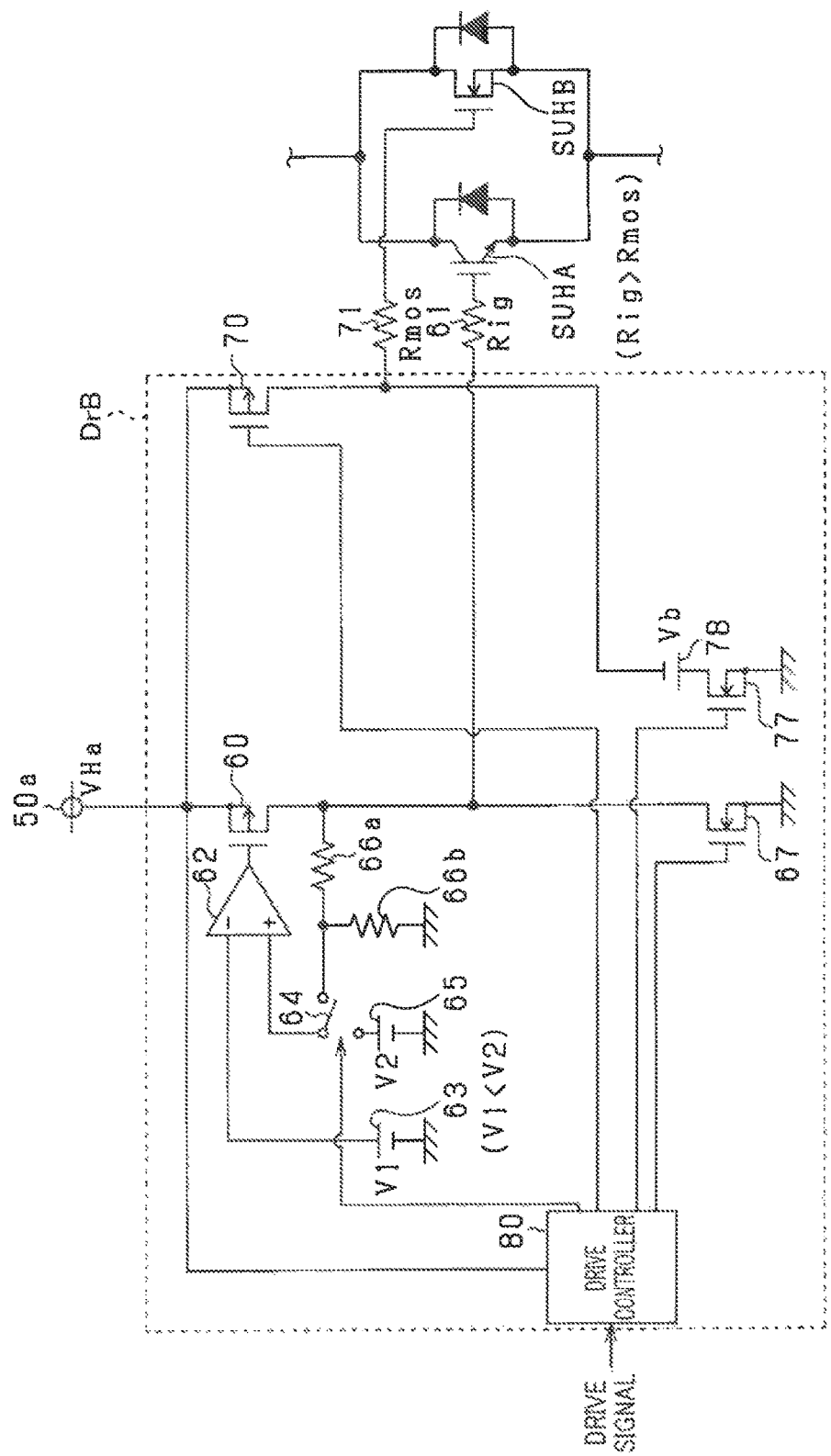
FIG. 9 is a circuit diagram schematically illustrating an example of the structure of a drive circuit for the U-phase upper-arm switch module according to the third embodiment of the present disclosure.

The following describes drive circuits DrB according to the third embodiment of the present disclosure with reference to FIG. 9. Similar to the first embodiment, the following describes the structure of the drive circuit DrB for the U-phase upper-arm switch module 20UH as a typical example.

The structures and/or functions of the drive circuit DrB according to the third embodiment are different from those of the drive circuit Dr according to the first embodiment by the following points. So, the following mainly describes the different points, and omits or simplifies descriptions of like parts between the first and third embodiments, to which identical or like reference characters are assigned, thus eliminating redundant description.

In the drive circuit DrB, the components 73 to 75, 76a, and 76b are eliminated as compared with the structure of the drive circuit Dr. The drive controller 80 is configured to directly output the switch control signal to the gate of the second charging switching element 70. A constant voltage source 50a is connected to the input terminal, i.e. source, of the second charging switching element 70. The output terminal, i.e. drain, of the second charging switching element 70 is connected to the first end of the second gate resistor member 71, and the second end of the second gate resistor member 71 is connected to the gate of the second U-phase upper-arm switching element SUHB.

The constant voltage source 50a according to the second embodiment is configured to apply an output voltage VHa to the gate of the second U-phase upper-arm switching element SUHB via the second charging switching element 70. The output voltage VHa is set to 20V that is lower than the output voltage VH of the constant voltage source 50 according to the first embodiment. That is, the output voltage VHa of the constant voltage source 50a is adjusted to a drive voltage suitable for driving, i.e. charging, the gate of the second U-phase upper-arm switching element SUHB.

The drive circuit DrB is configured such that the second U-phase upper-arm switching element SUHB is turned on based on the output voltage VHa when the switch control signal output from the drive controller 80 represents the on command set forth above.

The drive circuit DrB therefore achieves, as a specific advantageous effect, a simpler structure in addition to the same advantageous effects as those achieved by the first embodiment.

Fourth Embodiment

The following describes drive circuits DrC in a control system 100A according to the fourth embodiment of the present disclosure with reference to FIGS. 10, 11A, and 11B. Similar to the first embodiment, the following describes the structure of the drive circuit DrC for the U-phase upper-arm switch module 20UH as a typical example.

The structures and/or functions of the drive circuit DrC according to the fourth embodiment are different from those of the drive circuit Dr according to the first embodiment by the following points. So, the following mainly describes the different points, and omits or simplifies descriptions of like parts between the first and fourth embodiments, to which identical or like reference characters are assigned, thus eliminating redundant description.

The drive circuit DrC according to the fourth embodiment is configured to select at least one of the first and second U-phase upper-arm switching elements SUHA and SUHB as a target switching element to be driven in accordance with a current flowing through each of the first and second U-phase upper-arm switching elements SUHA and SUHB.

Referring to FIG. 10, first and second gate resistor members 61a and 71a are provided in place of the first and second resistor members 61 and 71 according to the first embodiment.

Each of the first and second gate resistor members 61a and 71a is designed as a variable resistor whose resistance can be changed. For example, each of the first and second gate resistor members 61a and 71a is designed such that (1) Whose resistance can be externally selected among first, second, third, and fourth on-resistance values Ron1, Ron2, Ron3, and Ron4 during execution of the charging task (2) Whose resistance can be externally selected among first, second, third, and fourth off-resistance values Roff1, Roff2, Roff3, and Roff4 during execution of the discharging task.

The control system 100A according to the fourth embodiment includes a current detector 90 for detecting a current flowing through one of the first and second U-phase upper-arm switching elements SUHA and SUHB. The current detector 90 can include, for example, a sense terminal that each of the first and second U-phase upper-arm switching elements SUHA and SUHB has, and first and second sense resistors. The first sense resistor has first and second ends. The first end of the first sense resistor is connected to the sense terminal of the first U-phase upper-arm switching element SUHA, and the second end is connected to the emitter of the first U-phase upper-arm switching element SUHA. Similarly, the second sense resistor has first and second ends. The first end of the second sense resistor is connected to the sense terminal of the second U-phase upper-arm switching element SUHB, and the second end is connected to the source of the second U-phase upper-arm switching element SUHB.

For example, the sense terminal of the first U-phase upper-arm switching element SUHA outputs a minute current, such as a sense current, that is represented as a function of the collector current Ic. When the sense current flows through the first sense resistor, the current detector 90 detects, based on a voltage drop across the first sense resistor, the collector current Ic flowing through the first U-phase upper-arm switching element SUHA. The current detector 90 also detects, based on a voltage drop across the second sense resistor, the drain current Id flowing through the second U-phase upper-arm switching element SUHB.

The current detector 90 is connected to a drive controller 80A, so that current measurement information indicative of the measured current indicative of one of the collector current Ic and the drain current Id is input to the drive controller 80A.

The drive controller 80A is configured to select, as its drive target, at least one of the first U-phase upper-arm switching element SUHA and the second U-phase upper-arm switching element SUHB in accordance with the current measurement information input from the current detector 90.

The following describes the charging task carried out by the drive controller 80A according to the fourth embodiment with reference to FIG. 11A.

The drive controller 80A includes a target switching-element selecting unit T1 that determines whether a value of the measured current based on the measurement current information is located within any one of a predetermined low current range, a predetermined medium current range, and a predetermined high current range described in detail later.

When it is determined that the value of the measured current is located within the low current range, the target switching-element selecting unit T1 determines a second drive mode as the drive mode of the drive controller 80A, and selects the second U-phase upper-arm switching element SUHB, which is a MOSFET, as the drive target while maintaining the first U-phase upper-arm switching element SUHA, which is an IGBT, in the off state.

Otherwise, when it is determined that the value of the measured current is located within the medium current range, the target switching-element selecting unit T1 determines a dual drive mode as the drive mode of the drive controller 80A, and selects both the first and second U-phase upper-arm switching elements SUHA and SUHB as the drive targets.

Otherwise, when it is determined that the value of the measured current is located within the high current range, the target switching-element selecting unit T1 determines a first drive mode as the drive mode of the drive controller 80A, and selects the first U-phase upper-arm switching element SUHA as the drive target while maintaining the second U-phase upper-arm switching element SUHB in the off state.

Figure 12:
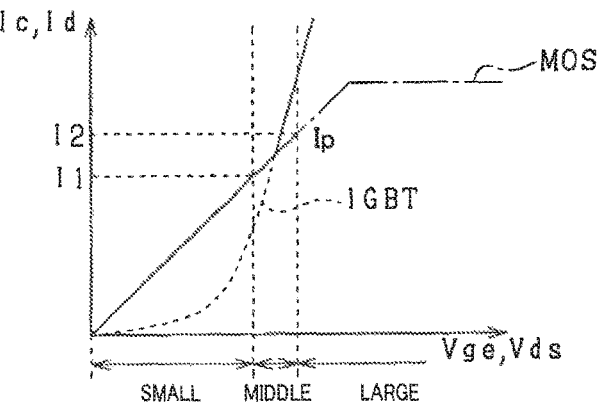
FIG. 12 is a graph schematically illustrating a low current range, a medium current range, and a high current range for each of a collector current and a drain current according to the fourth embodiment.

FIG. 12 schematically illustrates the low current range, the medium current range, and high current range.

The low current range is defined to be lower than a first predetermined current I1. The first predetermined current I1 is defined to be equal to or higher than zero and lower than a current value Ip at which the volt-current characteristics of the IGBT and the volt-ampere characteristics of the MOSFET intersect with each other.

The medium current range is defined to be equal to or higher than the first predetermined current I1 and lower than a second predetermined current I2; the second predetermined current I2 is defined to be higher than the current value Ip.

The high current range is defined to be equal to or higher than the second predetermined current I2.

The medium current range set between the low and high current ranges aims to reduce an increase of conduction loss of the U-phase upper-arm switch module 20UH.

That is, for most contribution to reduction of switching loss and conduction loss, it is preferable to select (1) The second U-phase upper-arm switching element SUHB when the measured current, i.e. the corrector current Ic or the drain current Id, is located within a first current range lower than the current value Ip (2) The first U-phase upper-arm switching element SUHA when the measured current, i.e. the corrector current Ic or the drain current Id, is located within a second current range higher than the current value Ip.

However, this method may result in the second U-phase upper-arm switching element SUHB being erroneously selected as the drive target when the measured current is located within the second current range in which the first U-phase upper-arm switching element SUHA should be selected.

In addition, this method may result in the first U-phase upper-arm switching element SUHA being erroneously selected as the drive target when the measured current is located within the first current range in which the second U-phase upper-arm switching element SUHB should be selected.

These cases may increase switching loss and/or conduction loss of the U-phase upper-arm switch module 20UH.

In order to address such a problem, the fourth embodiment establishes the medium current range in which both the first and second U-phase upper-arm switching elements SUHA and SUHB are selected.

The drive controller 80A of the fourth embodiment also includes a first resistance setting unit T2 that variably sets the resistance value of each of the first and second gate resistor members 61a and 71a in accordance with the determined results by the switching-element selecting unit T1.

Specifically, as illustrated in FIG. 11A, the drive controller 80A sets the resistance value of the second gate resistor member 71a to the first on-resistance value Ron1 upon determining that the measured current is located within the low current range. In addition, the drive controller 80A sets the resistance value of the second gate resistor member 71a to the second on-resistance value Ron2, which is smaller than the first on-resistance value Ron1, upon determining that the measured current is located within the medium current range.

Setting the first on-resistance value Ron1 to be larger than the second on-resistance value Ron2 aims to reduce the occurrence of a large surge voltage. That is, when the measured current is located within the low current range, the second U-phase upper-arm switching element SUHB is only selected as the drive target. For this reason, a surge may occur when the second U-phase upper-arm switching element SUHB is turned on. From this viewpoint, setting the first on-resistance value Ron1 to be larger than the second on-resistance value Ron2 enables the magnitude of such a surge to be reduced.

In addition, the drive controller 80A sets the resistance value of the first gate resistor member 61a to the third on-resistance value Ron3, which is larger than the second on-resistance value Ron2, upon determining that the measured current is located within the medium current range. Setting the third on-resistance value Ron3 to be larger than the second on-resistance value Ron2 aims to prevent a large surge from occurring when the first U-phase upper-arm switching element SUHA is turned on.

The drive controller 80A also sets the resistance value of the first gate resistor member 61a to the fourth on-resistance value Ron4, which is larger than the third on-resistance value Ron3, upon determining that the measured current is located within the high current range. Setting the fourth on-resistance value Ron4 to be larger than the third on-resistance value Ron3 aims to reduce the occurrence of a large surge when the measured current is located within the high current range. That is, a larger surge may occur when the measured current is located within the high current range due to turn-on of the first U-phase upper-arm switching element SUHA as compared with when the measured current is located within the medium current range. For this reason, setting the fourth on-resistance value Ron4 to be larger than the third on-resistance value Ron3 enables the magnitude of such a surge occurring due to turn-on of the first U-phase upper-arm switching element SUHA to be reduced.

Next, the following describes the discharging task carried out by the drive controller 80A according to the fourth embodiment with reference to FIG. 11B.

Similar to the charging task, the target switching-element selecting unit T1 selects, during the discharging task, at least one of the first and second U-phase upper-arm switching elements SUHA and SUHB as its drive target in accordance with which of the low, medium, and high current ranges the measured current is located within.

The drive controller 80A of the fourth embodiment further includes a second resistance setting unit T3 that variably sets the resistance value of each of the first and second gate resistor members 61a and 71a in accordance with the determined results by the switching-element selecting unit T1.

Specifically, as illustrated in FIG. 11B, the drive controller 80A sets the resistance value of the second gate resistor member 71a to the first off-resistance value Roff1 upon determining that the measured current is located within the low current range. In addition, the drive controller 80A sets the resistance value of the second gate resistor member 71a to the second off-resistance value Roff2, which is smaller than the first off-resistance value Roff1, upon determining that the measured current is located within the medium current range.

Setting the first off-resistance value Roff1 to be larger than the second off-resistance value Ron1 aims to reduce the occurrence of a large surge voltage.

In addition, the drive controller 80A sets the resistance value of the first gate resistor member 61a to the third off-resistance value Roff3, which is larger than the second off-resistance value Roff2, upon determining that the measured current is located within the medium current range. Setting the third off-resistance value Roff3 to be larger than the second off-resistance value Roff2 aims to prevent a large surge from occurring when the first U-phase upper-arm switching element SUHA is turned off.

The drive controller 80A also sets the resistance value of the first gate resistor member 61a to the fourth off-resistance value Roff4, which is larger than the third off-resistance value Roff3, upon determining that the measured current is located within the high current range. Setting the fourth off-resistance value Roff4 to be larger than the third off-resistance value Roff3 aims to reduce the occurrence of a large surge when the measured current is located within the high current range.

Note that the fourth embodiment is configured to variably set each of the first and second gate resistor members 61a and 71a to (1) One of the first to fourth on-resistance values Ron1 to Ron4 during execution of the charging task (2) One of the first to fourth off-resistance values Roff1 to Roff4 during execution of the discharging task.

The fourth embodiment can be however modified to variably set each of the first and second gate resistor members 61a and 71a to one of a lower resistance value and a higher resistance value.

Figure 13A:
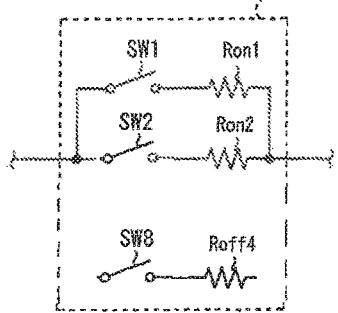
FIG. 13A is a diagram schematically illustrating an example of the structure of each of first and second gate resistors according to the fourth embodiment.

FIG. 13A schematically illustrates an example of the structure of each of the first and second gate resistors 61a and 71a for variably setting the corresponding one of the first and second gate resistor members 61a and 71a to one of the resistance values Ron1, Ron2, Ron3, Ron4, Roff1, Roff2, Roff3, and Roff4.

Referring to FIG. 13A, each of the first and second gate resistor members 61a and 71a includes a first resistor having the first on-resistance value Ron1, a second resistor having the second on-resistance value Ron2, a third resistor having the third on-resistance value Ron3, and a fourth resistor having the fourth on-resistance value Ron4. Each of the first and second gate resistor members 61a and 71a also includes a fifth resistor having the first off-resistance value Roff1, a sixth resistor having the second off-resistance value Roff2, a seventh resistor having the third off-resistance value Roff3, and an eighth resistor having the fourth off-resistance value Roff4. The first, second, and eighth resistors are illustrated by reference characters Ron1, Ron2, and Roff4 in FIG. 13A.

Each of the first and second gate resistor members 61a and 71a also includes eight switches SW1 to SW8 each connected in series to the corresponding one of the first to eighth resistors, thus constituting eight series circuit elements. The eight series circuit elements are connected in parallel to each other. The drive controller 80A is connected to the eight switches SW1 to SW8 to able to control the switches SW1 to SW8.

That is, the drive controller 80A turns on one of the switches SW1 to SW8 to thereby enable each of the first and second gate resistor members 61a and 71a to have a corresponding one of the resistance values Ron1, Ron2, Ron3, Ron4, Roff1, Roff2, Roff3, and Roff4.

For example, the drive controller 80A turns on the first switch SW1 while maintaining the remaining switches SW2 to SW8 off, thus causing each of the first and second gate resistor members 61a and 71a to have the first on-resistance value Ron1. Similarly, the drive controller 80A turns on the sixth switch SW6 while maintaining the remaining switches SW1 to SW5, SW7, and SW8 off, thus causing each of the first and second gate resistor members 61a and 71a to have the third off-resistance value Roff3.

Figure 13B:
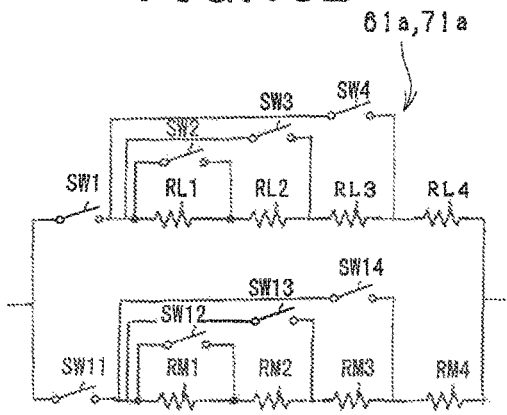
FIG. 13B is a diagram schematically illustrating another example of the structure of each of first and second gate resistors according to the fourth embodiment.
Figure 14:
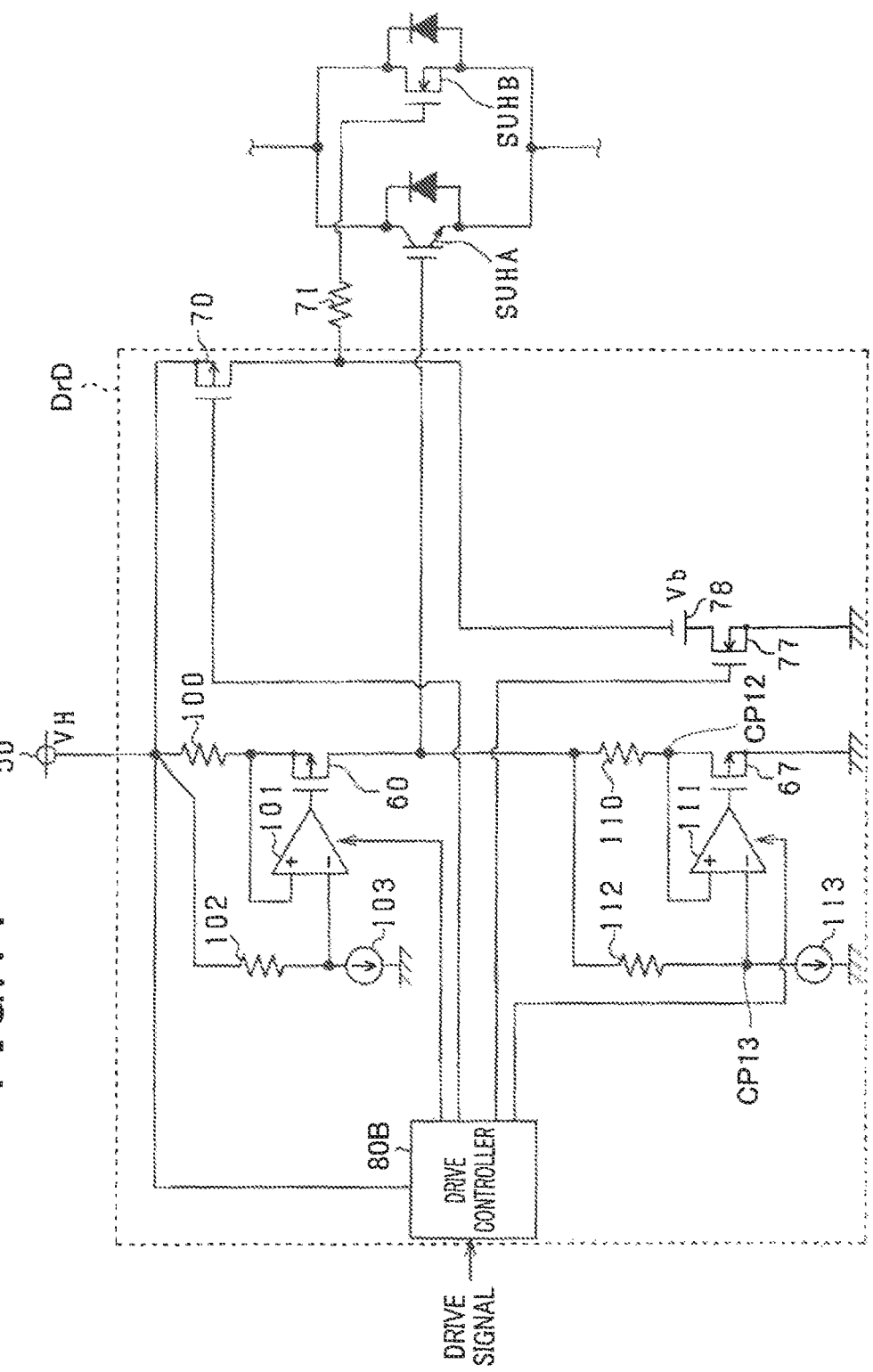
FIG. 14 is a circuit diagram schematically illustrating an example of the structure of a drive circuit for the U-phase upper-arm switch module according to the fifth embodiment of the present disclosure.

FIG. 13B schematically illustrates another example of the structure of each of the first and second gate resistors 61a and 71a for variably setting the corresponding one of the first and second gate resistor members 61a and 71a to one of the resistance values Ron1, Ron2, Ron3, Ron4, Roff1, Roff2, Roff3, and Roff4.

Referring to FIG. 13B, each of the first and second resistor members 61a and 71a includes a first set of four resistors RL1, RL2, RL3, and RL4 connected in series to each other, and a second set of four resistors RM1, RM2, RM3, and RM4 connected in series to each other.

In addition, each of the first and second gate resistor members 61a and 71a includes switches SW1 to SW4. The switch SW1 is connected in series to the series-connected resistors RL1 to RL4, the switch SW2 is connected in parallel to the resistor RL1, and the switch SW3 is connected in parallel to the series-connected resistors RL1 and RL2. The switch SW4 is connected in parallel to the series-connected resistors RL1 to RL3. The resistor RL4 has the first on-resistance value Ron1, the sum of the resistance values of the resistors RL3 and RL4 is set to the second on-resistance value Ron2, and the sum of the resistance values of the resistors RL2, RL3 and RL4 is set to the third on-resistance value Ron3. In addition, the sum of the resistance values of the resistors RL1, RL2, RL3 and RL4 is set to the fourth on-resistance value Ron4.

Similarly, each of the first and second gate resistor members 61a and 71a includes switches SW11 to SW14. The switch SW11 is connected in series to the series-connected resistors RM1 to RM4, the switch SW12 is connected in parallel to the resistor RM1, and the switch SW13 is connected in parallel to the series-connected resistors RM1 and RM2. The switch SW14 is connected in parallel to the series-connected resistors RM1 to RM3. The resistor RM4 has the first off-resistance value Roff1, the sum of the resistance values of the resistors RM3 and RM4 is set to the second off-resistance value Roff2, and the sum of the resistance values of the resistors RM2, RM3 and RM4 is set to the third off-resistance value Roff3. In addition, the sum of the resistance values of the resistors RM1, RM2, RM3 and RM4 is set to the fourth off-resistance value Roff4.

The drive controller 80A is controllably connected to the switches SW1 to SW4 and SW11 to SW14.

That is, the drive controller 80A turns on the switches SW1 and SW4 while maintaining the switches SW2 and SW3 and at least the switch SW11. This enables each of the first and second gate resistor members 61a and 71a to have the first on-resistance value Ron1. Similarly, the drive controller 80A turns on the switches SW1 and SW3 while maintaining the switches SW2 and SW4 and at least the switch SW11 in the off state. This enables each of the first and second gate resistor members 61a and 71a to have the second on-resistance value Ron2. In addition, the drive controller 80A turns on the switches SW1 and SW2 while maintaining the switches SW3 and SW4 and at least the switch SW11 in the off state. This enables each of the first and second gate resistor members 61a and 71a to have the third on-resistance value Ron3. The drive controller 80A also turns on the switch SW1 while maintaining the switches SW2 to SW4 and at least the switch SW11 in the off state. This enables each of the first and second gate resistor members 61a and 71a to have the fourth on-resistance value Ron4.

Similarly, the drive controller 80A turns on the switches SW11 and SW14 while maintaining the switches SW12 and SW13 and at least the switch SW1. This enables each of the first and second gate resistor members 61a and 71a to have the first off-resistance value Roff1. Similarly, the drive controller 80A turns on the switches SW11 and SW13 while maintaining the switches SW12 and SW14 and at least the switch SW1 in the off state. This enables each of the first and second gate resistor members 61a and 71a to have the second off-resistance value Roff2. In addition, the drive controller 80A turns on the switches SW11 and SW12 while maintaining the switches SW13 and SW14 and at least the switch SW1 in the off state. This enables each of the first and second gate resistor members 61a and 71a to have the third off-resistance value Roff3. The drive controller 80A also turns on the switch SW11 while maintaining the switches SW12 to SW14 and at least the switch SW1 in the off state.

This enables each of the first and second gate resistor members 61a and 71a to have the fourth off-resistance value Roff4.

The drive circuit DrC therefore achieves the same advantageous effects as those achieved by the first embodiment.

Fifth Embodiment

The following describes drive circuits DrD according to the fifth embodiment of the present disclosure with reference to FIGS. 14 to 16B. Similar to the first embodiment, the following describes the structure of the drive circuit DrD for the U-phase upper-arm switch module 20UH as a typical example.

The structures and/or functions of the drive circuit DrD according to the fifth embodiment are different from those of the drive circuit Dr according to the first embodiment by the following points. So, the following mainly describes the different points, and omits or simplifies descriptions of like parts between the first and fifth embodiments, to which identical or like reference characters are assigned, thus eliminating redundant description.

In the drive circuit DrD, the components 62, 63 to 65, 66a, 66b, 72, 73 to 75, 76a, and 76b are eliminated as compared with the structure of the drive circuit Dr.

Specifically, similar to the first embodiment, the drive circuit DrD includes the first charging switching element 60, the second charging switching element 70, the first discharging switching element 67, the second discharging switching element 77, and the bias power source 78. In addition, the drive circuit DrD includes a charging operational amplifier 101, a first adjustment resistor 102, a first constant current source 103, a discharging resistor 110, a discharging operational amplifier 111, a second adjustment resistor 112, and a second constant current source 113.

The input terminal, i.e. the source, of the first charging switching element 60 is connected to a first end of the charging resistor 100, and a second end of the charging resistor 100, which is opposite to the first end, is connected to the constant voltage source 50. The connection point CP10 between the charging resistor 100 and the first charging switching element 60 is connected to the non-inverting input terminal of the charging operational amplifier 101.

The first adjustment resistor 102 has opposing first and second ends. The first end of the first adjustment resistor 102 is connected to a first end of the first constant current source 103, so that the first adjustment resistor 102 is connected in series to the first constant current source 103. The second end of the first adjustment resistor 102 is connected to the connection point between the charging resistor 100 and the constant voltage source 50. A second end of the first constant current source 103, which is opposite to the first end, is connected to the emitter of the first U-phase upper-arm switching element SUHA via the common signal ground. The connection point CP11 between the first adjustment resistor 102 and the first constant current source 103 is connected to the inverting input terminal of the charging operational amplifier 101. The output terminal of the charging operational amplifier 101 is connected to the on-off control terminal, i.e. the gate, of the first charging switching element 60. The output terminal, i.e. drain, of the first charging switching element 60 is connected to the gate of the first U-phase upper-arm switching element SUHA.

The input terminal, i.e. the source, of the second charging switching element 70 is connected to the constant voltage source 50, and the output terminal, i.e. the drain, of the second charging switching element 70 is connected to the first end of the second gate resistor member 71. The second end of the second gate resistor member 71 is connected to the gate of the second U-phase upper-arm switching element SUHB. The on-off control terminal, i.e. the gate, of the second charging switching element 70 is connected to a drive controller 80B.

The output terminal of the first charging switching element 60 is also connected to a first end of the discharging resistor 110, and a second end of the discharging resistor 110, which is opposite to the first end, is connected to the input terminal, i.e. the drain, of the first discharging switching element 67. The connection point CP12 between the discharging resistor 110 and the first discharging switching element 67 is connected to the non-inverting input terminal of the discharging operational amplifier 111.

The second adjustment resistor 112 has opposing first and second ends. The first end of the second adjustment resistor 112 is connected to a first end of the second constant current source 113, so that the second adjustment resistor 112 is connected in series to the second constant current source 113. The second end of the second adjustment resistor 112 is connected to the connection point between the discharging resistor 110 and the first charging switching element 60. A second end of the second constant current source 113, which is opposite to the first end, is connected to the source of the second U-phase upper-arm switching element SUHB via the common signal ground. The connection point CP13 between the second adjustment resistor 112 and the second constant current source 113 is connected to the inverting input terminal of the discharging operational amplifier 111. The output terminal of the discharging operational amplifier 111 is connected to the on-off control terminal, i.e. the gate, of the first discharging switching element 67. The output terminal, i.e. drain, of the first discharging switching element 67 is connected to the source of the second U-phase upper-arm switching element SUHB via the common signal ground. The on-off control terminal, i.e. the gate, of the second discharging switching element 77 is connected to the drive controller 80B.

Each of the charging and discharging operational amplifiers 101 and 111 has an enable terminal to which the drive controller 80B. That is, the drive controller 80B is capable of sending an enable signal to the enable terminal of each of the charging and discharging operational amplifiers 101 and 111, thus activating the corresponding one of the charging and discharging operational amplifiers 101 and 111. In other words, each of the charging and discharging operational amplifiers 101 and 111 is deactivated unless the enable signal is input to the corresponding enable terminal.

Next, the following describes the charging task carried out by the drive controller 80B with reference to FIGS. 15A and 15B. FIG. 15A schematically illustrates how the gate-source voltage, i.e. the gate voltage, Vge changes over time during each of the charging and discharging tasks where reference character VH represents the upper limit of the gate-emitter voltage Vge. FIG. 15B schematically illustrates how a gate current Ig changes over time during each of the charging and discharging tasks.

Upon determining that the drive signal is changed from the off command to the on command, the drive controller 80B outputs the enable signal to the charging operational amplifier 101 to thereby activate the charging operational amplifier 101. Note that, upon determining that the drive signal is changed from the off command to the on command, the drive controller 80B stops the output of the enable signal to the discharging amplifier 111, and maintains the second discharging switching element 77 in the off state.

The charging operational amplifier 101 is configured such that the two inputs are virtually short-circuited via the charging switching element 60 while the charging operational amplifier 101 is operating for a period during which the enable signal is input to the enable terminal of the charging operational amplifier 101. For this reason, the charging operational amplifier 101 is configured to drive the charging switching element 60, such that the potential at the connection point CP10 between the charging resistor 100 and the first charging switching element 60 is maintained at the potential at the connection point CP11 between the first adjustment resistor 102 and the first constant current source 103.

At that time, the first constant current source 103 enables the potential at the connection point CP11 between the first adjustment resistor 102 and the first constant current source 103 to be a constant potential. This makes it possible to perform constant current control that supplies a constant charging current, i.e. the gate current Ig, to the gate of the first U-phase upper-arm switching element SUHA (see FIG. 15B), thus charging the gate of the first U-phase upper-arm switching element SUHA.

Thereafter, the drive controller 80B changes the second charging switching element 70 from the off state to the on state, and performs constant voltage control to charge the gate of the second U-phase upper-arm switching element SUHB using a predetermined constant voltage.

As described above, the drive circuit DrD is configured to (1) Charge the gate of the first U-phase upper-arm switching element SUHA, which is required to be turned on earlier than the second U-phase upper-arm switching element SUHB, using the constant current control (2) Charge the gate of the second U-phase upper-arm switching element SUHB, which is required to be turned on later than the first U-phase upper-arm switching element SUHA, using the constant voltage control.

This aims to reduce switching loss of the U-phase upper-arm switch module 20UH during the charging task.

Specifically, applying the constant current control to the charging of the gate of the first U-phase upper-arm switching element SUHA, which is required to be turned on earlier than the second U-phase upper-arm switching element SUHB, results in lower switching loss of the first U-phase upper-arm switching element SUHA. In addition, applying the constant voltage control to the charging of the gate of the second U-phase upper-arm switching element SUHB, which is required to be turned on later than the first U-phase upper-arm switching element SUHA, enables the charging rate of the gate of the second U-phase upper-arm switching element SUHB to be faster. This reduces the turn-on time of the e second U-phase upper-arm switching element SUHB, resulting in lower switching loss of the second U-phase upper-arm switching element SUHA.

Additionally, the following describes the discharging task carried out by the drive controller 80B with reference to FIGS. 15A and 15B.

Upon determining that the drive signal is changed from the on command to the off command, the drive controller 80B changes the second discharging switching element 77 from the off state to the on state. This enables the gate of the second U-phase upper-arm switching element SUHB to be discharged based on constant voltage control. Note that, upon determining that the drive signal is changed from the on command to the off command, the drive controller 80B stops the output of the enable signal to the charging amplifier 101, and maintains the second charging switching element 70 in the off state.

Thereafter, the drive controller 80B outputs the enable signal to the discharging operational amplifier 111 to thereby activate the discharging operational amplifier 111. The discharging operational amplifier 111 is configured such that the two inputs are virtually short-circuited via the discharging switching element 67 while the discharging operational amplifier 111 is operating for a period during which the enable signal is input to the enable terminal of the discharging operational amplifier 111. For this reason, the discharging operational amplifier 111 is configured to drive the discharging switching element 67, such that the potential at the connection point CP11 between the discharging resistor 110 and the first discharging switching element 67 is maintained at the potential at the connection point CP13 between the second adjustment resistor 112 and the second constant current source 113.

At that time, the second constant current source 113 enables the potential at the connection point CP13 between the second adjustment resistor 112 and the second constant current source 113 to be a constant potential. This makes it possible to perform constant current control that enables a constant charging current, i.e. the gate current Ig, to be discharged from the gate of the first U-phase upper-arm switching element SUHA (see FIG. 15B), thus discharging the gate of the first U-phase upper-arm switching element SUHA.

As described above, the drive circuit DrD is configured to (1) Discharge the gate of the second U-phase upper-arm switching element SUHB, which is required to be turned off earlier than the first U-phase upper-arm switching element SUHA, using the constant voltage control (2) Discharge the gate of the first U-phase upper-arm switching element SUHA, which is required to be turned off later than the second U-phase upper-arm switching element SUHB, using the constant current control.

This enables switching loss of the U-phase upper-arm switch module 20UH to be reduced during the discharging task.

In contrast, FIG. 16A schematically illustrates how the gate-source voltage Vge changes over time during each of the charging and discharging tasks in a comparative example where the charging of the first U-phase upper-arm switching element SUHA is carried out based on the constant voltage control. FIG. 16B schematically illustrates how the gate current Ig changes over time during each of the charging and discharging tasks in the comparative example where the discharging of the first U-phase upper-arm switching element SUHA is carried out based on the constant voltage control.

FIG. 16A clearly illustrates that a surge may occur due to steep rising of the gate current Ig at the start of the charging task, and FIG. 16B also clearly illustrates that a surge may occur due to steep falling of the gate current Ig at the start of the discharging task.

In contrast, as illustrated in FIGS. 15A and 15B, the charging and discharging of the first U-phase upper-arm switching element SUHA based on the constant current control results in lower switching loss of each of the switch modules 20UH to 20WL.

The drive circuit DrD therefore achieves, as a specific advantageous effect, further lower switching loss of the inverter 20 and a smaller size in addition to the same advantageous effects as those achieved by the first embodiment.

Sixth Embodiment

Figure 17:
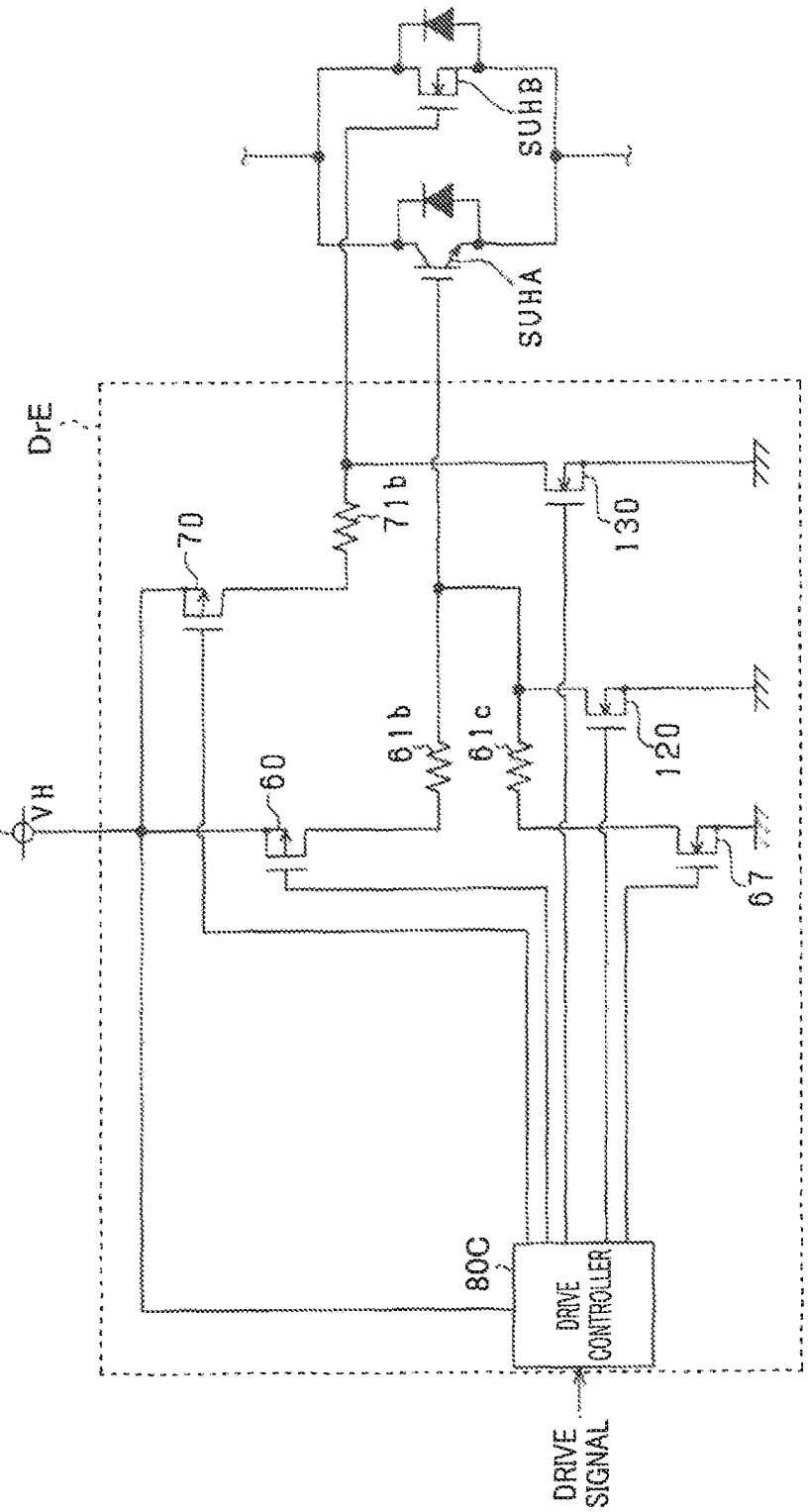
FIG. 17 is a circuit diagram schematically illustrating an example of the structure of a drive circuit for the U-phase upper-arm switch module according to the sixth embodiment of the present disclosure.

The following describes drive circuits DrE according to the sixth embodiment of the present disclosure with reference to FIGS. 17 to 18B. Similar to the first embodiment, the following describes the structure of the drive circuit DrE for the U-phase upper-arm switch module 20UH as a typical example.

The structures and/or functions of the drive circuit DrE according to the sixth embodiment are different from those of the drive circuit Dr according to the first embodiment by the following points. So, the following mainly describes the different points, and omits or simplifies descriptions of like parts between the first and sixth embodiments, to which identical or like reference characters are assigned, thus eliminating redundant description.

In the drive circuit DrE, the components 62, 63 to 65, 66a, 66b, 72, 73 to 75, 76a, 76b, 77, and 78 are eliminated as compared with the structure of the drive circuit Dr.

Specifically, similar to the first embodiment, the drive circuit DrE includes the first charging switching element 60, the second charging switching element 70, and the first discharging switching element 67. In addition, the drive circuit DrE includes a first charging resistor 61b, a discharging resistor 61c, a second charging resistor 71b, a first off-hold switching element 120, and a discharging switching element 130, which also serves as a second off-hold switching element 130. The sixth embodiment uses an N-channel MOSFET as each of the first and second off-hold switching elements 120 and 130.

The input terminal, i.e. the source, of the first charging switching element 60 is connected to the constant voltage source 50, and the output terminal, i.e. the drain, of the first charging switching element 60 is connected to a first end of the first charging resistor 61b. A second end of the first charging resistor 61b, which is opposite to the first end, is connected to the gate of the first U-phase upper-arm switching element SUHA.

The discharging resistor 61c has opposing first and second ends; the first end is connected to the gate of the first U-phase upper-arm switching element SUHA, and the second end is connected to the input terminal, i.e. drain, of the first discharging switching element 67. The source of the first discharging switching element 67 is connected to the emitter of the first U-phase upper-arm switching element SUHA via the common signal ground.

The gate of the first U-phase upper-arm switching element SUHA is also connected to the input terminal, i.e. the drain, of the first off-hold switching element 120, and the source of the first off-hold switching element 120 is connected to the emitter of the first U-phase upper-arm switching element SUHA via the common signal ground. That is, the first off-hold switching element 120 serves as a pull down switch that connects the gate of the first U-phase upper-arm switching element SUHA to the emitter of the first U-phase upper-arm switching element SUHA therethrough.

The second charging resistor 71b has opposing first and second ends. The first end of the second charging resistor 71b is connected to the output terminal, i.e. the drain, of the second charging switching element 70, so that the second charging resistor 71b is connected to the constant power source 50 via the second charging switching element 70. The second end of the second charging resistor 71b is connected to the gate of the second U-phase upper-arm switching element SUHB.

The gate of the second U-phase upper-arm switching element SUHB is also connected to the input terminal, i.e. the drain, of the second off-hold switching element 130, and the source of the second off-hold switching element 130 is connected to the source of the second U-phase upper-arm switching element SUHB via the common signal ground.

That is, the second off-hold switching element 130 serves as a pull down switch that connects the gate of the second U-phase upper-arm switching element SUHB to the source of the second U-phase upper-arm switching element SUHB therethrough.

The on-off control terminals, i.e. the gates, of the first and second off-hold switching elements 120 and 130 are connected to a drive controller 80C.

Specifically, upon determining that the drive signal has changed from the off command to the on command, the drive controller 80C changes the first charging switching element 60 from the off state to the on state. Thereafter, the drive controller 80C changes the second charging switching element 70 from the off state to the on state. Note that, upon determining that the drive signal is changed from the off command to the on command, the drive controller 80C maintains the first discharging switching element 67, the first off-hold switching element 120, and the second off-hold switching element 130 in the off state.

Upon determining that the drive signal is changed from the on command to the off command, the drive controller 80C changes the second off-hold switching element 130 from the off state to the on state first. Thereafter, the drive controller 80C changes the first discharging switching element 67 from the off state to the on state next. Note that, upon determining that the drive signal is changed from the on command to the off command, the drive controller 80C maintains the first and second charging switching elements 60 and 70 in the off state.

In addition, the drive controller 80C is configured to monitor the gate voltage of at least the first U-phase upper-arm switching element SUHA. That is, the drive controller 80C is configured to perform an off-hold task of the first U-phase upper-arm switching element SUHA based on the drive signal and the monitored gate voltage of the first U-phase upper-arm switching element SUHA.

Specifically, the drive controller 80C determines whether the drive signal represents the off command and the monitored gate voltage of the first U-phase upper-arm switching element SUHA is equal to or lower than a predetermined off-hold voltage; the off-hold voltage is set to be equal to or lower than the first threshold Vth1 of the first U-phase upper-arm switching element SUHA.

Upon determining that the drive signal represents the off command and the monitored gate voltage of the first U-phase upper-arm switching element SUHA is equal to or lower than the off-hold voltage, the drive controller 80C changes the first off-hold switching element 120 from the off state to the on state. Otherwise, upon determining that the drive signal does not represent the off command and/or the monitored gate voltage of the first U-phase upper-arm switching element SUHA is higher than the off-hold voltage, the drive controller 80C maintains the first off-hold switching element 120 in the off state.

The off-hold task aims to prevent, if switching noise, which is generated by turn-on of the first U-phase lower-arm switching element SULA, is transferred to the gate of the first U-phase upper-arm switching element SUHA, the first U-phase lower-arm switching element SULA from being erroneously turned on (see FIGS. 18A and 18B). Note that reference characters t21 and t22 represents a period during which turn-off drive of the upper-arm switching element SUHA is carried out.

The drive circuit DrE according to the sixth embodiment includes, as a discharge path for discharging the gate of the second U-phase upper-arm switching element SUHB, only an off-hold path from the gate of the second U-phase upper-arm switching element SUHB to the source of the second U-phase upper-arm switching element SUHB via the second off-hold switching element 130. In other words, the second off-hold switching element 130 serves as a discharging switching element for discharging the gate of the second U-phase upper-arm switching element SUHB therethrough. No resistors are provide in the off-hold path, resulting in the higher discharging rate of the gate of the second U-phase upper-arm switching element SUHB while preventing a large surge from occurring. This is because turn-off drive of the second U-phase upper-arm switching element SUHB is carried out before turn-off drive of the first U-phase upper-arm switching element SUHA.

The drive circuit DrE is configured to use the off-hold path as the discharge path for discharging the gate of the second U-phase upper-arm switching element SUHB. This configuration eliminates the need to provide an off-hold circuit in addition to the discharge path, resulting in downsizing of the drive circuit DrE.

The drive circuit DrE is also configured such that the constant voltage source 50 serves as a common power source for charging both the gate of the first U-phase upper-arm switching element SUHA and the gate of the second U-phase upper-arm switching element SUHB based on the common constant voltage VH. In other words, the drive circuit DrE is configured to charge or discharge each of the first and second U-phase upper-arm switching elements SUHA and SUHB using the constant voltage control.

This results in further downsizing of the drive circuit DrE.

As described above, the first threshold voltage Vth1, such as 20 V, of the first U-phase upper-arm switching element SUHA is set to be higher than the second threshold voltage Vth2, such as 15 V, of the second U-phase upper-arm switching element SUHB. This enables the output voltage VH of the constant voltage source 50 to be set to be lower than the first threshold voltage Vth1 and higher than the second threshold voltage Vth2. This enables the common constant voltage source 50 to turn on both the first and second U-phase upper-arm switching elements SUHA and SUHB even if the switching characteristics of their switching elements SUHA and SUHB differ from each other.

That is, the drive circuit DrE therefore achieves, as a specific advantageous effect, higher reliability of erroneous turn-on of the upper-arm switching element SUHA and a smaller size in addition to the same advantageous effects as those achieved by the first embodiment.

Seventh Embodiment

The following describes drive circuits DrF according to the seventh embodiment of the present disclosure with reference to FIGS. 19 to 23. Similar to the first embodiment, the following describes the structure of the drive circuit DrF for the U-phase upper-arm switch module 20UH as a typical example.

The structures and/or functions of the drive circuit DrF according to the seventh embodiment are different from those of the drive circuit Dr according to the first embodiment by the following points. So, the following mainly describes the different points, and omits or simplifies descriptions of like parts between the first and seventh embodiments, to which identical or like reference characters are assigned, thus eliminating redundant description.

The drive circuit DrF is configured to determine whether there is an electrical fault therein based on a divided voltage between the gate-emitter voltage, i.e. the gate voltage, of the first U-phase upper-arm switching element SUHA and the gate-source voltage, i.e. the gate voltage, of the second U-phase upper-arm switching element SUHB.

Figure 19:
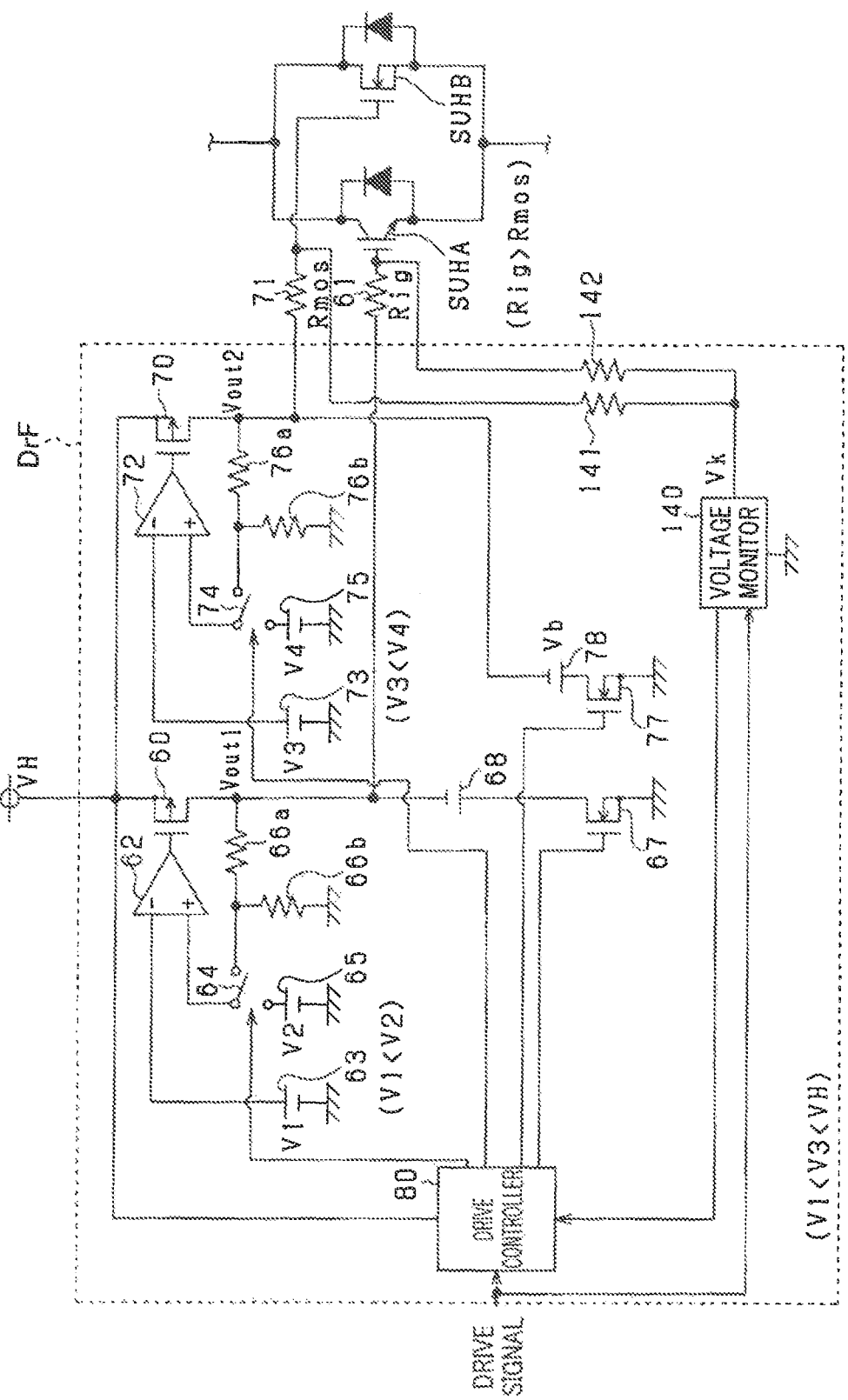
FIG. 19 is a circuit diagram schematically illustrating an example of the structure of a drive circuit for the U-phase upper-arm switch module according to the seventh embodiment of the present disclosure.

Referring to FIG. 19, the drive circuit DrF includes a first divider resistor 141 and a second divider resistor 142. Each of the first and second divider resistors 141 and 142 has opposing first and second ends. The first end of the first voltage divider 141 is connected to the second end of the second gate resistor member 71, and the second end of the first voltage divider 141 is connected to the first end of the second divider resistor 142. The second end of the second divider resistor 142 is connected to the second end of the first gate resistor member 61. That is, the second end of the second gate resistor member 71 is connected to the second end of the first gate resistor member 61 via the series connection of the first and second divider resistors 141 and 142. The first and second divider resistors 141 and 142 have the same resistance value.

The drive circuit DrF also includes a fault determiner 140, which can be designed as, for example, a computer processor, i.e. a programmed-logic circuit or as a hardware logic circuit or the combination of hardwired-logic and programmed-logic hybrid circuits. A single computer processor can serve as both the drive controller 80 and the fault determiner 140 as its functional modules.

The fault determiner 140 is connected to the connection point between the first and second divider resistors 141 and 142, and connected to the drive controller 80. The drive signal is configured to be input to the fault determiner 140. The fault determiner 140 is configured to monitor, as a monitored potential Vk, the potential at the connection point between the first and second divider resistors 141 and 142 relative to the emitter and source potentials of the respective first and second U-phase upper-arm switching element SUHA and SUHB.

The drive circuit DrF further includes a power source 68 having positive and negative terminals. The negative terminal of the power source 68 is connected to the gate of the first U-phase upper-arm switching element SUHA via the first gate resistor member 61, and the positive terminal of the power source 68 is connected to the input terminal, i.e. the drain, of the first discharging switching element 67. The bias power source 78 is configured to output a negative voltage Vb (−4 V) to the gate of the second U-phase upper-arm switching element SUHB. The power source 68 is configured to output a negative voltage to the gate of the first gate resistor member 61. The absolute magnitude of the negative voltage of the power source 68 is set to 2 V different from the absolute magnitude of the negative voltage of the bias power source 78.

That is, the gate of the first U-phase upper-arm switching element SUHA is discharged to have the negative potential of −2 V, which is called a first discharge target voltage, relative to the common signal ground, and the gate of the second U-phase upper-arm switching element SUHB is discharged to have the negative potential of −4 V, which is called a second discharge target voltage, relative to the common signal ground.

The following describes an electrical fault determination task carried out by the fault determiner 140 with reference to FIGS. 20 to 23.

Figures 20, 21:
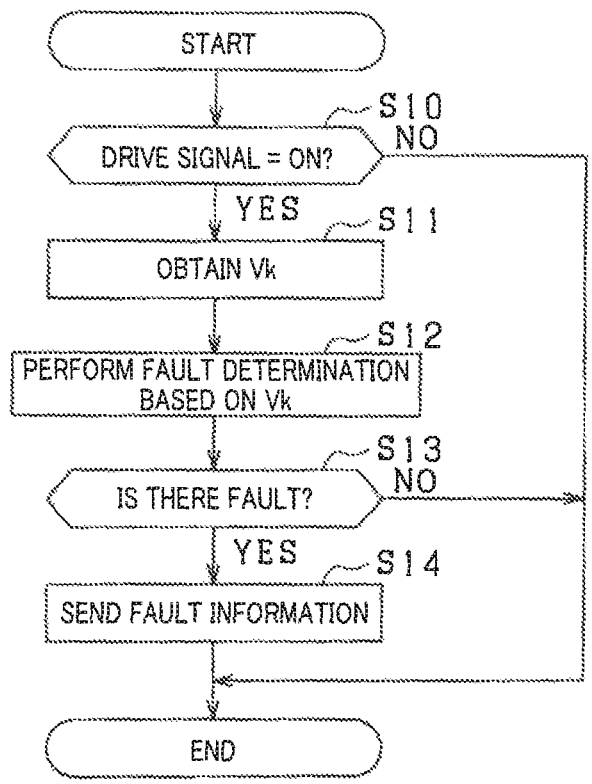
FIG. 20 is a flowchart schematically illustrating an example of an electrical fault determination task while a drive signal represents an on command according to the seventh embodiment.
FIG. 21 is a table schematically illustrating an example of a relationship between monitored voltages and corresponding types of electrical faults in each of an IGBT and a MOSFET according to the seventh embodiment during the charging task.

FIG. 20 illustrates an example of instructions of the electrical fault determination task periodically carried out by the fault determiner 140 while the drive signal represents the on command.

In step S10, the fault determiner 140 determines whether the drive signal represents the on command and a first predetermined time has elapsed since the drive signal was changed to the present on command. The first predetermined time is determined to an assumed time required for the gate voltages of the first and second U-phase upper-arm switching elements SUHA and SUHB to reach the respective first and second feedback voltages Vout1 and Vout2 relative to the timing when the drive signal was changed to the present on command.

Upon determining that the drive signal does not represent the on command or the first predetermined time has not elapsed since the drive signal was changed to the present on command (NO in step S10), the fault determiner 140 terminates the electrical fault determination task. Otherwise, upon determining that the drive signal represents the on command and the first predetermined time has elapsed since the drive signal was changed to the present on command (YES in step S10), the fault determiner 140 obtains the monitored voltage Vk in step S11.

Next, the fault determiner 140 determines, based on the monitored voltage Vk, whether there is an electrical fault in the drive circuit DrF. When determining that there is an electrical fault in the drive circuit DrF, the fault determiner 140 determines, based on the monitored voltage Vk, the type, i.e. mode, of the electrical fault in steps S12 and S13.

Specifically, referring to FIG. 21, the fault determiner 140 determines that there are no electrical faults in each of a first on current path and a second on current path when the monitored voltage Vk is 17.5 V in steps S12 and S13. The first on current path is defined as a path from the constant voltage source 50 to the gate of the first U-phase upper-arm switching element SUHA, and the second on current path is defined as a path from the constant voltage source 50 to the gate of the second U-phase upper-arm switching element SUHB. This is based on the fact:

It is assumed that there are no open faults and short-circuit faults in each of the first and second on current paths. In this assumption, dividing the sum of 15 V of the first feedback voltage Vout1 and 20 V of the second feedback voltage Vout2 based on the same resistance values of the first and second divider resistors 141 and 142 enables a divided voltage of 17.5 V to be calculated as the monitored voltage Vk in accordance with the following equation (15+20)/2=17.5.

That is, if there are no open faults and short-circuit faults in each of the first and second on current paths, the monitored voltage Vk becomes the median value between 15 V of the first feedback voltage Vout1 and 20 V of the second feedback voltage Vout2.

The short-circuit fault in the first on current path represents that the first on current path is short-circuited to the emitter and source potential of the first and second U-phase upper-arm switching elements SUHA and SUHB. The short-circuit fault in the second on current path represents that the second on current path is short-circuited to the emitter and source potential of the first and second U-phase upper-arm switching elements SUHA and SUHB. The open fault in each of the first and second on current paths represents that the corresponding one of the first and second on current paths has opened so that no current flows through the corresponding one of the first and second on current paths.

Upon determining that the monitored voltage VK is 20 V, the fault determiner 140 determines that there is an open fault in the first on current path in steps S12 and S13. Upon determining that the monitored voltage VK is 15 V, the fault determiner 140 determines that there is an open fault in the second on current path in steps S12 and S13.

In addition, upon determining that the monitored voltage VK is 10 V, the fault determiner 140 determines that there is a short-circuit fault in the first on current path in steps S12 and S13. Upon determining that the monitored voltage VK is 7.5 V, the fault determiner 140 determines that there is a short-circuit fault in the second on current path in steps S12 and S13.

That is, the fault determiner 140 determines whether there is an open fault or a short-circuit fault in any one of the first on current path and the second on current path in step S13. Upon determining that there is an open fault or a short-circuit fault in any one of the first on current path and the second on current path (YES in step S13), the fault determination task proceeds to step S14. In step S14, the fault determiner 140 sends, to the drive controller 80, information indicative of an open fault or a short-circuit fault occurring in any one of the first on current path and the second on current path.

When receiving the information indicative of an open fault occurring in any one of the first on current path and the second on current path, the drive controller 80 can be configured to continuously drive the corresponding switching element in the other of the first on current path and the second on current path, or stop drive of each of the switching elements SUHA and SUHB. In addition, when receiving the information indicative of a short-circuit fault occurring in any one of the first on current path and the second on current path, the drive controller 80 can be configured to stop drive of each of the switching elements SUHA to SWLB of the inverter 20.

Otherwise, upon determining that there is neither an open fault nor a short-circuit fault in each of the first on current path and the second on current path (NO in step S13), the fault determiner 140 terminates the fault determination task.

Figures 22, 23:
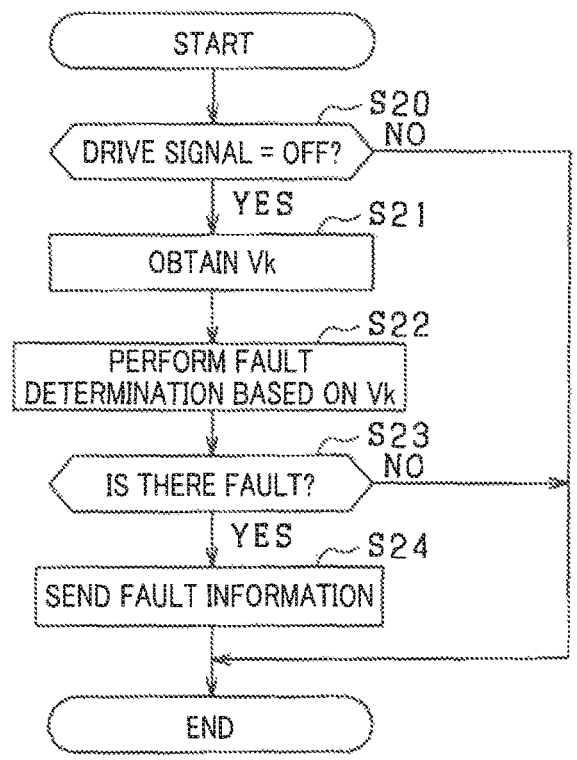
FIG. 22 is a flowchart schematically illustrating an example of an electrical fault determination task while the drive signal represents an off command according to the seventh embodiment.
FIG. 23 is a table schematically illustrating an example of a relationship between monitored voltages and corresponding types of electrical faults in each of an IGBT and a MOSFET according to the seventh embodiment during the discharging task.

FIG. 22 illustrates an example of instructions of the electrical fault determination task periodically carried out by the fault determiner 140 while the drive signal represents the off command.

In step S20, the fault determiner 140 determines whether the drive signal represents the off command and a second predetermined time has elapsed since the drive signal was changed to the present off command. The second predetermined time is determined to an assumed time required for the gate voltages of the first and second U-phase upper-arm switching elements SUHA and SUHB to reach respective first and second discharge target voltages of −2 V and −4 V relative to the timing when the drive signal was changed to the present off command.

Upon determining that the drive signal does not represent the off command or the second predetermined time has not elapsed since the drive signal was changed to the present off command (NO in step S20), the fault determiner 140 terminates the electrical fault determination task. Otherwise, upon determining that the drive signal represents the off command and the second predetermined time has elapsed since the drive signal was changed to the present off command (YES in step S20), the fault determiner 140 obtains the monitored voltage Vk in step S21.

Next, the fault determiner 140 determines, based on the monitored voltage Vk, whether there is an electrical fault in the drive circuit DrF. When determining that there is an electrical fault in the drive circuit DrF, the fault determiner 140 determines, based on the monitored voltage Vk, the type, i.e. mode, of the electrical fault in steps S22 and S23.

Specifically, referring to FIG. 23, the fault determiner 140 determines that there are no electrical faults in each of a first off current path and a second off current path when the monitored voltage Vk is −3 V in steps S22 and S23. The first off current path is defined as a path from the gate of the first U-phase upper-arm switching element SUHA to the emitter thereof, i.e. the common signal ground, via the first discharging switching element 67. The second off current path is defined as a path from the gate of the second U-phase upper-arm switching element SUHB to the source thereof, i.e. the common signal ground, via the second discharging switching element 77. This is based on the following fact.

Specifically, it is assumed that there are no open faults and short-circuit faults in each of the first and second off current paths. In this assumption, dividing the sum of −2 V of the first discharge target voltage for the gate of the switching element SUHA and −4 V of the second discharge target voltage for the gate of the switching element SUHB based on the same resistance values of the first and second divider resistors 141 and 142 enables a divided voltage of −3 V to be calculated as the monitored voltage Vk in accordance with the following equation (−2+−4)/2=−3.

That is, if there are no open faults and short-circuit faults in each of the first and second off current paths, the monitored voltage Vk becomes the median value of −3 V between −2 V of the discharge target voltage of the gate of the first U-phase upper-arm switching element SUHA and −4 V of the discharge target voltage of the gate of the second U-phase upper-arm switching element SUHB.

The short-circuit fault in the first off current path represents that the first off current path is short-circuited to the emitter and source potential of the first and second U-phase upper-arm switching elements SUHA and SUHB. The short-circuit fault in the second off current path represents that the second off current path is short-circuited to the emitter and source potential of the first and second U-phase upper-arm switching elements SUHA and SUHB. The open fault in each of the first and second off current paths represents that the corresponding one of the first and second off current paths has opened so that no current flows through the corresponding one of the first and second off current paths.

Upon determining that the monitored voltage VK is −4 V, the fault determiner 140 determines that there is an open fault in the first off current path in steps S22 and S23. Upon determining that the monitored voltage VK is −2 V, the fault determiner 140 determines that there is an open fault in the second off current path or there is a short-circuit fault in the first off current path in steps S22 and S23.

In addition, upon determining that the monitored voltage VK is −1 V, the fault determiner 140 determines that there is a short-circuit fault in the second off current path in steps S22 and S23.

That is, the fault determiner 140 determines whether there is an open fault or a short-circuit fault in any one of the first off current path and the second off current path in step S23. Upon determining that there is an open fault or a short-circuit fault in any one of the first off current path and the second off current path (YES in step S23), the fault determination task proceeds to step S24. In step S24, the fault determiner 140 sends, to the drive controller 80, information indicative of an open fault or a short-circuit fault occurring in any one of the first off current path and the second off current path.

When receiving the information indicative of an open fault occurring in any one of the first off current path and the second off current path, the drive controller 80 can be configured to continuously perform drive of the corresponding switching element in the other of the first off current path and the second off current path, or stop drive of each of the switching elements SUHA and SUHB. In addition, when receiving the information indicative of a short-circuit fault occurring in any one of the first off current path and the second off current path, the drive controller 80 can be configured to stop drive of each of the switching elements SUHA to SWLB of the inverter 20.

Otherwise, upon determining that there is neither an open fault nor a short-circuit fault in each of the first off current path and the second off current path (NO in step S13), the fault determiner 140 terminates the fault determination task.

As described above, the drive circuit DrF enables whether an electrical fault has occurred therein to be determined, and enables the type of the electrical fault to be identified when it is determined that the electrical fault has occurred. This achieves, as a specific advantageous effect, higher reliability of the drive circuit DrF in addition to the same advantageous effects as those achieved by the first embodiment.

Eighth Embodiment

Figure 24:
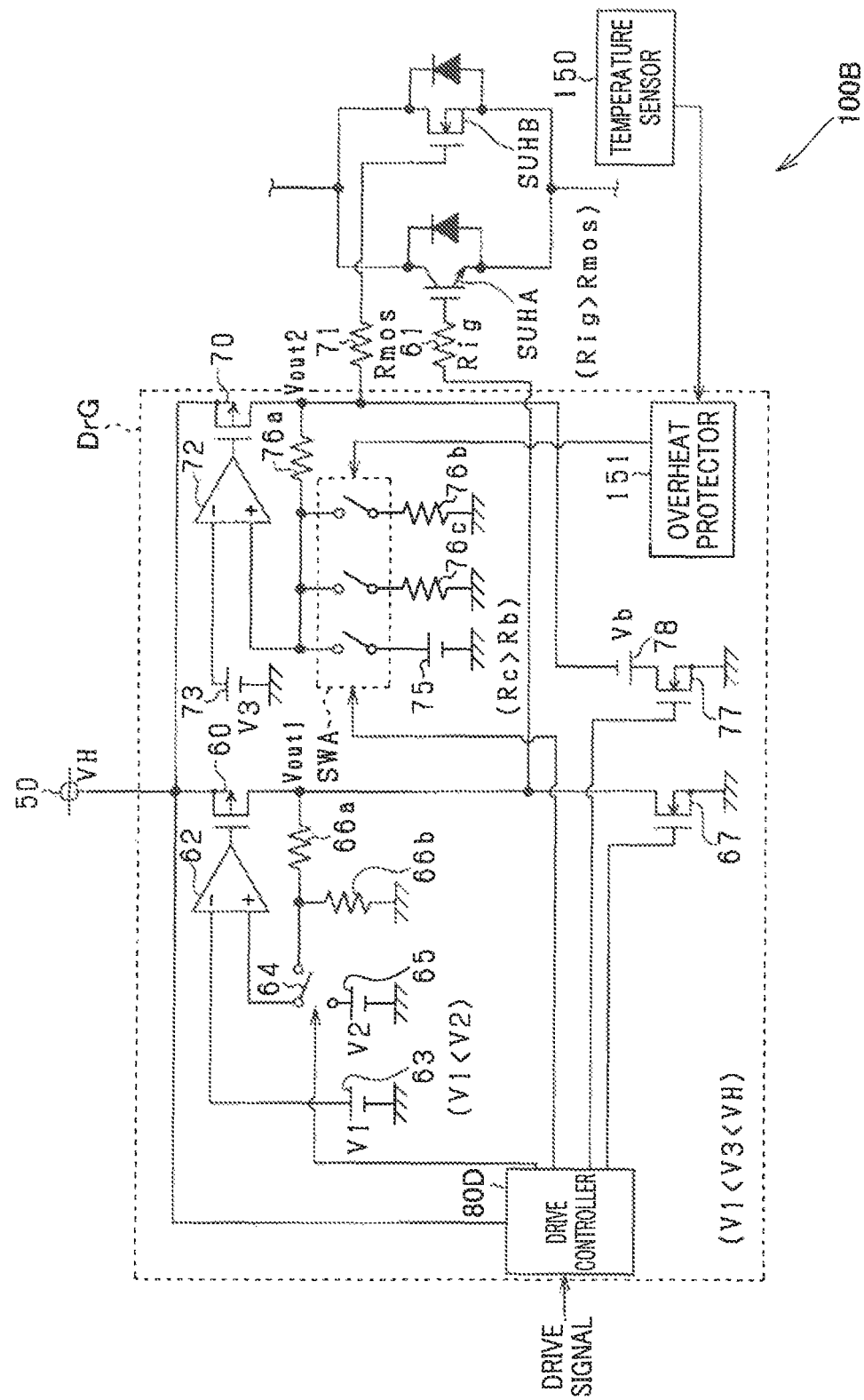
FIG. 24 is a circuit diagram schematically illustrating an example of the structure of a drive circuit for the U-phase upper-arm switch module according to the eighth embodiment of the present disclosure.
Figure 25:
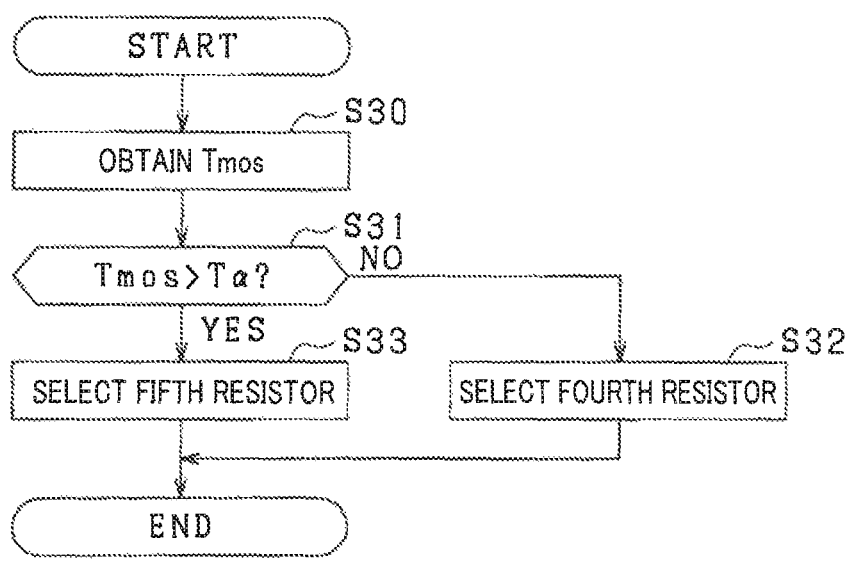
FIG. 25 is a flowchart schematically illustrating an example of an overheat protection task according to the ninth embodiment.

The following describes drive circuits DrG in a control system 100B according to the eighth embodiment of the present disclosure with reference to FIGS. 24 and 25. Similar to the first embodiment, the following describes the structure of the drive circuit DrG for the U-phase upper-arm switch module 20UH as a typical example.

The structures and/or functions of the drive circuit DrG according to the eighth embodiment are different from those of the drive circuit Dr according to the first embodiment by the following points. So, the following mainly describes the different points, and omits or simplifies descriptions of like parts between the first and eighth embodiments, to which identical or like reference characters are assigned, thus eliminating redundant description.

The drive circuit DrG includes an overheat protection function for protecting overheating of the second U-phase upper-arm switching element SUHB.

Referring to FIG. 24, the drive circuit DrG includes a fourth power source 75 having positive and negative terminals, the fourth resistor 76b, a fifth resistor 76c, and a switch module SWA. The negative terminal of the fourth power source 75 is connected to the source of the second U-phase upper-arm switching element SUHB via the common signal ground. Each of the fourth and fifth resistors 76b and 76c has opposing first and second ends, and the second end of each of the fourth and fifth resistors 76b and 76c is connected to the source of the second U-phase upper-arm switching element SUHB via the common signal ground.

The switch module SWA is configured to selectably connect any one of the positive terminal of the fourth power source 75, the first end of the fourth resistor 76b, and the first end of the fifth resistor 76c to the non-inverting input terminal of the second operational amplifier 72. The fourth resistor 76b has a resistance value Rb and the fifth resistor 76c has a resistance value Rc set to be higher than the resistance value Rb.

The control system 100B according to the eighth embodiment includes a temperature sensor 150 disposed to be close to the second U-phase upper-arm switching element SUHB for measuring the temperature of the second U-phase upper-arm switching element SUHB. The eighth embodiment can use a temperature-sensitive diode or a thermistor as the temperature sensor 150.

The drive circuit DrG also includes an overheat protector 151 communicably connected to the temperature sensor 150, which can be designed as, for example, a computer processor, i.e. a programmed-logic circuit or as a hardware logic circuit or the combination of hardwired-logic and programmed-logic hybrid circuits. A single computer processor can serve as both a drive controller 80D and the overheat protector 151 as its functional modules. The overheat protector 151 obtains the temperature of the second U-phase upper-arm switching element SUHB measured by the temperature sensor 150.

The drive controller 80D is connected to the switch module SWA. The drive controller 80D controls the switch module SWA to (1) Select the first end of the fourth resistor 76b to be connected to the non-inverting input terminal of the second operational amplifier 72 when the drive signal is changed from the off command to the on command (2) Select the positive terminal of the fourth power source 75 to be connected to the non-inverting input terminal of the second operational amplifier 72 when the drive signal is changed from the on command to the off command.

The following describes an overheat protection task carried out by the overheat protector 151 with reference to FIG. 25. FIG. 25 illustrates an example of instructions of the overheat protection task periodically carried out by the overheat protector 151.

In step S30, the overheat protector 151 obtains, as a MOS temperature Tmos, the temperature of the second U-phase upper-arm switching element SUHB measured by the temperature sensor 150. Next, the overheat protector 151 determines whether the obtained MOS temperature Tmos has exceeded a predetermined threshold temperature Tα in step S31.

Upon determining that the obtained MOS temperature Tmos has not exceeded the threshold temperature Tα (NO in step S31), the overheat protection task proceeds to step S32. In step S32, the overheat protector 151 controls the switch module SWA to perform one of (1) Connecting the first end of the fourth resistor 76b to the non-inverting input terminal of the second operational amplifier 72 or (2) Maintaining the first end of the fourth resistor 76b to be connected to the non-inverting input terminal of the second operational amplifier 72 in the same manner as the first embodiment.

Otherwise, upon determining that the obtained MOS temperature Tmos has exceeded the threshold temperature Tα (YES in step S31), the overheat protection task proceeds to step S33. In step S33, the overheat protector 151 controls the switch module SWA to perform one of (1) Connecting the first end of the fifth resistor 76c to the non-inverting input terminal of the second operational amplifier 72 or (2) Maintaining the first end of the fifth resistor 76c to be connected to the non-inverting input terminal of the second operational amplifier 72.

The resistance value Rc of the fifth resistor 76c is set to be higher than the resistance value Rb of the fourth resistor 76b, resulting in a higher potential at the second end of the third resistor 76a connected to the non-inverting input terminal of the second operational amplifier 72. This reduces the gate voltage Vgs of the second U-phase upper-arm switching element SUHB, resulting in a smaller amount of the drain current Id flowing through the second U-phase upper-arm switching element SUHB. This prevents the second U-phase upper-arm switching element SUHB from overheating.

The operations in steps S31 and S33 serve as, for example, a voltage adjuster.

In particular, the resistance value Rc of the fifth resistor 76c can be set such that the gate voltage of the second U-phase upper-arm switching element SUHB decreases down to be substantially equal to the gate voltage of the first U-phase upper-arm switching element SUHA.

As described above, the drive circuit DrG protects the second U-phase upper-arm switching element SUHB from overheating. This achieves, as a specific advantageous effect, higher reliability of the drive circuit DrG in addition to the same advantageous effects as those achieved by the first embodiment.

Ninth Embodiment

Figure 26:
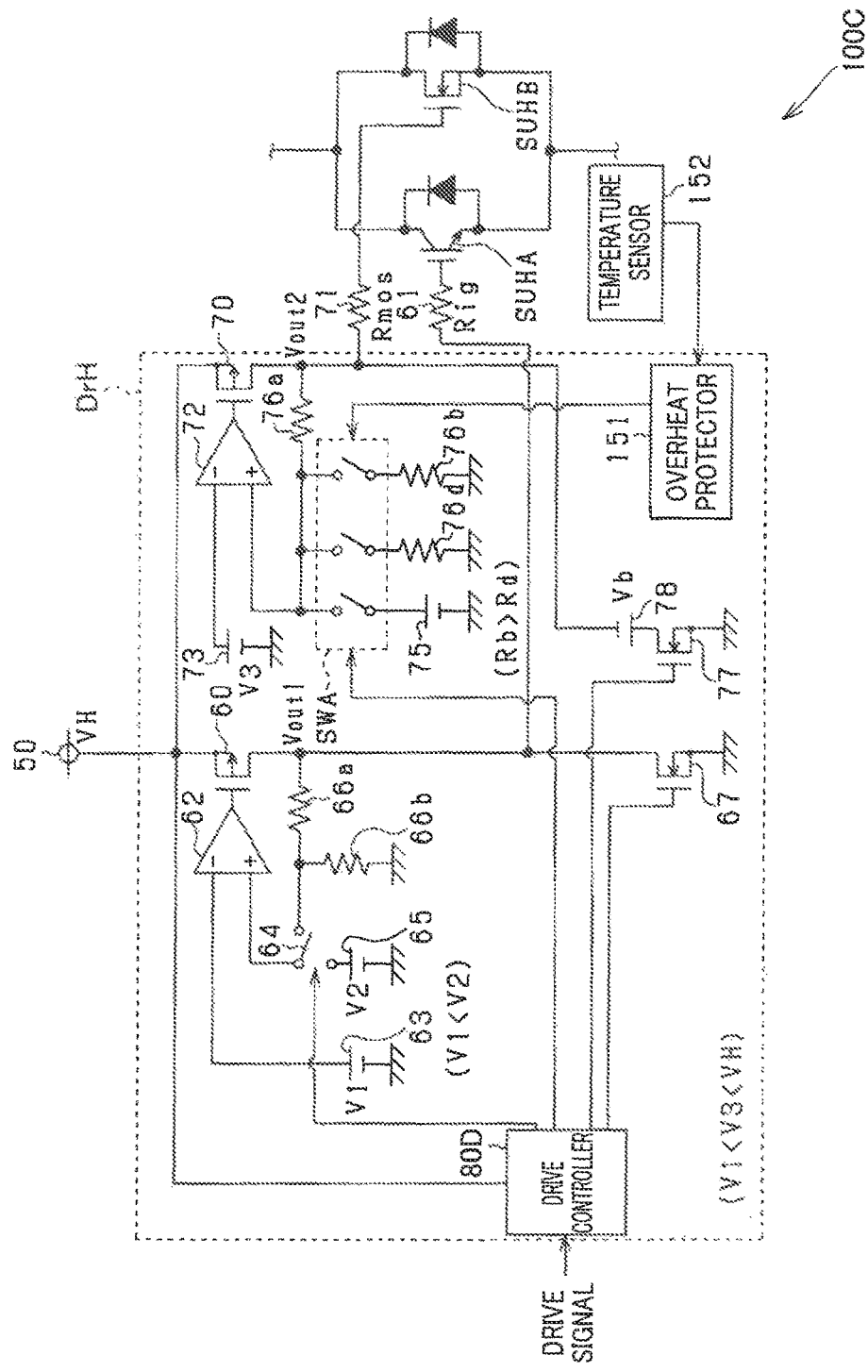
FIG. 26 is a circuit diagram schematically illustrating an example of the structure of a drive circuit for the U-phase upper-arm switch module according to the ninth embodiment of the present disclosure.
Figure 27:
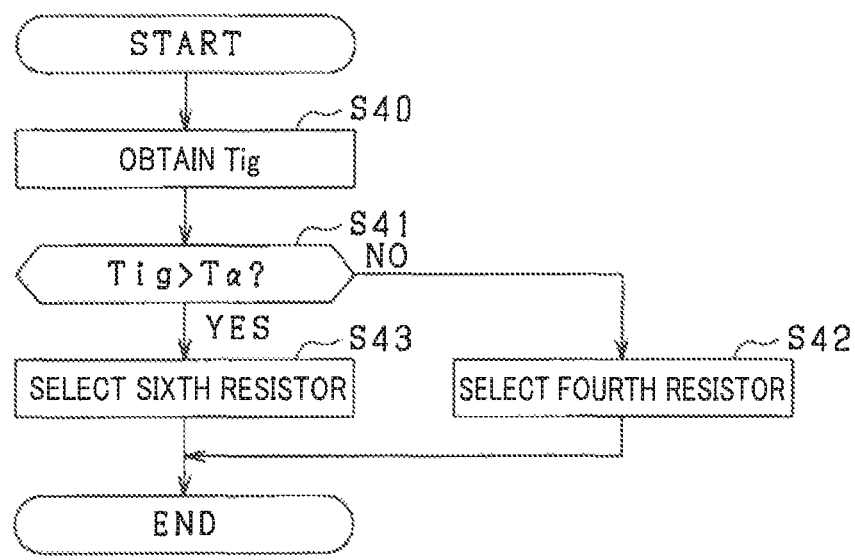
FIG. 27 is a flowchart schematically illustrating an example of an overheat protection task according to the ninth embodiment.
Figure 28:
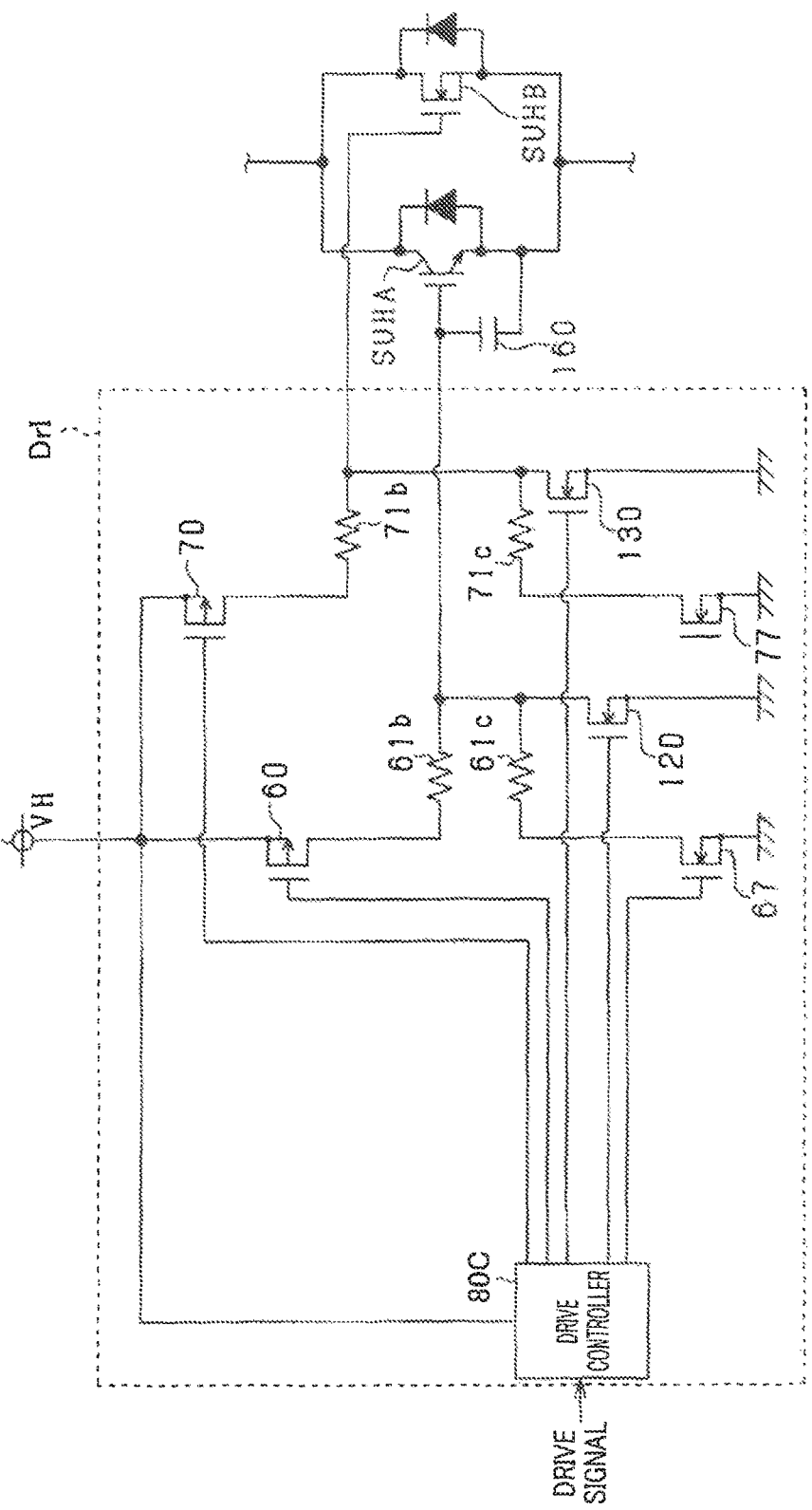
FIG. 28 is a circuit diagram schematically illustrating an example of the structure of a drive circuit for the U-phase upper-arm switch module according to the tenth embodiment of the present disclosure.

The following describes drive circuits DrH in a control system 100C according to the ninth embodiment of the present disclosure with reference to FIGS. 26 and 27. Similar to the first embodiment, the following describes the structure of the drive circuit DrH for the U-phase upper-arm switch module 20UH as a typical example.

The structures and/or functions of the drive circuit DrH according to the ninth embodiment are different from those of the drive circuit DrG according to the eighth embodiment by the following points. So, the following mainly describes the different points, and omits or simplifies descriptions of like parts between the first and ninth embodiments, to which identical or like reference characters are assigned, thus eliminating redundant description.

The drive circuit DrH includes an overheat protection function for protecting overheating of the first U-phase upper-arm switching element SUHA.

Referring to FIG. 26, the drive circuit DrH includes a sixth resistor 76d in place of the fifth resistor 76c. The sixth resistor 76d has opposing first and second ends, and the second end the sixth resistor 76d is connected to the source of the second U-phase upper-arm switching element SUHB via the common signal ground.

The switch module SWA is configured to selectably connected any one of the positive terminal of the fourth power source 75, the first end of the fourth resistor 76b, and the first end of the sixth resistor 76d to the non-inverting input terminal of the second operational amplifier 72. The sixth resistor 76d has a resistance value Rd set to be lower than the resistance value Rb of the fourth resistor 76b.

The control system 100C according to the ninth embodiment includes a temperature sensor 152 disposed to be close to the first U-phase upper-arm switching element SUHA for measuring the temperature of the first U-phase upper-arm switching element SUHA. The ninth embodiment can use a temperature-sensitive diode or a thermistor as the temperature sensor 152. The overheat protector 151 obtains the temperature of the first U-phase upper-arm switching element SUHA measured by the temperature sensor 152.

The following describes an overheat protection task carried out by the overheat protector 151 with reference to FIG. 27. FIG. 27 illustrates an example of instructions of the overheat protection task periodically carried out by the overheat protector 151.

In step S40, the overheat protector 151 obtains, as an IGBT temperature Tig, the temperature of the first U-phase upper-arm switching element SUHA measured by the temperature sensor 152. Next, the overheat protector 151 determines whether the obtained IGBT temperature Tig has exceeded the predetermined threshold temperature Tα in step 341.

Upon determining that the obtained IGBT temperature Tig has not exceeded the threshold temperature Tα (NO in step S41), the overheat protection task proceeds to step S42. In step S42, the overheat protector 151 controls the switch module SWA to perform one of (1) Connecting the first end of the fourth resistor 76b to the non-inverting input terminal of the second operational amplifier 72 or (2) Maintaining the first end of the fourth resistor 76b to be connected to the non-inverting input terminal of the second operational amplifier 72 in the same manner as the first embodiment.

Otherwise, upon determining that the obtained IGBT Tig has exceeded the threshold temperature Tα (YES in step S41), the overheat protection task proceeds to step S43. In step S43, the overheat protector 151 controls the switch module SWA to perform one of (1) Connecting the first end of the sixth resistor 76d to the non-inverting input terminal of the second operational amplifier 72 or (2) Maintaining the first end of the sixth resistor 76d to be connected to the non-inverting input terminal of the second operational amplifier 72.

The operations in steps S41 and S43 serve as, for example, a voltage adjuster.

The resistance value Rd of the sixth resistor 76d is set to be lower than the resistance value Rb of the fourth resistor 76b, resulting in a lower potential at the second end of the third resistor 76a connected to the non-inverting input terminal of the second operational amplifier 72. This increases the voltage applied to the gate of the second U-phase upper-arm switching element SUHB. This results in a larger amount of the drain current Id flowing through the second U-phase upper-arm switching element SUHB, resulting in a smaller amount of the drain current Id flowing through the first U-phase upper-arm switching element SUHA. This prevents the first U-phase upper-arm switching element SUHA from overheating.

As described above, the drive circuit DrH protects the first U-phase upper-arm switching element SUHA from overheating. This achieves, as a specific advantageous effect, higher reliability of the drive circuit DrG in addition to the same advantageous effects as those achieved by the first embodiment.

Tenth Embodiment

The following describes drive circuits DrI according to the tenth embodiment of the present disclosure with reference to FIGS. 28 to 31B. Similar to the first embodiment, the following describes the structure of the drive circuit DrI for the U-phase upper-arm switch module 20UH as a typical example.

The structures and/or functions of the drive circuit DrI according to the tenth embodiment are different from those of the drive circuit DrE according to the sixth embodiment by the following points. So, the following mainly describes the different points, and omits or simplifies descriptions of like parts between the sixth and tenth embodiments, to which identical or like reference characters are assigned, thus eliminating redundant description.

The discharging gate resistor 61c according to the tenth embodiment will be referred to as a first discharging gate resistor 61c.

The drive circuit DrI includes a second discharging gate resistor 61d having opposing first and second ends, and the second discharging switching element 77 described in the first embodiment. The first end of the second discharging gate resistor 71c is connected to the gate of the second U-phase upper-arm switching element SUHB. The second end of the second discharging gate resistor 71c is connected to the source of the second U-phase upper-arm switching element SUHB via the second off-hold switching element 130 and the common signal ground. An electrical path extending from the gate of the first U-phase upper-arm switching element SUHA to the emitter thereof via the first off-hold switching element 120 is defined as a first off-hold path. Similarly, an electrical path extending from the gate of the second U-phase upper-arm switching element SUHB to the source thereof via the second off-hold switching element 130 is defined as a second off-hold path.

The drive circuit DrI includes a gate capacitor 160 connected between the gate and emitter of the first U-phase upper-arm switching element SUHA.

The drive controller 80C is configured to monitor the gate voltage of the second U-phase upper-arm switching element SUHB in addition to monitoring the gate voltage of the first U-phase upper-arm switching element SUHA.

The drive controller 80C maintains the first discharging switching element 67, the second discharging switching element 77, the first off-hold switching element 120, and the second off-hold switching element 130 in the off state when the on command of the drive signal is input thereto.

Upon determining that the drive signal is changed from the on command to the off command, the drive controller 80C changes the second discharging switching element 77 from the off state to the on state first, and thereafter changes the first discharging switching element 67 from the off state to the on state next.

Additionally, the drive controller 80C is configured to perform a second off-hold task of the second U-phase upper-arm switching element SUHB using the second off-hold switching element 130 in addition to the off-hold task of the first U-phase upper-arm switching element SUHA, which will be referred to as the first off-hold task, using the first off-hold switching element 120 described in the sixth embodiment.

Specifically, the drive controller 80C determines whether the drive signal represents the off command and the monitored gate voltage of the first U-phase upper-arm switching element SUHA is equal to or lower than a predetermined first off-hold voltage; the first off-hold voltage is set to be equal to or lower than the first threshold Vth1 of the first U-phase upper-arm switching element SUHA.

Upon determining that the drive signal represents the off command and the monitored gate voltage of the first U-phase upper-arm switching element SUHA is equal to or lower than the first off-hold voltage, the drive controller 80C changes the first off-hold switching element 120 from the off state to the on state. Otherwise, upon determining that the drive signal does not represent the off command and/or the monitored gate voltage of the first U-phase upper-arm switching element SUHA is higher than the off-hold voltage, the drive controller 80C maintains the first off-hold switching element 120 in the off state.

In addition, the drive controller 80C determines whether the drive signal represents the off command and the monitored gate voltage of the second U-phase upper-arm switching element SUHB is equal to or lower than a predetermined second off-hold voltage; the second off-hold voltage is set to be equal to or lower than the second threshold Vth2 of the second U-phase upper-arm switching element SUHB.

Upon determining that the drive signal represents the off command and the monitored gate voltage of the second U-phase upper-arm switching element SUHB is equal to or lower than the second off-hold voltage, the drive controller 80C changes the second off-hold switching element 130 from the off state to the on state. Otherwise, upon determining that the drive signal does not represent the off command and/or the monitored gate voltage of the second U-phase upper-arm switching element SUHB is higher than the off-hold voltage, the drive controller 80C maintains the second off-hold switching element 130 in the off state.

Next, the following describes the reason why the gate capacitor 160 is connected between the gate and emitter of the first U-phase upper-arm switching element SUHA.

FIG. 29 schematically illustrates parasitic capacitors that the first U-phase upper-arm switching element SUHA has. That is, the parasitic capacitors include an input capacitor between the gate and emitter, a feedback capacitor between the gate and collector, and an output capacitor between the collector and emitter.

Next, FIG. 30A illustrates how the drive signal changes over time, FIG. 30B illustrates how the gate-source voltage Vge of the first U-phase upper-arm switching element SUHA changes over time, and FIG. 30C illustrates how the collector-emitter voltage Vce of the first U-phase upper-arm switching element SUHA changes over time.

Figure 31A:
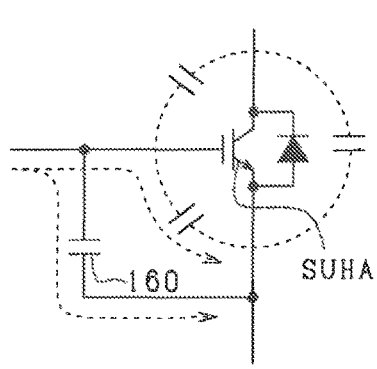
FIG. 31A is a diagram schematically illustrating how a gate capacitor is charged during the charging task according to the tenth embodiment.

When the drive signal is changed from the off command to the on command at time t31, the charging task causes the input capacitor and the gate capacitor 160 to start to be charged based on the constant voltage source 50 serving as a power supply (see FIG. 31A). The starting of the charge in the input capacitor causes the gate voltage Vge to rise.

Thereafter, the gate voltage Vge reaches the first threshold voltage Vth1 at time t32. This causes the first U-phase upper-arm switching element SUHA to be turned on, so that the collector current Ic starts to flow through the first U-phase upper-arm switching element SUHA, and the collector-emitter voltage Vce starts to fall.

Figure 31B:
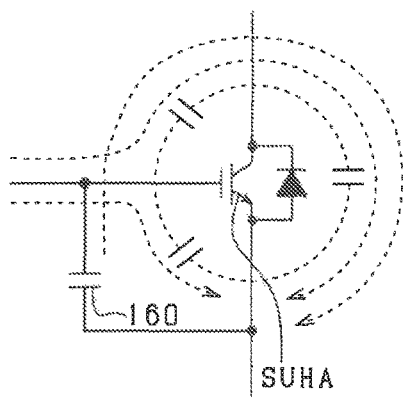
FIG. 31B is a diagram schematically illustrating how the gate capacitor works to charge an output capacitor according to the tenth embodiment.
Figure 32:
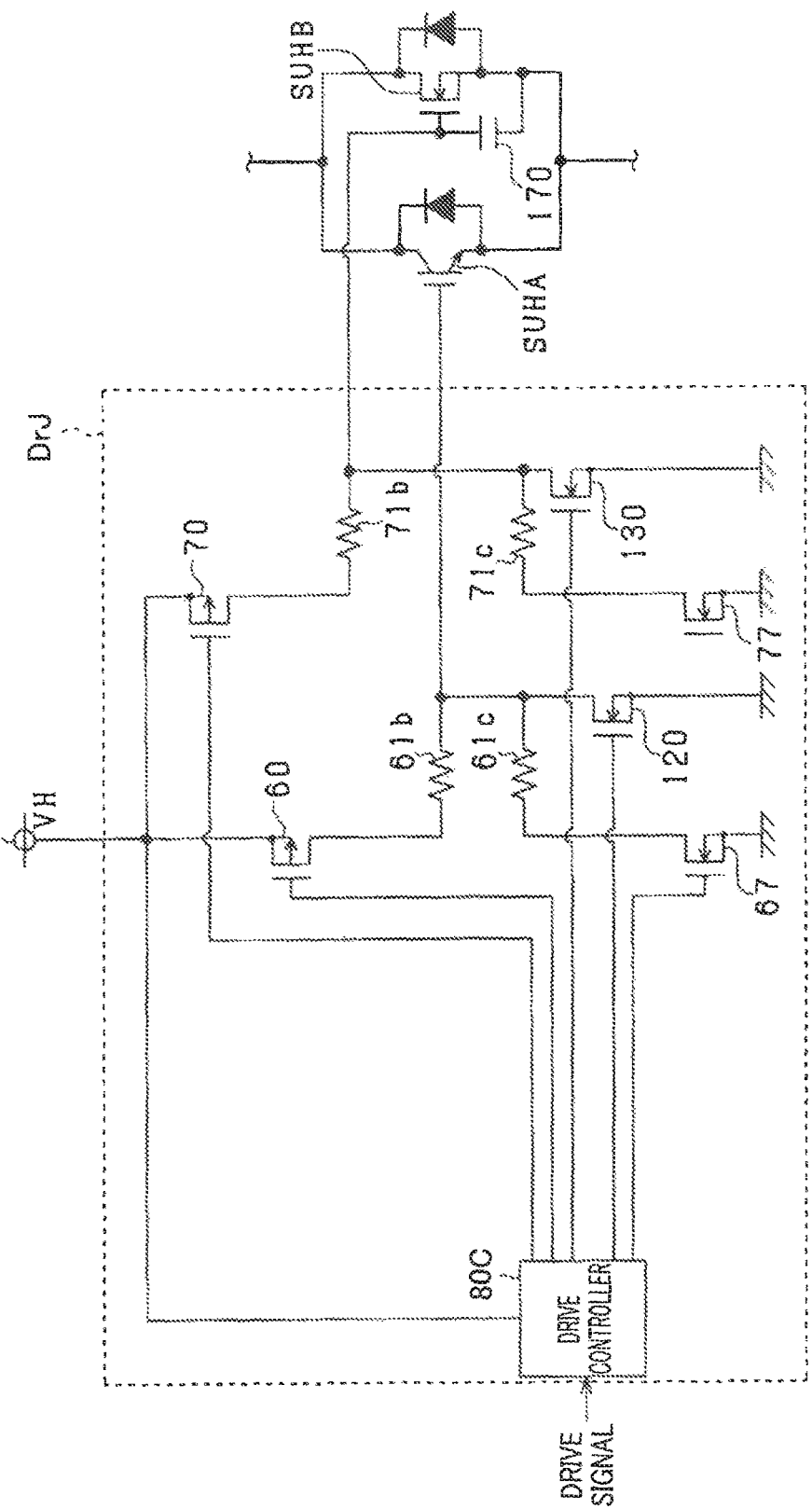
FIG. 32 is a circuit diagram schematically illustrating an example of the structure of a drive circuit for the U-phase upper-arm switch module according to the eleventh embodiment of the present disclosure.

Thereafter, the feedback capacitor and the output capacitor start to be charged based on the constant voltage source 50 and the gate capacitor 160 each serving as a power supply (see FIG. 31B). This results in the feedback capacitor and the output capacitor of the first U-phase upper-arm switching element SUHA being charged faster as compared with a comparative example where the gate capacitor 160 is not provided between the gate and emitter of the first U-phase upper-arm switching element SUHA. The speed-up charging of the first U-phase upper-arm switching element SUHA results in a faster falling rate of the collector-emitter voltage Vce, which is illustrated by a solid curve after the time t32, as compared with the falling rate of the collector-emitter voltage Vce in the comparative example, which is illustrated by a dashed curve after the time t32.

That is, the drive circuit DrI achieves the following specific advantageous effects in addition to the same advantageous effects as those achieved by the first embodiment.

Specifically, the drive circuit DrI achieves higher reliability of erroneous turn-on of each of the first and second upper-arm switching elements SUHA and SUHB and a smaller size. In addition, the drive circuit DrI enables the turn-on time of the first upper-arm switching element SUHA to be shorter than the comparative example, resulting lower switching loss of the first upper-arm switching element SUHA.

Moreover, the drive circuit DrI includes the gate capacitor 160 provided for only the first U-phase upper-arm switching element SUHA in the first and second U-phase upper-arm switching elements SUHA and SUHB. This results in (1) A lower quantity of electrical power supplied from the constant voltage source 50 for charging the gate capacitor 160 as compared with the case where the gate capacitors 160 are provided for the respective first and second U-phase upper-arm switching elements SUHA and SUHB (2) The lower number of components of the drive circuit DrI as compared with the case where the gate capacitors 160 are provided for the respective first and second U-phase upper-arm switching elements SUHA and SUHB.

Eleventh Embodiment

The following describes drive circuits DrJ according to the eleventh embodiment of the present disclosure with reference to FIGS. 32 to 34B. Similar to the first embodiment, the following describes the structure of the drive circuit DrJ for the U-phase upper-arm switch module 20UH as a typical example.

The structures and/or functions of the drive circuit DrJ according to the eleventh embodiment are different from those of the drive circuit DrI according to the tenth embodiment by the following points. So, the following mainly describes the different points, and omits or simplifies descriptions of like parts between the tenth and eleventh embodiments, to which identical or like reference characters are assigned, thus eliminating redundant description.

In place of the gate capacitor 160, the drive circuit DrJ includes a gate capacitor 170 connected between the gate and emitter of only the second U-phase upper-arm switching element SUHB, whose second threshold voltage Vth2 is lower than the first threshold voltage Vth1 of the first U-phase upper-arm switching element SUHA.

Next, the following describes the reason why the gate capacitor 170 is only connected between the gate and emitter of the second U-phase upper-arm switching element SUHB.

Figure 33A:
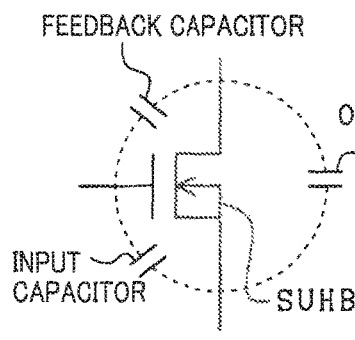
FIG. 33A is a diagram schematically illustrating parasitic capacitors that an MOSFET has.
Figure 33B:
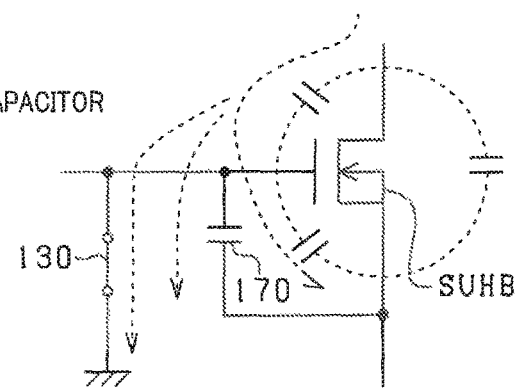
FIG. 33B is a diagram schematically illustrating how a gate capacitor works to charge a parasitic capacitor or works to be discharged according to the eleventh embodiment.

FIG. 33A schematically illustrates parasitic capacitors that the second U-phase upper-arm switching element SUHB has. That is, the parasitic capacitors include an input capacitor between the gate and source, a feedback capacitor between the gate and source, and an output capacitor between the collector and source.

Figure 34A:
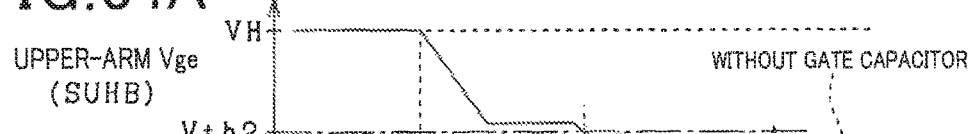
FIGS. 34A and 34B are a joint timing chart schematically illustrating how the first U-phase upper-arm gate voltage and the first U-phase lower-arm gate voltage change over time according to the eleventh embodiment.
Figure 34B:
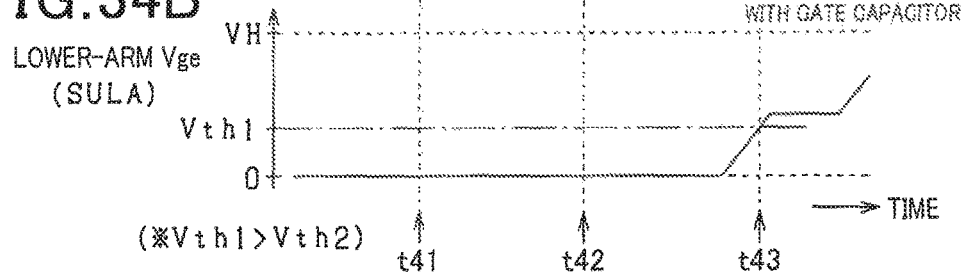

Next, FIG. 34A illustrates how the gate-source voltage Vge of the second U-phase upper-arm switching element SUHB changes over time, and FIG. 34B illustrates how the gate-emitter voltage Vge of the first U-phase lower-arm switching element SULA changes over time.

When the drive signal is changed from the on command to the off command at time t41, the discharging task causes the gate voltage Vgs of the second U-phase upper-arm switching element SUHB starts to fall. Thereafter, the gate voltage Vgs reaches the second threshold voltage Vth2 at time t42. This causes the second U-phase upper-arm switching element SUHB to be turned off, and the second off-hold switching element 130 to be turned off when the gate voltage Vgs becomes the second off-hold voltage set to be equal to or lower than the second threshold voltage Vth2.

Thereafter, the charging task for the first U-phase lower-arm switching element SULA causes the gate voltage Vge of the first U-phase lower-arm switching element SULA to start rising. When the gate voltage Vge of the first U-phase lower-arm switching element SULA reaches the first threshold Vth1 at time t43, the first t U-phase lower-arm switching element SULA is changed from the off state to the on state. This results in the collector-emitter voltage Vce of the first U-phase lower-arm switching element SULA becoming to be substantially equal to zero, so that the terminal voltage of the battery 10 is applied across the drain and source of the second U-phase upper-arm switching element SUHB. This results in the drain-source voltage of the second U-phase upper-arm switching element SUHB rising rapidly, causing charge to flow into the gate of each of the first and second U-phase upper-arm switching elements SUHA and SUHB via the corresponding feedback capacitor. This might cause the gate voltage of each of the first and second U-phase upper-arm switching elements SUHA and SUHB if the gate capacitor 170 were not provided for the second U-phase upper-arm switching element SUHB.

As described above, the second threshold voltage Vth2 of the second U-phase upper-arm switching element SUHB is set to be lower than the first threshold voltage Vth1 of the first U-phase upper-arm switching element SUHA. The flow of charge into the gate of each of the first and second U-phase upper-arm switching elements SUHA and SUHB via the corresponding feedback capacitor might cause the second U-phase upper-arm switching element SUHB to be erroneously turned off despite the on state of the second off-hold switching element 130 if the gate capacitor 170 were not provided for the second U-phase upper-arm switching element SUHB.

In contrast, the drive circuit DrJ includes the gate capacitor 170 connected between the gate and source of the second U-phase upper-arm switching element SUHB whose second threshold voltage Vth2 is lower than the first threshold voltage of the first U-phase upper-arm switching element SUHA. This configuration enables, even if charge flows into the gate of the second U-phase upper-arm switching element SUHB via the corresponding feedback capacitor, the charge to be stored in the gate capacitor 170, resulting in a reduction of an increase in the gate voltage Vgs of the second U-phase upper-arm switching element SUHB (see FIG. 33B). This prevents the gate voltage Vgs of the second U-phase upper-arm switching element SUHB from rising up to the second threshold voltage Vth2, which is illustrated by a solid curve after the time t43, as compared with the case where the gate capacitor 170 is not provided for the second U-phase upper-arm switching element SUHB, which is illustrated by a dashed curve after the time t43. This prevents the second U-phase upper-arm switching element SUHB from being erroneously turned on.

The drive circuit DrJ achieves the same advantageous effects as those achieved by the drive circuit DrI according to the tenth embodiment.

In particular, the drive circuit DrJ prevents erroneous turn-on of the second upper-arm switching element SUHB.

Twelfth Embodiment

Figure 35:
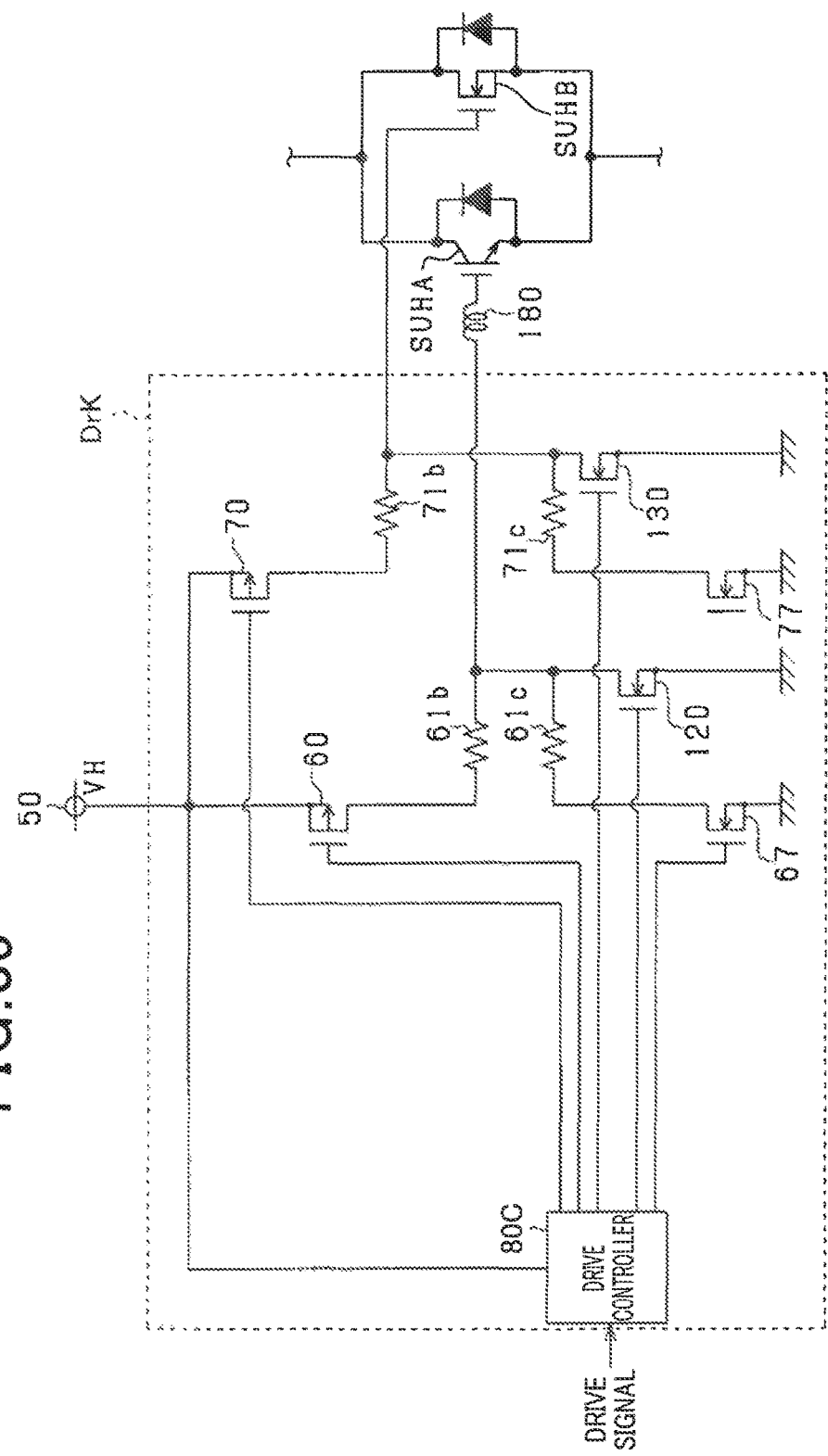
FIG. 35 is a circuit diagram schematically illustrating an example of the structure of a drive circuit for the U-phase upper-arm switch module according to the twelfth embodiment of the present disclosure.
Figure 36:
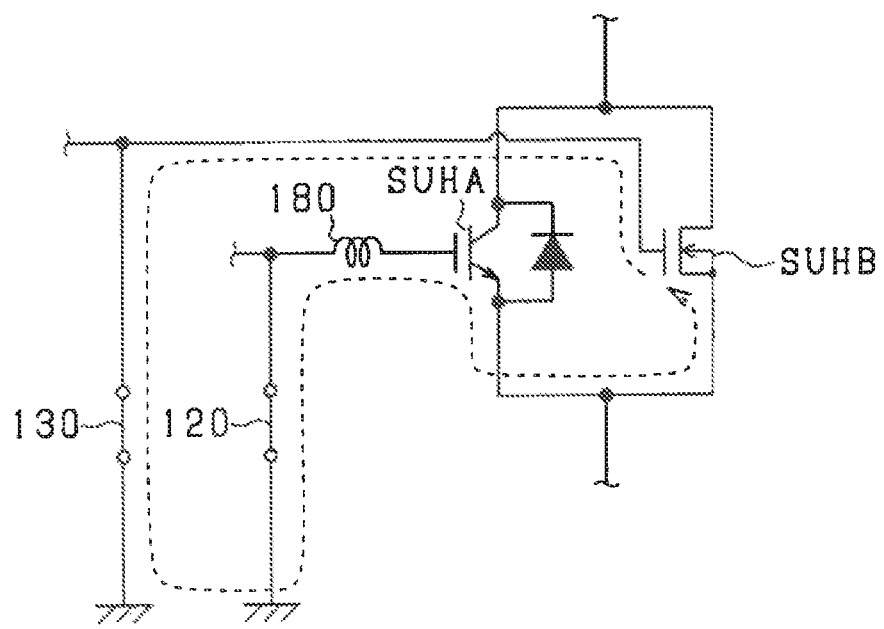
FIG. 36 is a diagram schematically illustrating a resonance circuit during the off-hold task.

The following describes drive circuits DrK according to the twelfth embodiment of the present disclosure with reference to FIGS. 35 and 36. Similar to the first embodiment, the following describes the structure of the drive circuit DrK for the U-phase upper-arm switch module 20UH as a typical example.

The structures and/or functions of the drive circuit DrK according to the twelfth embodiment are different from those of the drive circuit DrI according to the tenth embodiment by the following points. So, the following mainly describes the different points, and omits or simplifies descriptions of like parts between the tenth and twelfth embodiments, to which identical or like reference characters are assigned, thus eliminating redundant description.

In place of the gate capacitor 160, the drive circuit DrK includes a chip bead element, i.e. an inductive element having a chip shape, 180 as an example of inductor elements connected between the second end of the first charging resistor 61b and the gate of the first U-phase upper-arm switching element SUHA.

That is, the chip bead element 180 is provided for only the first U-phase upper-arm switching element SUHA, whose first threshold voltage Vth1 is higher than the second threshold voltage Vth2 of the second U-phase upper-arm switching element SUHB.

Next, the following describes the reason why the chip bead element 180 is only connected to the gate of the first U-phase upper-arm switching element SUHA.

FIG. 36 schematically illustrates that the discharging task causes the first and second off-hold switches 120 and 130 to be in the on state. This results in a closed circuit being provided among the first off-hold switch 120, the chip bead element 180, the input capacitor of the first U-phase upper-arm switching element SUHA, the source of the second U-phase upper-arm switching element SUHB, the second off-hold switch 130, and the emitter of the first U-phase upper-arm switching element SUHA via the common signal ground. This closed circuit will be referred to as an off-duration closed circuit.

At that time, noise due to any cause may be transferred to the off-duration closed circuit. This might cause resonance to occur in the off-duration closed circuit, resulting in lower reliability of each of the first and second U-phase upper-arm switching elements SUHA and SUHB if the chip bead element 180 were provided in the off-duration closed circuit.

The chip bead element 180 according to the twelfth embodiment aims to solve such a problem. Specifically, the chip bead element 180 provided in the off-duration closed circuit has inductance-frequency characteristics configured such that, the higher a signal input thereto is, the higher the inductance thereof is. This enables noise to be eliminated from the off-duration closed circuit.

If a chip bead element were provided for the second U-phase upper-arm switching element SUHB, noise transferred to the off-duration closed circuit might cause the gate voltage Vgs of the second U-phase upper-arm switching element SUHB to increase up to the second threshold voltage Vth2. This might result in the second U-phase upper-arm switching element SUHB to be erroneously turned on.

To address such a problem, the chip bead element 180 is provided for only the first U-phase upper-arm switching element SUHA, whose first threshold voltage Vth1 is higher than the second threshold voltage Vth2 of the second U-phase upper-arm switching element SUHB. This prevents, even if noise is transferred to the off-duration closed circuit, the gate voltage Vge from increasing up to the first threshold voltage Vth1.

Accordingly, the drive circuit DrK according to the twelfth embodiment prevents resonance from occurring in the off-duration closed circuit while preventing the first U-phase upper-arm switching element SUHA from being erroneously turned on during the off-hold task. This achieves, in addition to the same advantageous effects as those achieved by the drive circuit DrI according to the tenth embodiment, further higher reliability of the inverter 20.

Thirteenth Embodiment

Figure 37:
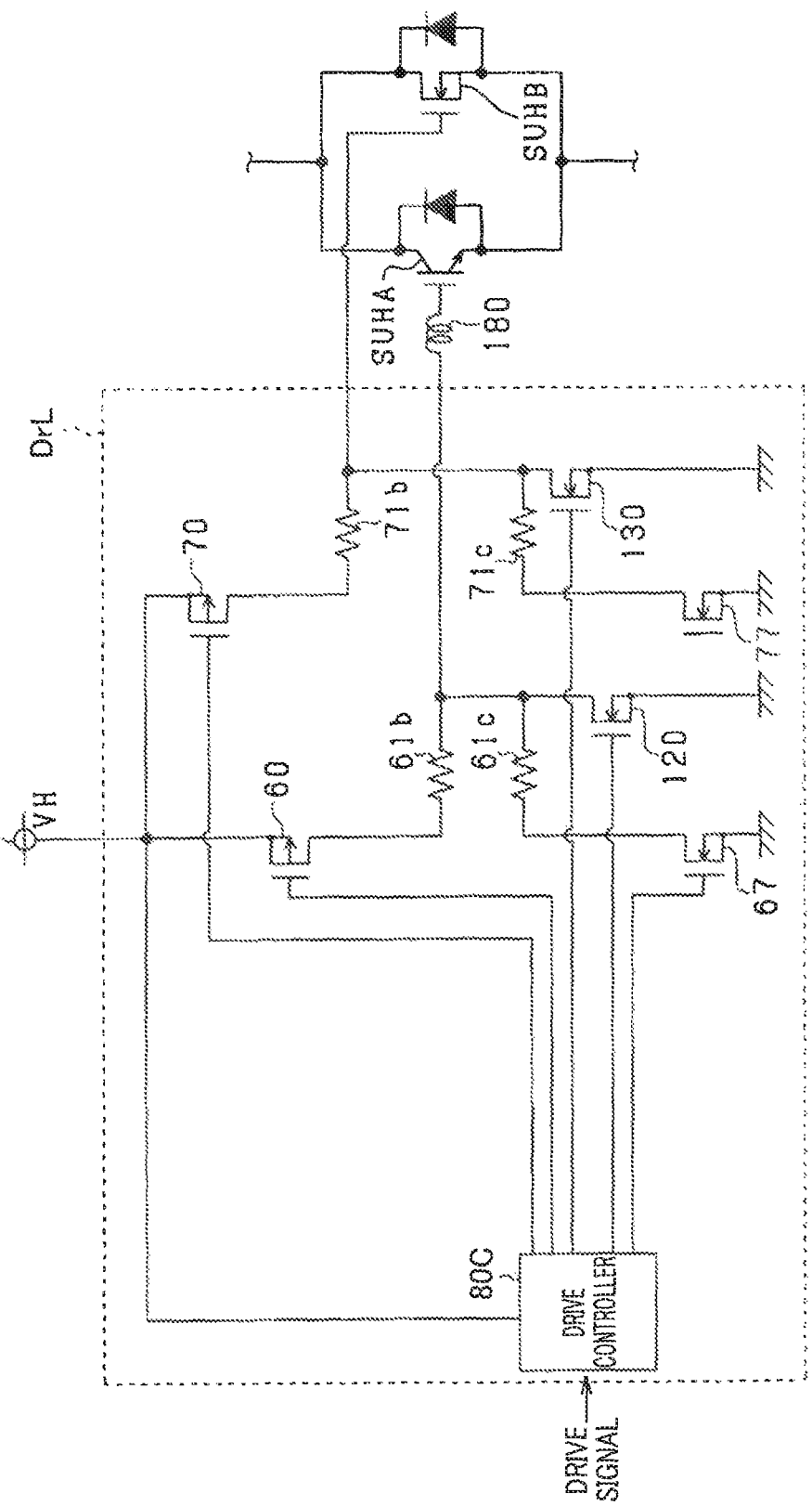
FIG. 37 is a circuit diagram schematically illustrating an example of the structure of a drive circuit for the U-phase upper-arm switch module according to the thirteenth embodiment of the present disclosure.
Figure 38:
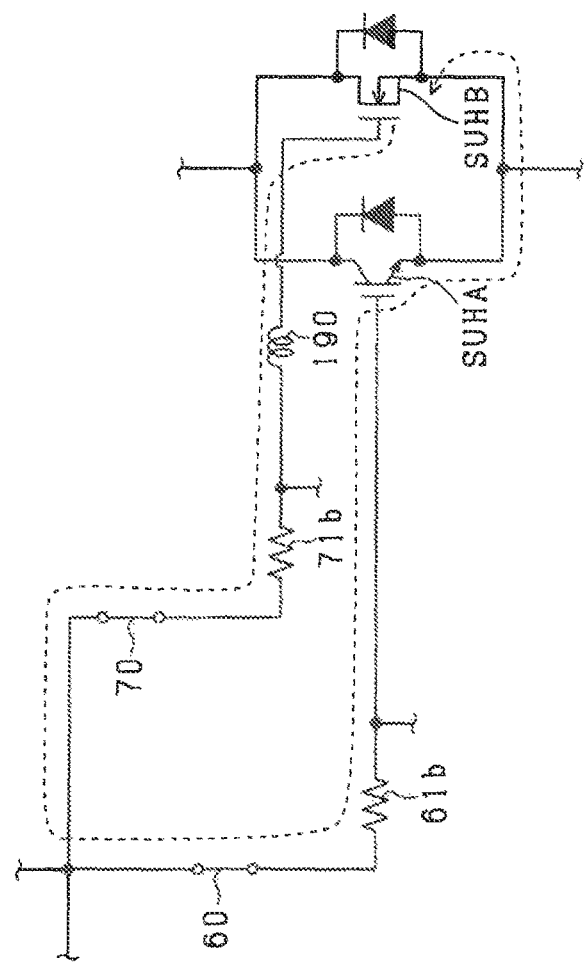
FIG. 38 is a diagram schematically illustrating a resonance circuit during the charging task.

The following describes drive circuits DrL according to the thirteenth embodiment of the present disclosure with reference to FIGS. 37 and 38. Similar to the first embodiment, the following describes the structure of the drive circuit DrL for the U-phase upper-arm switch module 20UH as a typical example.

The structures and/or functions of the drive circuit DrL according to the thirteenth embodiment are different from those of the drive circuit DrK according to the twelfth embodiment by the following points. So, the following mainly describes the different points, and omits or simplifies descriptions of like parts between the twelfth and thirteenth embodiments, to which identical or like reference characters are assigned, thus eliminating redundant description.

In place of the chip bead element 180, the drive circuit DrL includes a chip bead element 190 connected between the second end of the second charging resistor 71b and the gate of the second U-phase upper-arm switching element SUHB.

That is, the chip bead element 190 is provided for only the second U-phase upper-arm switching element SUHB, which is to be turned on later and turned off earlier than the first U-phase upper-arm switching element SUHA, in the first and second U-phase upper-arm switching elements SUHA and SUHB.

Next, the following describes the reason why the chip bead element 190 is only connected to the gate of the second U-phase upper-arm switching element SUHB.

FIG. 38 schematically illustrates a part of the drive circuit DrL during the charging task. This results in a closed circuit being provided among the second charging switching element 70, the second charging resistor 71b, the chip bead element 190, the input capacitor of the second U-phase upper-arm switching element SUHB, the input capacitor of the first U-phase upper-arm switching element SUHA, the first charging resistor 61b, and the first charging switching element 60. This closed circuit will be referred to as an on-duration closed circuit.

At that time, noise due to any cause may be transferred to the on-duration closed circuit. This might cause resonance to occur in the on-duration closed circuit, resulting in lower reliability of each of the first and second U-phase upper-arm switching elements SUHA and SUHB if the chip bead element 190 were provided in the on-duration closed circuit.

The chip bead element 190 according to the thirteenth embodiment aims to solve such a problem. Specifically, the chip bead element 190 provided in the on-duration closed circuit has inductance-frequency characteristics configured such that, the higher a signal input thereto is, the higher the inductance thereof is. This enables noise to be eliminated from the on-duration closed circuit.

If a chip bead element were provided for the first U-phase upper-arm switching element SUHA, the chip bead element might result in adverse effects to (1) The charging of the gate of the first U-phase upper-arm switching element SUHA during the charging task (2) The discharging from the gate of the first U-phase upper-arm switching element SUHA during the discharging task.

To address such a problem, the chip bead element 190 is provided for only the second U-phase upper-arm switching element SUHB, which is to be turned on later and turned off earlier than the first U-phase upper-arm switching element SUHA. This maintains, at lower levels, adverse effects to the charging of and discharging from the gate of the second U-phase upper-arm switching element SUHB as compared with adverse effects to the charging of and discharging from the gate of the first U-phase upper-arm switching element SUHA.

Accordingly, the drive circuit DrL according to the thirteenth embodiment prevents resonance from occurring in the on-duration closed circuit while preventing switching loss of the first U-phase upper-arm switching element SUHA from increasing due to the chip bead element 190.

Fourteenth Embodiment

The following describes drive circuits DrM according to the fourteenth embodiment of the present disclosure with reference to FIGS. 39 to 43. Similar to the first embodiment, the following describes the structure of the drive circuit DrM for the U-phase upper-arm switch module 20UH as a typical example.

The structures and/or functions of the drive circuit DrM according to the fourteenth embodiment are different from those of the drive circuit DrK according to the third embodiment by the following points. So, the following mainly describes the different points, and omits or simplifies descriptions of like parts between the third and fourteenth embodiments, to which identical or like reference characters are assigned, thus eliminating redundant description.

In the drive circuit DrM, the components 62 to 65 and 66a and 66b are eliminated as compared with the structure of the drive circuit DrB illustrated in FIG. 9. The first and second U-phase upper-arm switching elements SUHA and SUHB are comprised of MOSFETs having the same specifications and the same volt-current characteristics illustrated in FIGS. 2A and 2B.

Figure 39:
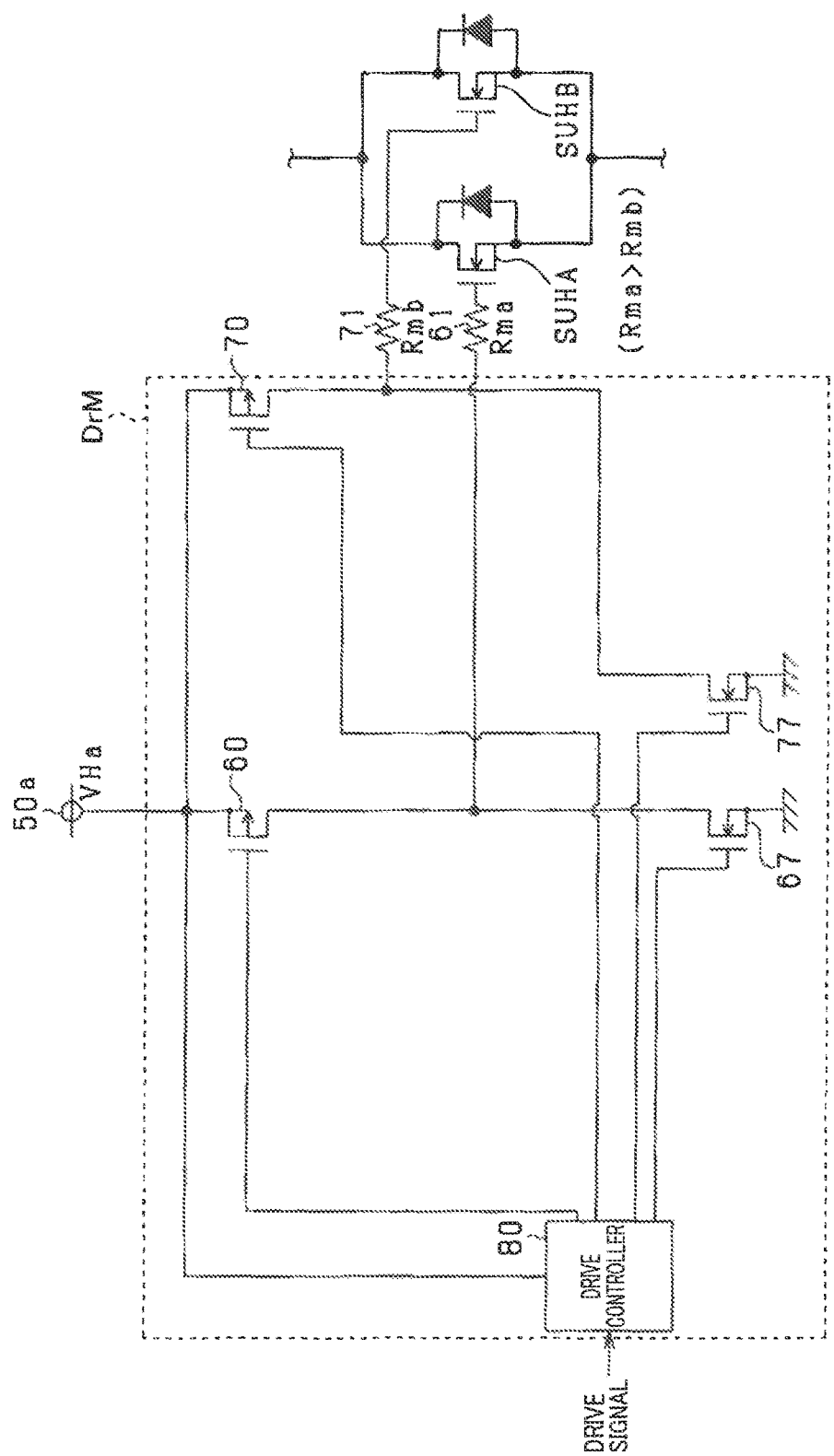
FIG. 39 is a circuit diagram schematically illustrating an example of the structure of a drive circuit for the U-phase upper-arm switch module according to the fourteenth embodiment of the present disclosure.

Referring to FIG. 39, the fourteenth embodiment is configured such that an upper limit of the drain current Id that can flow through the first U-phase upper-arm switching element SUHA and an upper limit of the drain current Id that can flow through the second U-phase upper-arm switching element SUHB are set to be identical to each other when the gate voltage of the corresponding switching element is set to its upper limit corresponding to the output voltage VHa of the constant voltage source 50a. That is, the estimated on resistance of the first U-phase upper-arm switching element SUHA is identical to the estimated on resistance of the second U-phase upper-arm switching element SUHB upon the gate voltage of each switching element being set to its upper limit corresponding to the output voltage VHa of the constant voltage source 50a.

In addition, the first and second switching elements SUHA and SUHB, SULA and SULB, SVHA and SVHB, SVLA and SVLB, SWHA and WHB, and SWLA and SWLB are used to perform synchronous rectification of three-phase alternating-current (AC) power induced in the three-phase stator coils 30U, 30V, and 30W. This generates a DC current to flow as a flyback current to the battery 10 as a direct-current (DC) power source.

The first gate resistor member 61 has a gate resistance value Rma, and the second gate resistor member 71 also has a gate resistance value Rmb set to be lower than the gate resistance value Rma of the first gate resistor member 61.

The drains of the upper-arm switching elements SUHA, SUHB, SVHA, SVHB, SWHA, and SWHB serve as upper-arm input terminals, and the sources of the upper-arm switching elements SUHA, SUHB, SVHA, SVHB, SWHA, and SWHB serve as upper-arm output terminals. Similarly, the drains of the lower-arm switching elements SULA, SULB, SVLA, SVLB, SWLA, and SWLB serve as lower-arm input terminals, and the sources of the lower-arm switching elements SULA, SULB, SVLA, SVLB, SWLA, and SWLB serve as lower-arm output terminals.

Each of the upper-arm switching elements SUHA, SUHB, SVHA, SVHB, SWHA, and SWHB and lower-arm switching elements SULA, SULB, SVLA, SVLB, SWLA, and SWLB permits a current to flow therethrough from the drain to the source and from the source and drain while the corresponding switching element is in the on state.

Figure 40:
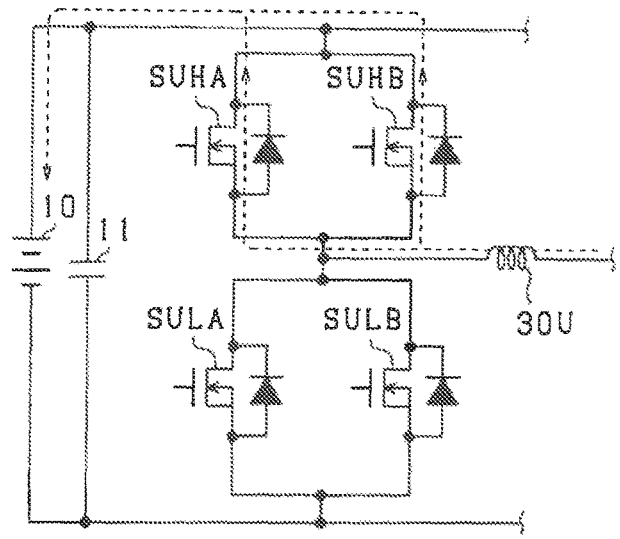
FIG. 40 is a circuit diagram schematically illustrating how a flyback current flows from a U-phase coil to a battery.
Figure 41:
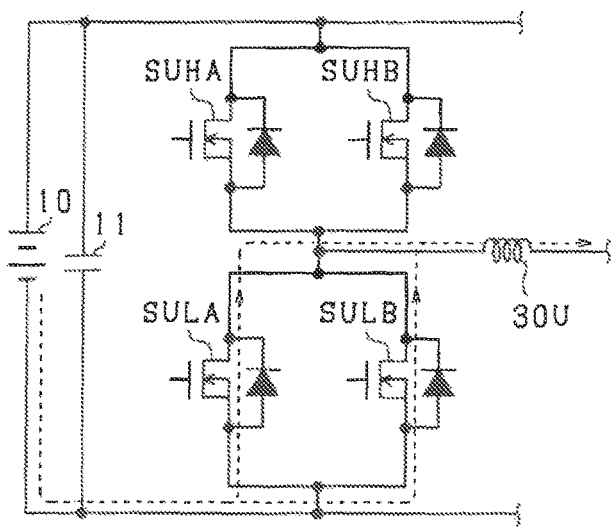
FIG. 41 is a circuit diagram schematically illustrating how a flyback current flows from the battery to the U-phase coil.

FIG. 40 schematically illustrates how a flyback current flows from the U-phase coil 30U to the positive terminal of the battery 10 via the first and second U-phase upper-arm switching elements SUHA and SUHB. FIG. 41 also illustrates how a flyback current flows from the negative terminal of the battery 10 to the U-phase coil 30U via the first and second U-phase upper-arm switching elements SUHA and SUHB.

The following describes how the switching elements of each of the U-, V-, and W-phase are used for synchronous rectification using the first and second U-phase upper-arm and lower-arm switching elements SUHA, SUHB, SULA, and SULB as a typical example.

The following describes how the first and second U-phase upper-arm and lower-arm switching elements SUHA, SUHB, SULA, and SULB are used for synchronous rectification in the case of FIG. 40 using FIGS. 42A to 42F.

FIG. 42A schematically illustrates how the upper-arm drive signals for the switching elements SUHA and SUHB input to a drive controller 80D change over time. FIG. 42B schematically illustrates how the lower-arm drive signals for the switching elements SULA and SULB input to the drive controller 80D change over time. FIGS. 42C to 42F schematically illustrate how the respective U-phase switching elements SUHA, SUHB, SULA, and SULB are driven. FIGS. 42A to 42F can be collectively referred to as FIG. 42.

As illustrated in the example illustrated in FIG. 42, before time t51, the lower-arm switching signal has been set to the on command so that the first and second U-phase lower-arm switching elements SULA and SULB have been turned on. This enables a current to flow from the U-phase coil 30U to the negative terminal of the battery 10 via the first and second U-phase lower-arm switching elements SULA and SULB.

When the lower-arm drive signal is changed to the off command at the time t51, the second U-phase lower-arm switching element SULB is turned off at time t52 after the time t51. Thereafter, the first U-phase lower-arm switching element SULA is turned off at time t53 after the time t52.

Upon a dead time has elapsed since the time t51, the upper-arm drive signal is changed to the on command to start synchronous rectification at time t54.

As described above, the drive controller 80 starts to turn-on drive of the first U-phase upper-arm switching element SUHA, which has the charging rate of the gate thereof lower than the charging rate of the gate of the second U-phase upper-arm switching element SUHB, to thereby change the switching element SUHA to the on state first at time 55. This enables a flyback current to flow from the U-phase coil 30U to the positive terminal of the battery 10 via the first U-phase upper-arm switching element SUHA.

Thereafter, the drive controller 80 starts to turn-on drive of the second U-phase upper-arm switching element SUHB, which has the charging rate of the gate thereof higher than the charging rate of the gate of the first U-phase upper-arm switching element SUHA, to change the corresponding switching element SUHB to the on state next at time 56. This enables a flyback current to flow from the U-phase coil 30U to the positive terminal of the battery 10 via the first and second U-phase upper-arm switching elements SUHA and SUHB as illustrated in FIG. 40.

Thereafter, the upper-arm drive signal is changed to the off command to stop the synchronous rectification at time t57. In response to the off command of the upper-arm drive signal, the drive controller 80 starts to turn-off drive of the second U-phase upper-arm switching element SUHB, which has the charging rate of the gate thereof higher than the charging rate of the gate of the first U-phase upper-arm switching element SUHA, to change the corresponding switching element SUHB to the off state at time 58 first.

After the time t58, the drive controller 80 starts to turn-off drive of the first U-phase upper-arm switching element SUHA, which has the charging rate of the gate thereof lower than the charging rate of the gate of the second U-phase upper-arm switching element SUHB, to change the corresponding switching element SUHA to the off state next at time 59. This disables a flyback current from flowing from the U-phase coil 30U to the positive terminal of the battery 10 through the first and second U-phase upper-arm switching elements SUHA and SUHB.

The following describes how the first and second U-phase upper-arm and lower-arm switching elements SUHA, SUHB, SULA, and SULB are used for synchronous rectification in the case of FIG. 41 using FIGS. 43A to 43F.

FIG. 43A to 43F respectively correspond to FIGS. 42A to 42F.

As illustrated in the example illustrated in FIG. 43, before time t61, the upper-arm switching signal has been set to the on command so that the first and second U-phase upper-arm switching elements SUHA and SUHB have been turned on. This enables a current to flow from the battery 10 to the U-phase coil 30U via the first and second U-phase upper-arm switching elements SUHA and SUHB.

When the upper-arm drive signal is changed to the off command at the time t61, the second U-phase upper-arm switching element SUHB is turned off at time t62 after the time t61. Thereafter, the first U-phase upper-arm switching element SUHA is turned off at time t63 after the time t62.

Upon a dead time has elapsed since the time t61, the lower-arm drive signal is changed to the on command to start synchronous rectification at time t64.

As described above, the drive controller 80 starts to turn-on drive of the first U-phase lower-arm switching element SULA, which has the charging rate of the gate thereof lower than the charging rate of the gate of the second U-phase lower-arm switching element SULB, to thereby change the switching element SULA to the on state first at time 35. This enables a flyback current to flow from the battery 10 to the U-phase coil 30U via the first U-phase lower-arm switching element SULA.

Thereafter, the drive controller 80 starts to turn-on drive of the second U-phase lower-arm switching element SULB, which has the charging rate of the gate thereof higher than the charging rate of the gate of the first U-phase upper-arm switching element SULA, to change the corresponding switching element SULB to the on state next at time t66. This enables a flyback current to flow from the battery 10 to the U-phase coil 30U via the first and second U-phase lower-arm switching elements SULA and SULB as illustrated in FIG. 41.

Thereafter, the lower-arm drive signal is changed to the off command to stop the synchronous rectification at time t67. In response to the off command of the lower-arm drive signal, the drive controller 80 starts to turn-off drive of the second U-phase lower-arm switching element SULB, which has the charging rate of the gate thereof higher than the charging rate of the gate of the first U-phase lower-arm switching element SULA, to change the corresponding switching element SULB to the off state at time t68 first.

After the time t68, the drive controller 80 starts to turn-off drive of the first U-phase lower-arm switching element SULA, which has the charging rate of the gate thereof lower than the charging rate of the gate of the second U-phase lower-arm switching element SULB, to change the corresponding switching element SULA to the off state next at time t69. This disables a flyback current from flowing from the negative terminal of the battery 10 to the U-phase coil 30U through the first and second U-phase lower-arm switching elements SULA and SULB.

The drive circuit DrM achieves, in addition to the same advantageous effects as those achieved by the drive circuit DrB according to the third embodiment, an advantageous effect of enabling the drive circuits DrM to perform synchronous rectification of the three-phase AC power.

Fifteenth Embodiment

Figure 44:
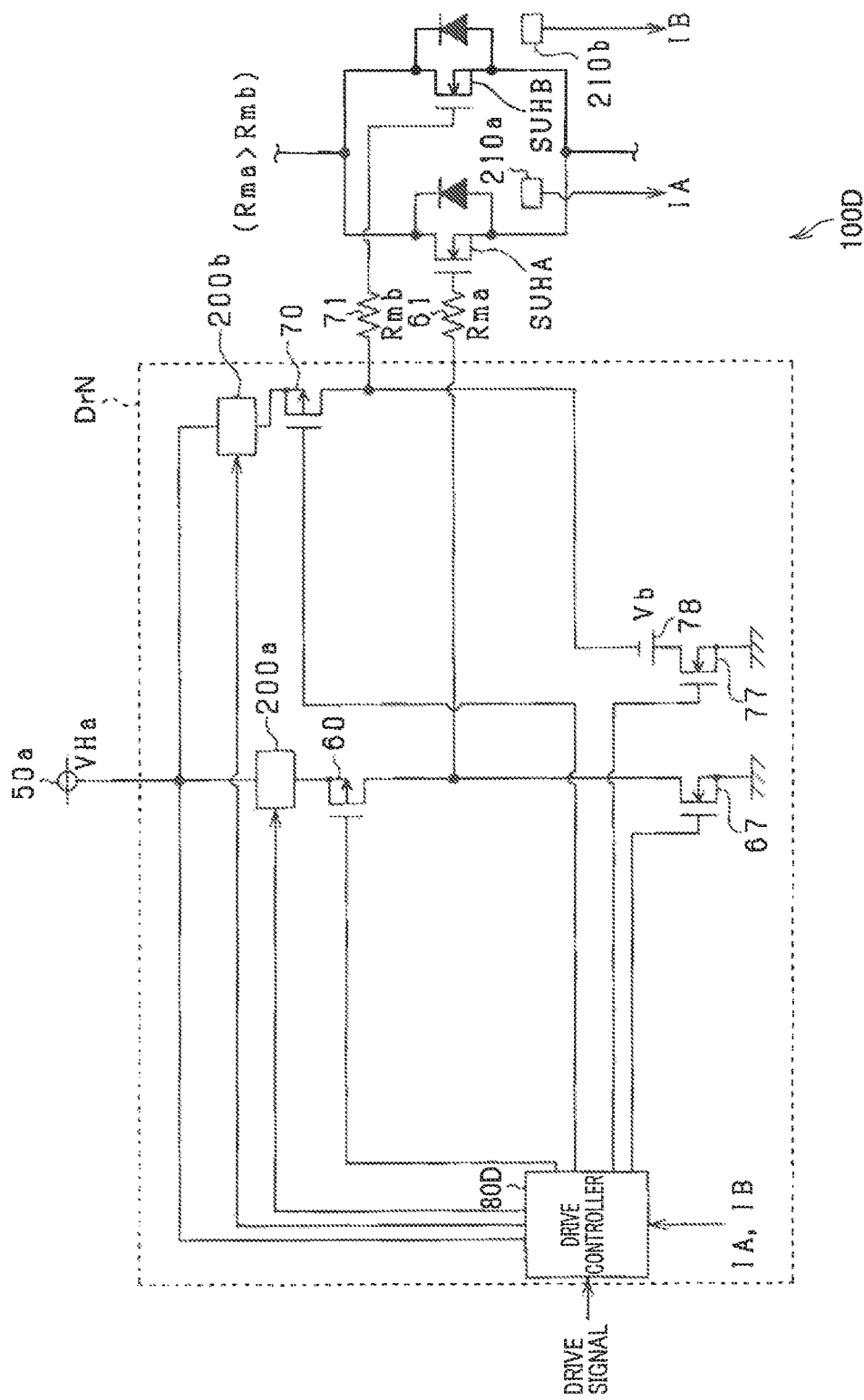
FIG. 44 is a circuit diagram schematically illustrating an example of the structure of a drive circuit for the U-phase upper-arm switch module according to the fifteenth embodiment of the present disclosure.
Figure 45:
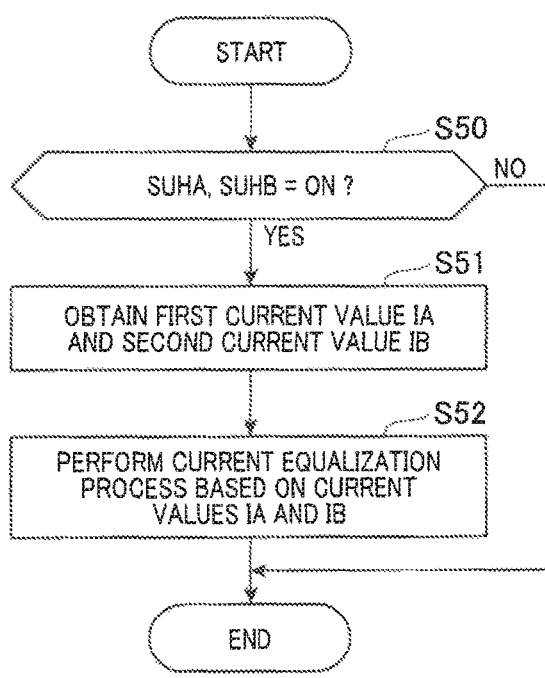
FIG. 45 is a flowchart schematically illustrating an example of a current equalization task according to the fifteenth embodiment.

The following describes drive circuits DrN in a control system 100D according to the fifteenth embodiment of the present disclosure with reference to FIGS. 44 and 45.

Similar to the first embodiment, the following describes the structure of the drive circuit DrN for the U-phase upper-arm switch module 20UH as a typical example.

The structures and/or functions of the drive circuit DrN according to the fifteenth embodiment are different from those of the drive circuit DrM according to the fourteenth embodiment by the following points. So, the following mainly describes the different points, and omits or simplifies descriptions of like parts between the fourteenth and fifteenth embodiments, to which identical or like reference characters are assigned, thus eliminating redundant description.

The drive circuit DrN according to the fifteenth embodiment is configured to equalize the drain current Id flowing through the first U-phase upper-arm switching element SUHA and the drain current Id flowing through the second U-phase upper-arm switching element SUHB to each other while the switching elements SUHA and SUHB are the on state.

FIG. 44 schematically illustrates the drive circuit DrN for the U-phase upper-arm switch module 20UH.

In addition to the structure of the drive circuit DrM illustrated in FIG. 39, the drive circuit DrN includes a first voltage adjuster 200a and a second voltage adjuster 200b. Each of the first and second voltage adjusters 200a and 200b has an input terminal, an output terminal, and a control terminal. The input terminal of each of the first and second voltage adjusters 200a and 200b is connected to the constant voltage source 50a. The output terminal of the first voltage adjuster 200a is connected to the input terminal of the first charging switching element 60, and the output terminal of the second voltage adjuster 200b is connected to the input terminal of the second charging switching element 70. The control terminal of each of the first and second voltage adjusters 200a and 200b is connected to a drive controller 80D of the drive circuit DrN.

Each of the first and second voltage adjusters 200a and 200b is operative to adjust the output voltage VHa of the constant voltage source 50a to a variably controllable output voltage. That is, the drive controller 80D controls each of the first and second voltage adjusters 200a and 200b to change the output voltage of the corresponding one of the first and second voltage adjusters 200a and 200b. The output voltage of each of the first and second voltage adjusters 200a and 200b is supplied to the input terminal of the corresponding one of the first and second charging switching elements 60 and 70.

The control system 100D according to the fifteenth embodiment includes a first current detector 210a for detecting the drain current Id flowing through the first U-phase upper-arm switching element SUHA, and a second current detector 210b for detecting the drain current Id flowing through the second U-phase upper-arm switching element SUHB. Similar to the current detector 90, each of the first and second current detectors 210a and 210b is comprised of a sense terminal of the corresponding one of the first and second U-phase upper-arm switching elements SUHA and SUHB, and a sense resistor. That is, each of the first and second current detectors 210a and 210b can detect the drain current Id flowing through the corresponding one of the first and second U-phase upper-arm switching elements SUHA and SUHB in the same manner as the current detector 90.

Each of the first and second current detectors 210a and 210b is connected to the drive controller 80D, so that (1) The drain current Id detected by the first current detector 210a is input to the drive controller 80D as a first current value IA (2) The drain current Id detected by the second current detector 210b is input to the drive controller 80D as a second current value IB.

Hereinafter, the drain current Id flowing through the first U-phase upper-arm switching element SUHA will be referred to as a first drain current Id1, and the drain current Id flowing through the second U-phase upper-arm switching element SUHB will be referred to as a second drain current Id2.

The on resistance of the first U-phase upper-arm switching element SUHA is ideally identical to the on resistance of the second U-phase upper-arm switching element SUHB when a voltage, i.e. a gate voltage, is commonly applied to both the gates of the switching elements SUHA and SUHB, so that the first and second drain currents Id1 and Id2, which are estimated to flow through the respective switching elements SUHA and SUHB, are ideally identical to each other.

Unfortunately, there may be an imbalance of the first and second drain currents Id1 and Id2 due to variations in the first and second U-phase upper-arm switching elements SUHA and SUHB. This may cause the amount of heat generated by the first U-phase upper-arm switching element SUHA and the amount of heat generated by the second U-phase upper-arm switching element SUHB to be unbalanced. This may result in the lifetime of one of the first and second U-phase upper-arm switching elements SUHA and SUHB being shorter than the lifetime of the other thereof.

In view of these circumstances, the drive controller 80D is configured to perform a current equalization task based on the first current value IA and the second current value IB.

FIG. 45 illustrates an example of instructions of the current equalization task periodically carried out by the drive controller 80D. Note that a unit execution of the current equalization task will be referred to as a cycle.

In step S50 of a present cycle of the current equalization task, the drive controller 80D determines whether both the first and second U-phase upper-arm switching elements SUHA and SUHB are in the on state.

When it is determined that at least one of the first and second U-phase upper-arm switching elements SUHA and SUHB are not in the on state (NO in step S50), the drive controller 80D terminates the current equalization task.

Otherwise, when it is determined that both the first and second U-phase upper-arm switching elements SUHA and SUHB are in the on state (YES in step S50), the current equalization task proceeds to step S51.

In step S51, the drive controller 80D serves as, for example, a current obtainer to obtain the first current value IA and the second current value IB from the respective first and second current detectors 210a and 210b in the present cycle in step S51.

Then, the drive controller 80D performs, based on the obtained first and second current values IA and IB, a current equalization process that controls, based on the obtained first and second current values IA and IB, the first and second voltage adjusters 200a and 200b such that the first drain current Id1 and the second drain current Id2 are equalized to each other in step S52.

For example, in step S52, the drive controller 80D calculates the difference between the first current value IA and the second current value IB. Then, in step S52, the drive controller 80D causes at least one of the first and second voltage adjusters 200a and 200b to adjust at least one of the gate voltages of the first and second U-phase upper-arm switching elements SUHA and SUHB to thereby zero the calculated difference. This results in, even if there is an imbalance of the first and second drain currents Id1 and Id2, the difference between the first and second drain currents Id1 and Id2 being zero.

After completion of the operation in step S52, the drive controller 80D terminates the current equalization task.

As described above, the drive circuit DrN achieves a specific advantageous effect of reducing, even if there is an imbalance of the first and second drain currents Id1 and Id2, the imbalance of the first and second drain currents Id1 and Id2. The drive controller 80D performs the current equalization task while performing the synchronous rectification described above.

Sixteenth Embodiment

Figure 46:
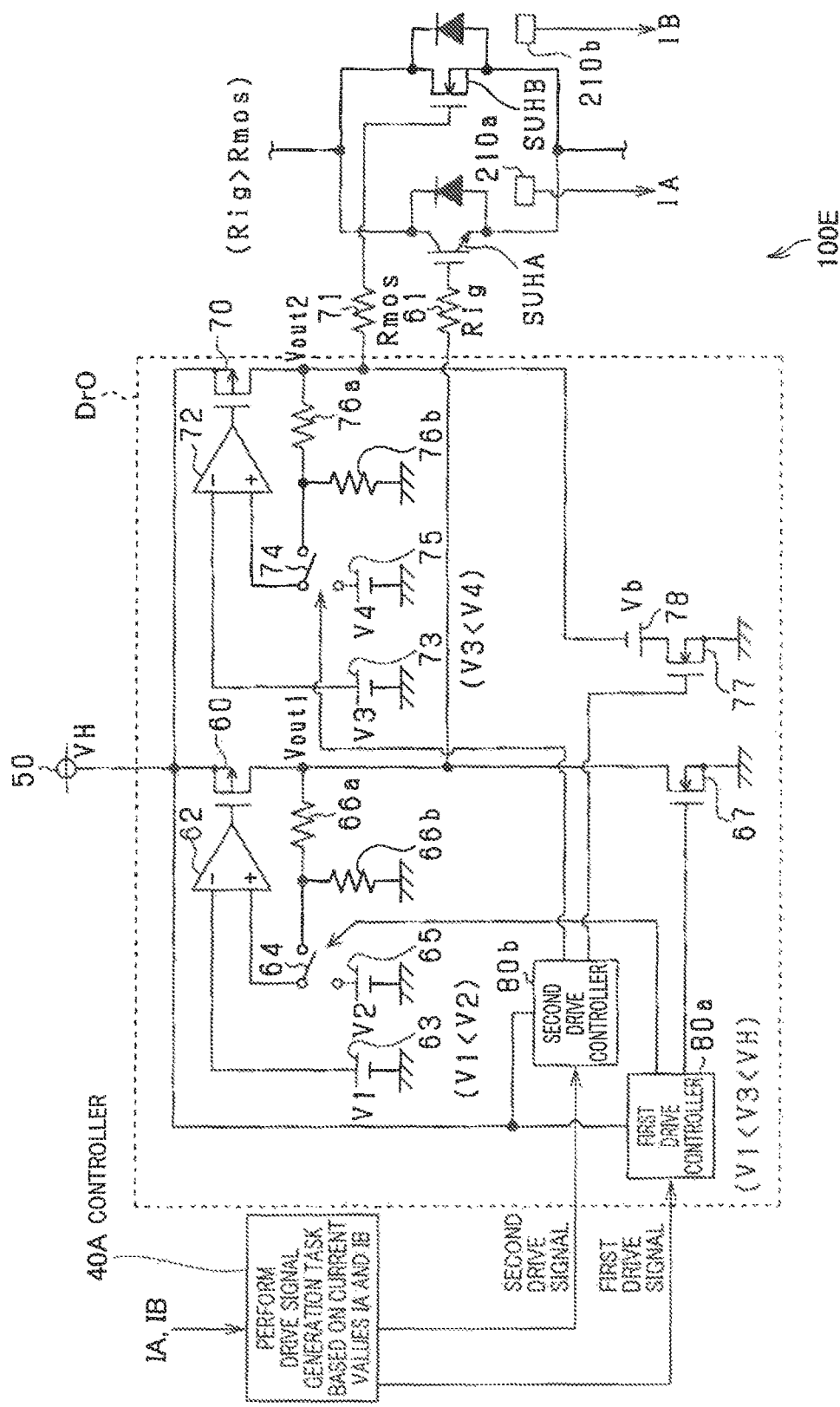
FIG. 46 is a circuit diagram schematically illustrating an example of the structure of a drive circuit for the U-phase upper-arm switch module according to the sixteenth embodiment of the present disclosure.

The following describes drive circuits DrO in a control system 100E according to the sixteenth embodiment of the present disclosure with reference to FIG. 46. Similar to the first embodiment, the following describes the structure of the drive circuit DrO for the U-phase upper-arm switch module 20UH as a typical example.

The structures and/or functions of the drive circuit DrO according to the sixteenth embodiment are different from those of the drive circuit Dr according to the first embodiment by the following points. So, the following mainly describes the different points, and omits or simplifies descriptions of like parts between the first and second embodiments, to which identical or like reference characters are assigned, thus eliminating redundant description.

Referring to FIG. 46, the drive circuit DrO includes the first and second current detectors 210a and 210b described in the fifteenth embodiment, and first and second drive controllers 80a and 80b in place of the drive controller 80.

The control system 100E includes, in place of the controller 40, a controller 40A. In particular, the first and second current detectors 210a and 210b are connected to the controller 40A via the unillustrated isolation device, such as a photocoupler set forth above, so that the first current value IA and the second current value IB are input to the controller 40A via the isolation device.

For example, the controller 40A obtains the first current value IA and the second current value IB from the respective first and second current detectors 210a and 210b of each of the drive circuits DrO.

Next, the controller 40A performs a drive signal generation task to generate, based on the first and second current values IA and IB sent from the respective first and second current detectors 210a and 210b of each of the drive circuits DrO, three-phase command voltages, which have a phase difference of 120 electrical degrees from each other.

Then, the controller 40A performs a known PWM task set forth above, which compares in magnitude the generated three-phase command voltages with a periodical carrier signal, such as a periodical triangular carrier signal. Then, the controller 40A generates, according to the compared results, a first drive signal for driving the first U-phase upper-arm switching element SUHA and a second drive signal for driving signal for driving the second U-phase upper-arm switching element SUHB. Each of the first and second drive signals is, for example, designed as a pulse voltage signal with a controllable duty, i.e. a controllable on-pulse width for each switching cycle matching with the cycle of the carrier signal.

In particular, the controller 40A according to the sixteenth embodiment is configured to select, as its drive target, at least one of the first U-phase upper-arm switching element SUHA and the second U-phase upper-arm switching element SUHB based on the first and second current values IA and IB in the same manner as the fourth embodiment (see FIGS. 11A and 11B). That is, the controller 40A sends the first drive signal to the first drive controller 80a when selecting at least the first U-phase upper-arm switching element SUHA as its drive target, and sends the second drive signal to the second drive controller 80b when selecting at least the second U-phase upper-arm switching element SUHB as its drive target.

The first drive controller 80a performs, based on the first drive signal sent thereto, the charging task to change the first U-phase upper-arm switching element SUHA from the off state to the on state when the first drive signal represents the on command. Otherwise, the first drive controller 80a performs, based on the first drive signal sent thereto, the discharging task to change the first U-phase upper-arm switching element SUHA from the on state to the off state when the first drive signal represents the off command.

Similarly, the second drive controller 80b performs, based on the second drive signal sent thereto, the charging task to change the second U-phase upper-arm switching element SUHB from the off state to the on state when the second drive signal represents the on command. Otherwise, the second drive controller 80b performs, based on the second drive signal sent thereto, the discharging task to change the second U-phase upper-arm switching element SUHB from the on state to the off state when the second drive signal represents the off command.

As described above, the controller 40A is configured to generate, based on the first and second current values IA and IB sent from the respective first and second current detectors 210a and 210b of each of the drive circuits DrO, the three-phase command voltages. The controller 40A can estimate, based on the three-phase currents flowing in the motor-generator 30, a future current that will flow through each of the first and second U-phase upper-arm switching elements SUHA and SUHB in the next control period without the need to obtain actual values of the first and second currents IA and IB in each control period. This results in no need to set the control period of the current flowing through each of the first and second U-phase upper-arm switching elements to an excessively shorter value as compared with the configuration where the drive circuit DrO drives the first and second U-phase upper-arm switching elements SUHA and SUHB while obtaining the first and second current values IA and IB.

Each of the switch modules 20UH to 20WL, which constitute the inverter 20, has the configuration illustrated in FIG. 46. That is, the drive controller 40A according to the sixteenth embodiment is configured to generate, based on dead times between the upper- and lower-arm switching elements for each phase, the first and second drive signals for the switching elements of each of the switch modules 20UH to 20WL. For example, the first and second drive signals for the first and second upper-arm switching elements for each phase serve as first and second upper-arm drive signals, and the first and second drive signals for the first and second lower-arm switching elements for each phase serve as first and second lower-arm drive signals.

This further reliably prevents the first and second upper-arm switching elements for each phase from being short-circuited to the first and second lower-arm switching elements for the corresponding phase.

Modifications

The present disclosure is not limited to the above embodiments, and therefore the above embodiments can be freely combined with each other or variably modified within the scope of the present disclosure.

Each of the first to thirteenth embodiments and the sixth embodiment is configured such that each switch module is comprised of first and second switching elements connected in parallel to each other, such as the U-phase upper-arm switch module 20UH is comprised of the first U-phase upper-arm switching element SUHA and the second U-phase upper-arm switching element SUHB connected in parallel to each other. The present disclosure is however not limited to this configuration. Specifically, each switch module can be comprised of three or more switching elements connected in parallel to each other. For example, each switch module can be comprised of two IGBTs and one MOSFET connected in parallel to each other.

When each switch module can be comprised of at least three switching elements connected in parallel to each other, the switch module can be configured to simultaneously change at least two switching elements in the at least three switching elements from one of the on state and the off state to the other thereof earlier than the remaining at least one switching element. Similarly, the switch module can be configured to simultaneously change at least two switching elements in the at least three switching elements from one of the on state and the off state to the other thereof later than the remaining at least one switching element.

Let us consider a first modification where each switch module can be comprised of first and second IGBTs and at least one MOSFET connected in parallel to each other. In this first modification, each switch module can be configured to successively change the first and second IGBTs from one of the on state and the off state to the other thereof. For example, each switch module according to the first modification can be configured to set the charging rate of the gate of the first IGBT, which is to be turned on later, to be faster than the charging rate of the gate of the second IGBT, which is to be turned on earlier.

For example, as described in the first embodiment, the first and second gate resistor members 61 and 71 serve as, for example, a rate adjuster to adjust the moving rate of charge to or from the gate of at least one of the first and second U-phase upper-arm switching elements SUHA and SUHB, but the present disclosure is not limited thereto.

Specifically, the drive controller 80 includes, for example, a rate changer F2 expressed by phantom lines in FIG. 3. The rate changer F2 adjusts the voltage applied to the gate of at least one of the first and second U-phase upper-arm switching elements SUHA and SUHB to adjust the moving rate of charge to the gate of at least one of the first and second U-phase upper-arm switching elements SUHA and SUHB. Similarly, the rate changer F2 adjusts the discharge target voltage, to which the gate of at least one of the first and second U-phase upper-arm switching elements SUHA and SUHB is discharged to decrease, to adjust the moving rate of charge from the gate of at least one of the first and second U-phase upper-arm switching elements SUHA and SUHB.

For example, as illustrated in FIG. 3, the higher the voltage applied to the gate of at least one of the first and second U-phase upper-arm switching elements SUHA and SUHB based on an increase of the first feedback voltage Vout1 is, the charging rate of the gate of the at least one of the first and second U-phase upper-arm switching elements SUHA and SUHB can be. Additionally, the lower the discharge target voltage for the gate of at least one of the first and second U-phase upper-arm switching elements SUHA and SUHB is, the discharging rate from the gate of the at least one of the first and second U-phase upper-arm switching elements SUHA and SUHB can be. For example, the higher the magnitude of the negative voltage output from the bias power source 78 is, the lower the discharge target voltage for the gate of the second U-phase upper-arm switching element SUHB can be.

Each of the first to thirteenth embodiments can be configured to perform at least one of (1) An increase of the charging rate of the gate of the second U-phase upper-arm switching element SUHB relative to the charging rate of the gate of the first U-phase upper-arm switching element SUHA (2) An increase of the discharging rate from the gate of the second U-phase upper-arm switching element SUHB relative to the discharging rate from the gate of the first U-phase upper-arm switching element SUHA.

The resistance value of the first divider resistor 141 and the resistance value of the second divider resistor 142 according to the seventh embodiment can be different from each other.

The seventh embodiment can be modified to have the configuration that each switch module is comprised of at least first to third switching elements connected in parallel to each other.

In this modified seventh embodiment, the drive controller 80 can be configured to obtain at least a divided voltage between the first charge target voltage for the first switching element and the second charge target voltage for the second switching element. This enables whether there is an electrical fault in the drive circuit DrF while the drive signal represents the on command to be determined based on the obtained divided voltage.

Similarly, in this modified seventh embodiment, the drive controller 80 can be configured to obtain at least a divided voltage between the first discharge target voltage for the first switching element and the second discharge target voltage for the second switching element. This enables to whether there is an electrical fault in the drive circuit DrF while the drive signal represents the off command to be determined based on the obtained divided voltage.

The drive circuit DrF according to the seventh embodiment can be configured not to perform one of the electrical fault determination task illustrated in FIG. 20 and the electrical fault determination task illustrated in FIG. 22.

There is no need to provide the temperature sensor 150 in the control system 100B of the eighth embodiment and also no need to provide the temperature sensor 150 in the control system 100C of the ninth embodiment. That is, the overheat protector 151 according to the modified eighth embodiment can be configured to calculate the temperature of the second U-phase upper-arm switching element SUHB as a function of, for example, predetermined temperature characteristics of the second U-phase upper-arm switching element SUHB. Similarly, the overheat protector 152 according to the modified ninth embodiment can be configured to calculate the temperature of the first U-phase upper-arm switching element SUHA as a function of, for example, predetermined temperature characteristics of the first U-phase upper-arm switching element SUHA.

For example, predetermined relationship information between a voltage parameter associated with the threshold voltage of each of the first and second U-phase upper-arm switching elements SUHA and SUHB and the temperature of the corresponding one of the switching elements SUHA and SUHB can be used as the temperature characteristics of the corresponding one of the switching elements SUHA and SUHB. That is, the higher the temperature of a semiconductor switching element, such as an IGBT or a MOSFET, is, the lower the threshold voltage of the semiconductor switching element is.

That is, each of the overheat protectors 151 and 152 can be configured to monitor the gate voltage of the corresponding one of the switching elements SUHB and SUHA to obtain, as the voltage parameter, a Miller voltage of the corresponding one of the switching elements SUHB and SUHA. Then, each of the overheat protectors 151 and 152 can be configured to obtain the temperature of each of the switching elements SUHB and SUHA as a function of the corresponding relationship information and the obtained Miller voltage of the corresponding one of the switching elements SUHB and SUHA.

As another example, predetermined relationship information between the rate of change of each of drain current Id and the collector current Ic and the temperature of the corresponding one of the switching elements SUHB and SUHA can be used as the temperature characteristics of the corresponding one of the switching elements SUHB and SUHA. That is, the lower the temperature of a semiconductor switching element, such as an IGBT or a MOSFET, is, the higher the rage of change of the drain or corrector current flowing through the semiconductor switching element is.

That is, each of the overheat protectors 151 and 152 can be configured to monitor the rate of change of the corresponding one of the drain current Id and the collector current Ic. Then, each of the overheat protectors 151 and 152 can be configured to obtain the temperature of each of the switching elements SUHB and SUHA as a function of the corresponding relationship information and the obtained rate of change of the corresponding one of the drain current Id and the collector current Ic.

The structure of the drive circuit DrF according to the seventh embodiment can be applied to the drive circuit DrO according to the eighth embodiment or the drive circuit DrH according to the ninth embodiment.

The drive circuit Dr of the first embodiment is configured to step down the output voltage VH of the constant voltage source 50, thus applying the stepped-down voltage to the gate of the second U-phase upper-arm switching element SUHB, but the present disclosure is not limited thereto.

Specifically, the drive circuit Dr can be configured to step up the output voltage VH of the constant voltage source 50, thus applying the stepped-up voltage to the gate of the second U-phase upper-arm switching element SUHB.

The drive circuit Dr according to the first embodiment can be mounted to a circuit board except that the first and second charging switching elements 60a and 70 and the first and second discharging switching elements 67 and 77 can be provided out of the circuit board. This modification results in a lower amount of heat generated in the circuit board of the drive circuit Dr.

An additional gate capacitor can be connected between the gate and source of the second U-phase upper-arm switching element SUHB according to the tenth embodiment.

Each of the tenth to twelfth embodiments can use the constant current control for charging the gate of each of the first and second U-phase upper-arm switching elements SUHA and SUHB in place of the constant voltage control.

The chip bead element 180 can be provided between the first off-hold switching element 120 and the emitter of the first U-phase upper-arm switching element SUHA on the first off-hold path.

In step S33, the overheat protector 151 can be configured to increase the gate voltage Vge of the first U-phase upper-arm switching element SUHA in place of reducing the gate voltage Vgs of the second U-phase upper-arm switching element SUHB upon the affirmative determination in step S31.

This modification reduces the on resistance of the first U-phase upper-arm switching element SUHA to thereby increase an amount of the collector current Ic flowing through the first U-phase upper-arm switching element SUHA. This results in a smaller amount of the drain current Id flowing through the second U-phase upper-arm switching element SUHB, thus preventing the second U-phase upper-arm switching element SUHB from overheating.

In step S43, the overheat protector 151 can be configured to reduce the gate voltage Vgs of the second U-phase upper-arm switching element SUHB in place of increasing the gate voltage Vge of the first U-phase upper-arm switching element SUHA upon the affirmative determination in step S41.

This modification increases the on resistance of the first U-phase upper-arm switching element SUHA to thereby reduce an amount of the collector current Ic flowing through the first U-phase upper-arm switching element SUHA. This prevents the first U-phase upper-arm switching element SUHA from overheating.

The first threshold voltage Vth1 can be set to be lower than the second threshold voltage Vth2. When this modification is applied to the eleventh embodiment, a gate capacitor can be provided for only the first U-phase upper-arm switching element SUHA. When this modification is applied to the twelfth embodiment, a chip bead element can be provided for only the second U-phase upper-arm switching element SUHB.

Each switch module of each of the first to thirteenth embodiments can be comprised of a combination of two or more switching elements except for the combination of at least one IGBT and at least one MOSFET.

In each of the first to thirteenth embodiments, the motor-generator 30 is not limited to a permanent magnet synchronous motor, but can be designed as, for example, a wound-field synchronous motor or synchronous reluctance motor. In addition, the motor-generator 30 is not limited to a synchronous motor, but can be designed as another rotary electric machine, such as an induction rotary electric machine. The motor-generator 30 is not limited to serving as a main engine of vehicles. Specifically, the motor-generator 30 can serve as an assist motor of electrical power steering systems or as a motor constituting an electric compressor for air conditioning.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

The invention claimed is:

1. A method of driving at least one set of at least first and second switching elements connected in parallel to each other, each of the first and second switching elements having an on-off control terminal, the method comprising:
   using a drive state changer:
      moving first electrical charge to or from the on-off control terminal of the first switching element to change the first switching element from one of an on state and an off state to the other thereof, and
      moving second electrical charge to or from the on-off control terminal of the second switching element to change the second switching element from one of the on state and the off state to the other thereof; and
   using a rate adjuster:
      adjusting a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next; and
      adjusting the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next.

2. The method according to claim 1, further comprising:
   using the drive state changer:
      moving the first electrical charge to the on-off control terminal of the first switching element to charge the on-off control terminal of the first switching element, thus performing a charging task to change the first switching element from the off state to the on state, and
      moving the second electrical charge to the on-off control terminal of the second switching element to charge the on-off control terminal of the second switching element, thus performing the charging task to change the second switching element from the off state to the on state; and
   using the rate adjuster:
      adjusting the rate of movement of the second electrical charge to be faster than the rate of movement of the first electrical charge when the drive state changer changes the first switching element from the off state to the on state first, and changes the second switching element from the off state to the on state next.

3. The method according to claim 2, wherein:
   the at least one set of the at least first and second switching elements comprises:
      a first set of the at least first and second switching elements connected in parallel to each other, the first and second switching elements of the first set being referred to as first and second upper-arm switching elements; and
      a second set of the at least first and second switching elements connected in parallel to each other, the first and second switching elements of the second set being referred to as first and second lower-arm switching elements,
   each of the first upper- and lower-arm switching elements having a first upper limit of a first current enabled to flow therethrough, each of the second upper- and lower-arm switching elements having a second upper limit of a second current enabled to flow therethrough, the second upper limit being smaller than the first upper limit; and
   the method further comprises, using the rate adjuster:
      adjusting the rate of movement of the second electrical charge for the second upper-arm switching element to be faster than the rate of movement of the first electrical charge for the first upper-arm switching element when the drive state changer changes the first upper-arm switching element from the off state to the on state first, and changes the second upper-arm switching element from the off state to the on state next; and
      adjusting the rate of movement of the second electrical charge for the second lower-arm switching element to be faster than the rate of movement of the first electrical charge for the second lower-arm switching element when the drive state changer changes the first lower-arm switching element from the off state to the on state first, and changes the second lower-arm switching element from the off state to the on state next.

4. A drive circuit for driving at least one of: first and second upper-arm switching elements connected in parallel to each other, and first and second lower arm switching elements connected in parallel to each other, each of the switching elements having an on-off control terminal, a first upper limit of a first current enabled to flow therethrough, and a second upper limit of a second current enabled to flow therethrough, the second upper limit being smaller than the first upper limit, the drive circuit comprising:
   a drive state changer configured to:
      move first electrical charge to or from the on-off control terminal of the first switching element to change the first switching element from one of an on state and an off state to the other thereof,
      move second electrical charge to or from the on-off control terminal of the second switching element to change the second switching element from one of the on state and the off state to the other thereof,
      move the first electrical charge to the on-off control terminal of the first switching element to charge the on-off control terminal of the first switching element, thus performing a charging task to change the first switching element from the off state to the on state,
      move the second electrical charge to the on-off control terminal of the second switching element to charge the on-off control terminal of the second switching element, thus performing the charging task to change the second switching element from the off state to the on state, and
      select one of a dual drive mode and a single drive mode, the dual drive mode being configured to drive both the first and second upper-arm switching elements and drive both the first and second lower-arm switching elements, the single drive mode being configured to drive only the second upper-arm switching element and drive only the second lower-arm switching element; and a rate adjuster configured to:
adjust a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next, adjust the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next, adjust the rate of movement of the second electrical charge to be faster than the rate of movement of the first electrical charge when the drive state changer changes the first switching element from the off state to the on state first, and changes the second switching element from the off state to the on state next, adjust the rate of movement of the second electrical charge for the second upper-arm switching element to be faster than the rate of movement of the first electrical charge for the first upper-arm switching element when the drive state changer changes the first upper-arm switching element from the off state to the on state first, and changes the second upper-arm switching element from the off state to the on state next, adjust the rate of movement of the second electrical charge for the second lower-arm switching element to be faster than the rate of movement of the first electrical charge for the second lower-arm switching element when the drive state changer changes the first lower-arm switching element from the off state to the on state first, and changes the second lower-arm switching element from the off state to the on state next, and cause the rate of movement of the second electrical charge for charging each of the second upper- and lower-arm switching elements when the single drive mode is selected to be lower than the rate of movement of the second electrical charge for charging each of the second upper- and lower-arm switching elements when the dual drive mode is selected.

5. A drive circuit for driving at least one of: first and second upper-arm switching elements connected in parallel to each other, and first and second lower arm switching elements connected in parallel to each other, each of the switching elements having an on-off control terminal, a first upper limit of a first current enabled to flow therethrough, and a second upper limit of a second current enabled to flow therethrough, the second upper limit being smaller than the first upper limit, the drive circuit comprising:

a drive state changer configured to:
move first electrical charge to or from the on-off control terminal of the first switching element to change the first switching element from one of an on state and an off state to the other thereof, move second electrical charge to or from the on-off control terminal of the second switching element to change the second switching element from one of the on state and the off state to the other thereof, move the first electrical charge to the on-off control terminal of the first switching element to charge the on-off control terminal of the first switching element, thus performing a charging task to change the first switching element from the off state to the on state, move the second electrical charge to the on-off control terminal of the second switching element to charge the on-off control terminal of the second switching element, thus performing the charging task to change the second switching element from the off state to the on state, and select one of a dual drive mode and a first drive mode, the dual drive mode being configured to drive both the first and second upper-arm switching elements and drive both the first and second lower-arm switching elements, the first drive mode being configured to drive only the first upper-arm switching element and drive only the first lower-arm switching element; and a rate adjuster configured to:
adjust a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next, adjust the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next, adjust the rate of movement of the second electrical charge to be faster than the rate of movement of the first electrical charge when the drive state changer changes the first switching element from the off state to the on state first, and changes the second switching element from the off state to the on state next, adjust the rate of movement of the second electrical charge for the second upper-arm switching element to be faster than the rate of movement of the first electrical charge for the first upper-arm switching element when the drive state changer changes the first upper-arm switching element from the off state to the on state first, and changes the second upper-arm switching element from the off state to the on state next, adjust the rate of movement of the second electrical charge for the second lower-arm switching element to be faster than the rate of movement of the first electrical charge for the second lower-arm switching element when the drive state changer changes the first lower-arm switching element from the off state to the on state first, and changes the second lower-arm switching element from the off state to the on state next, and cause the rate of movement of the first electrical charge for charging each of the first upper- and lower-arm switching elements when the first drive mode is selected to be lower than the rate of movement of the first electrical charge for charging each of the first upper- and lower-arm switching elements when the dual drive mode is selected.

6. The method according to claim 2, wherein:

the first switching element has a first upper limit of a first current enabled to flow therethrough;

the second switching element has a second upper limit of a second current enabled to flow therethrough, the second upper limit being smaller than the first upper limit; and the method further comprises, using the drive state changer:

applying a first voltage to the on-off control terminal of the first switching element to charge the on-off control terminal of the first switching element, thus performing the charging task to change the first switching element from the off state to the on state, and applying a second voltage to the on-off control terminal of the second switching element to charge the on-off control terminal of the second switching element, thus performing the charging task to change the second switching element from the off state to the on state, the second voltage applied to the on-off control terminal of the second switching element being higher than the first voltage applied to the on-off control terminal of the first switching element.

7. The method according to claim 6, further comprising, using the drive state changer:

stepping down an output voltage of a predetermined power source to apply the stepped down output voltage as the first voltage to the on-off control terminal of the first switching element to charge the on-off control terminal of the first switching element, thus performing the charging task to change the first switching element from the off state to the on state, and applying the second voltage, the output voltage of the predetermined power source to the on-off control terminal of the second switching element to charge the on-off control terminal of the second switching element, thus performing the charging task to change the second switching element from the off state to the on state.

8. The method according to claim 2, further comprising, using the drive state changer:

applying a first voltage to the on-off control terminal of the first switching element to charge the on-off control terminal of the first switching element using constant current control, thus performing the charging task to change the first switching element from the off state to the on state, and applying a second voltage to the on-off control terminal of the second switching element to charge the on-off control terminal of the second switching element using constant voltage control, thus performing the charging task to change the second switching element from the off state to the on state.

9. The method according to claim 2, further comprising, using the drive state changer:

applying an output voltage of a common power source to the on-off control terminal of the first switching element to charge the on-off control terminal of the first switching element, thus performing the charging task to change the first switching element from the off state to the on state, and applying the output voltage of the common power source to the on-off control terminal of the second switching element to charge the on-off control terminal of the second switching element, thus performing the charging task to change the second switching element from the off state to the on state.

10. The method according to claim 2, wherein:

the at least one set of the at least first and second switching elements comprises:

a first set of the at least first and second switching elements connected in parallel to each other, the first and second switching elements of the first set being referred to as first and second upper-arm switching elements; and a second set of the at least first and second switching elements connected in parallel to each other, the first and second switching elements of the second set being referred to as first and second lower-arm switching elements;

the first set of the first and second upper-arm switching elements and the second set of the first and second lower-arm switching elements are connected between a direct-current power source having positive and negative terminals and a coil;

each of the first and second upper-arm switching elements has an input terminal and an output terminal;

each of the first and second lower-arm switching elements has an input terminal and an output terminal;

the input terminal of each of the first and second upper-arm switching elements is connected to the positive terminal of the direct-current battery;

the output terminal of each of the first and second upper-arm switching elements is connected to the coil and the input terminal of a corresponding one of the first and second lower-arm switching elements;

the output terminal of each of the first and second upper-arm switching elements is connected to the negative terminal of the direct-current power source;

each of the first and second upper-arm switching elements is configured to permit a current to flow therethrough between the input terminal and the output terminal when being in the on state;

each of the first and second lower-arm switching elements is configured to permit a current to flow therethrough between the input terminal and the output terminal when being in the on state; and the method further comprises, using the rate adjuster:

adjusting the rate of movement of the second electrical charge for the second upper-arm switching element to be faster than the rate of movement of the first electrical charge for the first upper-arm switching element when a first flyback current flows from the coil to the positive terminal of the direct-current power source via the first and second upper-arm switching elements; and adjusting the rate of movement of the second electrical charge for the second lower-arm switching element to be faster than the rate of movement of the first electrical charge for the first lower-arm switching element when a second flyback current flows from the negative terminal of the direct-current power source to the coil via the first and second lower-arm switching elements.

11. A drive circuit for driving at least one set of at least first and second switching elements connected in parallel to each other, each of the first and second switching elements having an on-off control terminal, each of the first and second switching elements having an input terminal and an output terminal, the drive circuit comprising:
  a gate capacitor connected between the on-off control terminal and the output terminal of at least one of the first switching element and the second switching element;
  a drive state changer configured to:
    move first electrical charge to or from the on-off control terminal of the first switching element to change the first switching element from one of an on state and an off state to the other thereof, and
    move second electrical charge to or from the on-off control terminal of the second switching element to change the second switching element from one of the on state and the off state to the other thereof; and
  a rate adjuster configured to:
    adjust a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next; and
    adjust the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next.

12. The drive circuit according to claim 11, wherein the gate capacitor is connected between the on-off control terminal and the output terminal of the first switching element.

13. The drive circuit according to claim 12, wherein the gate capacitor is connected between the on-off control terminal and the output terminal of only the first switching element.

14. The drive circuit according to claim 11, further comprising:
  a first off-hold path that short-circuits the on-off control terminal and the output terminal of the first switching element;
  a second off-hold path that short-circuits the on-off control terminal and the output terminal of the second switching element;
  a first off-hold switching element provided in the first off-hold path; and
  a second off-hold switching element provided in the second off-hold path, the first switching element having a first threshold voltage, the second switching element having a second threshold voltage, the first threshold voltage being different from the second threshold voltage,
wherein:
  the drive state changer:
    move the first electrical charge from the on-off control terminal of the first switching element to discharge the on-off control terminal of the first switching element, thus performing a discharging task to change the first switching element from the on state to the off state;
    move the second electrical charge from the on-off control terminal of the second switching element to discharge the on-off control terminal of the second switching element, thus performing the discharging task to change the second switching element from the on state to the off state;
    turn on the first off-hold switching element when the discharging task is carried out so that a voltage at the on-off control terminal of the first switching element is equal to or lower than the first threshold voltage; and
    turn on the second off-hold switching element when the discharging task is carried out so that a voltage at the on-off control terminal of the second switching element is equal to or lower than the second threshold voltage; and
  the gate capacitor is connected between the on-off control terminal and the output terminal of a selected one of the first switching element and the second switching element,
  one of the first and second threshold voltages of the selected one of the first switching element and the second switching element being higher than the other of the first and second threshold voltages of the other of the first switching element and the second switching element.

15. A drive circuit for driving at least one set of at least first and second switching elements connected in parallel to each other, each of the first and second switching elements having an on-off control terminal, each of the first and second switching elements having an input terminal and an output terminal, the drive circuit comprising:
  an inductor element connected to the on-off control terminal of least one of the first switching element and the second switching element;
  a drive state changer configured to:
    move first electrical charge to or from the on-off control terminal of the first switching element to change the first switching element from one of an on state and an off state to the other thereof, and
    move second electrical charge to or from the on-off control terminal of the second switching element to change the second switching element from one of the on state and the off state to the other thereof; and
  a rate adjuster configured to:
    adjust a rate of movement of the second electrical charge to be faster than a rate of movement of the first electrical charge when the drive state changer moves the first electrical charge to the on-off control terminal of the first switching element to change the first switching element from the off state to the on state first, and moves the second electrical charge to the on-off control terminal of the second switching element to change the second switching element from the off state to the on state next, and adjust the rate of movement of the second electrical charge to be faster than the rate of movement of the first electrical charge when the drive state changer moves the second electrical charge from the on-off control terminal of the second switching element to change the second switching element from the on state to the off state first, and moves the first electrical charge from the on-off control terminal of the first switching element to change the first switching element from the on state to the off state next.

16. The drive circuit according to claim 15, further comprising:

a first off-hold path that short-circuits the on-off control terminal and the output terminal of the first switching element a second off-hold path that short-circuits the on-off control terminal and the output terminal of the second switching element;

a first off-hold switching element provided in the first off-hold path; and a second off-hold switching element provided in the second off-hold path, the first switching element having a first threshold voltage, the second switching element having a second threshold voltage, the first threshold voltage being different from the second threshold voltage, wherein:

the drive state changer:

move the first electrical charge from the on-off control terminal of the first switching element to discharge the on-off control terminal of the first switching element, thus performing a discharging task to change the first switching element from the on state to the off state;

move the second electrical charge from the on-off control terminal of the second switching element to discharge the on-off control terminal of the second switching element, thus performing a discharging task to change the second switching element from the on state to the off state;

turn on the first off-hold switching element when the discharging task is carried out so that a voltage at the on-off control terminal of the first switching element is equal to or lower than the first threshold voltage; and turn on the second off-hold switching element when the discharging task is carried out so that a voltage at the on-off control terminal of the second switching element is equal to or lower than the second threshold voltage; and the inductor element is provided in a selected one of the first and second off-hold paths, the selected one of the first and second off-hold paths being connected to the on-off control terminal of a selected one of the first and second switching elements, one of the first and second threshold voltages of the selected one of the first and second switching elements being higher than the other of the first and second threshold voltages of the other of the first and second switching elements.

17. The drive circuit according to claim 15, wherein the inductor element is connected to the on-off control terminal of only the second switching element.

18. The method according to claim 1, further comprising:

using the drive state changer:

moving the first electrical charge from the on-off control terminal of the first switching element to discharge the on-off control terminal of the first switching element, thus performing a discharging task to change the first switching element from the on state to the off state, and moving the second electrical charge from the on-off control terminal of the second switching element to discharge the on-off control terminal of the second switching element, thus performing the discharging task to change the second switching element from the on state to the off state; and using the rate adjuster:

adjusting the rate of movement of the second electrical charge to be faster than the rate of movement of the first electrical charge when the drive state changer changes the second switching element from the on state to the off state first, and changes the first switching element from the on state to the off state next.

19. The method according to claim 18, wherein:

the first switching element has a first upper limit of a first current enabled to flow therethrough;

the second switching element has a second upper limit of a second current enabled to flow therethrough, the second upper limit being smaller than the first upper limit; and the method further comprises, using the drive state changer, performing the discharging task to change the first switching element from the on state to the off state after the second switching element has been changed to the off state.

20. The method according to claim 19, further comprising:

using the drive state changer, selecting one of a dual drive mode and a single drive mode, the dual drive mode being configured to drive both the first and second switching elements, the single drive mode being configured to drive only the second switching element; and using the rate adjuster, causing the rate of movement of the second electrical charge for the second switching element when the single drive mode is selected to be lower than the rate of movement of the second electrical charge for the second switching element when the dual drive mode is selected.

21. The method according to claim 19, further comprising:

using the drive state changer, selecting one of a dual drive mode and a first drive mode, the dual drive mode being configured to drive both the first and second switching elements, the first drive mode being configured to drive only the first upper-arm switching element; and using the rate adjuster, causing the rate of movement of the first electrical charge for the first switching element when the first drive mode is selected to be lower than the rate of movement of the first electrical charge for the first switching element when the dual drive mode is selected.

22. The method according to claim 18, further comprising, using the drive state changer:

discharging the on-off control terminal of the first switching element using constant current control as the discharging task, and discharging the on-off control terminal of the second switching element using constant voltage control as the discharging task.

23. The method according to claim 18, wherein:

the first switching element has a first upper limit of a first current enabled to flow therethrough;

the second switching element has a second upper limit of a second current enabled to flow therethrough, the second upper limit being smaller than the first upper limit; and the method further comprises, using the drive state changer, causing, as the discharging task, a potential difference of the on-off control terminal of the second switching element relative to the output terminal of the second switching element to be lower than a potential difference of the on-off control terminal of the first switching element relative to the output terminal of the first switching element.

24. The method according to claim 18, wherein an off-hold path is provided that short-circuits the on-off control terminal and the output terminal of the second switching element, and an off-hold switching element is provided in the off-hold path, the method further comprising:

using the drive state changer, turning on the off-hold switching element as the discharging task.

25. The method according to claim 18, wherein:

the at least one set of the at least first and second switching elements comprises:
 a first set of the at least first and second switching elements connected in parallel to each other, the first and second switching elements of the first set being referred to as first and second upper-arm switching elements; and
 a second set the of at least first and second switching elements connected in parallel to each other, the first and second switching elements of the second set being referred to as first and second lower-arm switching elements;

the first set of the first and second upper-arm switching elements and the second set of the first and second lower-arm switching elements are connected between a direct-current power source having positive and negative terminals and a coil;

each of the first and second upper-arm switching elements has an input terminal and an output terminal;

each of the first and second lower-arm switching elements has an input terminal and an output terminal;

the input terminal of each of the first and second upper-arm switching elements is connected to the positive terminal of the direct-current battery;

the output terminal of each of the first and second upper-arm switching elements is connected to the coil and the input terminal of a corresponding one of the first and second lower-arm switching elements;

the output terminal of each of the first and second upper-arm switching elements is connected to the negative terminal of the direct-current power source;

each of the first and second upper-arm switching elements is configured to permit a current to flow therethrough between the input terminal and the output terminal when being in the on state;

each of the first and second lower-arm switching elements is configured to permit a current to flow therethrough between the input terminal and the output terminal when being in the on state; and the method further comprises, using the rate adjuster:
 adjusting the rate of movement of the second electrical charge for the second upper-arm switching element to discharge the on-off control terminal of the second upper-arm switching element to be faster than the rate of movement of the first electrical charge for the first upper-arm switching element to discharge the on-off control terminal of the first upper-arm switching element when a first flyback current is disabled from flowing from the coil to the positive terminal of the direct-current power source via the first and second upper-arm switching elements; and
 adjusting the rate of movement of the second electrical charge for the second lower-arm switching element to discharge the on-off control terminal of the second lower-arm switching element to be faster than the rate of movement of the first electrical charge for the first lower-arm switching element to discharge the on-off control terminal of the first lower-arm switching element when a second flyback current is disabled from flowing from the negative terminal of the direct-current power source to the coil via the first and second lower-arm switching elements.

26. The method according to claim 1, wherein the first and second switching elements are designed such that a current estimated to flow through the first switching element being in the on state is identical to a current estimated to flow through the second switching element being in the on state when a voltage is commonly applied to the on-off control terminals of the first and second switching elements, the method further comprising:

using a current obtainer, obtaining a first current flowing through the first switching element between the input and output terminals, and obtaining a second current flowing through the first switching element between the input and output terminals; and using a voltage adjuster, adjusting the voltage applied to the on-off control terminal of each of the first and second switching elements to equalize the first current and the second current when the first and second switching elements are in the on state.

27. The method according to claim 1, further comprising:

using the drive state changer:
 performing a charging task to apply a charging voltage to the on-off control terminal of each of the first and second switching elements so that a voltage at the on-off control terminal of each of the first and second switching elements becomes a target charge voltage, thus changing the corresponding one of the first and second switching elements from the off state to the on state; and
 performing a discharging task to discharge the on-off control terminal of each of the first and second switching elements so that the voltage at the on-off control terminal of each of the first and second switching elements becomes a target discharge voltage, thus changing the corresponding one of the first and second switching elements from the on state to the off state; and using a voltage obtainer:
 obtaining a first divided voltage based on the target charge voltages at the on-off control terminals of the respective first and second switching elements;
 determining whether there is an electrical fault therein as a function of the first divided voltage during the charging task;
 obtaining a second divided voltage based on the target discharge voltages at the on-off control terminals of the respective first and second switching elements; and
 determining whether there is an electrical fault therein as a function of the second divided voltage during the discharging task.

28. The method according to claim 1, further comprising:
using the drive state changer, performing a charging task to apply a charging voltage to the on-off control terminal of each of the first and second switching elements so that a voltage at the on-off control terminal of each of the first and second switching elements becomes a target charge voltage, thus changing the corresponding one of the first and second switching elements from the off state to the off state to the on state;
using a temperature obtaining unit, obtaining a temperature of the second switching element; and
using a voltage adjuster:
determining whether the temperature obtained by the temperature obtaining unit has exceeded a threshold temperature; and
reducing the charging voltage applied to the on-off control terminal of the second switching element when it is determined that the temperature obtained by the temperature obtaining unit has exceeded the threshold temperature.

29. The method according to claim 1, wherein:
using the drive state changer, performing a charging task to apply a charging voltage to the on-off control terminal of each of the first and second switching elements so that a voltage at the on-off control terminal of each of the first and second switching elements becomes a target charge voltage, thus changing the corresponding one of the first and second switching elements from the off state to the off state to the on state;
using a temperature obtaining unit, obtaining a temperature of the first switching element; and
using a voltage adjuster:
determining whether the temperature obtained by the temperature obtaining unit has exceeded a threshold temperature; and
increasing the charging voltage applied to the on-off control terminal of the second switching element when it is determined that the temperature obtained by the temperature obtaining unit has exceeded the threshold temperature.

30. The method according to claim 1, wherein:
a controller is provided for driving the first and second switching elements via the drive state changer;
the at least one set of the at least first and second switching elements comprises:
a first set of the at least first and second switching elements connected in parallel to each other, the first and second switching elements of the first set being referred to as first and second upper-arm switching elements; and
a second set of the at least first and second switching elements connected in parallel to each other, the first and second switching elements of the second set being referred to as first and second lower-arm switching elements;
the first and second upper-arm switching elements are connected in series to the respective first and second lower-arm switching elements;
the method further comprises, using the controller:
generating first and second upper-arm drive signals for driving the respective first and second upper-arm switching elements;
generating first and second lower-arm drive signals for driving the respective first and second lower-arm switching elements; and
using the drive state changer:
obtaining the drive signals generated by the controller;
performing movement of the first electrical charge of the first upper-arm switching element based on the first upper-arm drive signal;
performing movement of the second electrical charge of the second upper-arm switching element based on the second upper-arm drive signal;
performing movement of the first electrical charge of the first lower-arm switching element based on the first lower-arm drive signal; and
performing movement of the second electrical charge of the second lower-arm switching element based on the second lower-arm drive signal.

31. A drive circuit for driving at least one set of at least first and second switching elements connected in parallel to each other, each of the first and second switching elements having an on-off control terminal, the drive circuit comprising:
a drive state changing means for:
moving first electrical charge to or from the on-off control terminal of the first switching element to change the first switching element from one of an on state and an off state to the other thereof, and
moving second electrical charge to or from the on-off control terminal of the second switching element to change the second switching element from one of the on state and the off state to the other thereof; and
a rate adjusting means for:
adjusting a rate of movement of the second electrical charge to be faster than a rate of movement of the first electrical charge when the drive state changing means moves the first electrical charge to the on-off control terminal of the first switching element to change the first switching element from the off state to the on state first, and moves the second electrical charge to the on-off control terminal of the second switching element to change the second switching element from the off state to the on state next; and
adjusting the rate of movement of the second electrical charge to be faster than the rate of movement of the first electrical charge when the drive state changing means moves the second electrical charge from the on-off control terminal of the second switching element to change the second switching element from the on state to the off state first, and moves the first electrical charge from the on-off control terminal of the first switching element to change the first switching element from the on state to the off state next.

* * * * *